(12) United States Patent
Leedy

(10) Patent No.: US 9,401,183 B2
(45) Date of Patent: Jul. 26, 2016

(54) STACKED INTEGRATED MEMORY DEVICE

(76) Inventor: Glenn J. Leedy, Parkland, FL (US)

(*) Notice: Subject to any disclaimer, the term of this patent is extended or adjusted under 35 U.S.C. 154(b) by 51 days.

(21) Appl. No.: 12/405,232

(22) Filed: Mar. 17, 2009

(65) Prior Publication Data

US 2009/0175104 A1 Jul. 9, 2009

Related U.S. Application Data

(60) Division of application No. 10/222,816, filed on Aug. 19, 2002, now Pat. No. 7,504,732, which is a division of application No. 09/776,885, filed on Feb. 6, 2001, now Pat. No. 6,551,857, which is a continuation of (Continued)

(51) Int. Cl.
*H01L 23/538* (2006.01)
*H01L 23/52* (2006.01)
*G11C 5/02* (2006.01)

(Continued)

(52) U.S. Cl.
CPC .. *G11C 5/02* (2013.01); *G11C 5/06* (2013.01); *H01L 21/76898* (2013.01); *H01L 23/481* (2013.01); *H01L 23/5226* (2013.01); *H01L 25/0657* (2013.01); *H01L 27/0688* (2013.01); *H01L 27/10897* (2013.01); *H01L 29/02* (2013.01); *H01L 2224/8083* (2013.01);

(Continued)

(58) Field of Classification Search
CPC .............. H01L 2924/00014; H01L 23/481; H01L 2924/01079; H01L 2224/8083; H01L 27/0688; H01L 27/10897; H01L 21/76898; H01L 2224/8384; H01L 23/5226; H01L 25/0657; H01L 29/02

USPC ................. 257/777, 778, E21.597, E27.026, 257/E27.097, 668, 685, 686, 691, 700, 701, 257/723, 730, 734, 758, 774; 438/109, 455, 438/598
See application file for complete search history.

(56) References Cited

U.S. PATENT DOCUMENTS 2,915,722 A   12/1959   Foster
3,044,909 A   7/1962   Schokley (Continued)

FOREIGN PATENT DOCUMENTS

DE     3233195     3/1983
EP     0189976     8/1986

(Continued)

OTHER PUBLICATIONS

Bollmann et al., Three Dimensional Metallization for Vertically Integrated Circuits, MAM'97—Materials for Advanced Metallization.

(Continued)

*Primary Examiner* — Mary Wilczewski
*Assistant Examiner* — Tsz Chiu
(74) *Attorney, Agent, or Firm* — Useful Arts IP

(57) ABSTRACT

A Three-Dimensional Structure (3DS) Memory allows for physical separation of the memory circuits and the control logic circuit onto different layers such that each layer may be separately optimized. One control logic circuit suffices for several memory circuits, reducing cost. Fabrication of 3DS memory involves thinning of the memory circuit to less than 50 μm in thickness and bonding the circuit to a circuit stack while still in wafer substrate form. Fine-grain high density inter-layer vertical bus connections are used. The 3DS memory manufacturing method enables several performance and physical size efficiencies, and is implemented with established semiconductor processing techniques.

278 Claims, 9 Drawing Sheets

Related U.S. Application Data application No. 09/607,363, filed on Jun. 30, 200, now Pat. No. 6,632,706, which is a continuation of application No. 08/971,565, filed on Nov. 17, 1997, now Pat. No. 6,133,640, which is a division of application No. 08/835,190, filed on Apr. 4, 1997, now Pat. No. 5,915,167.

(51) Int. Cl.
   *H01L 21/768* (2006.01)
   *H01L 23/48* (2006.01)
   *H01L 27/06* (2006.01)
   *H01L 27/108* (2006.01)
   *H01L 25/065* (2006.01)
   *H01L 23/522* (2006.01)
   *G11C 5/06* (2006.01)
   *H01L 29/02* (2006.01)

(52) U.S. Cl.
   CPC ............... *H01L2224/8384* (2013.01); *H01L 2924/01079* (2013.01); *Y10S 438/977* (2013.01)

(56) References Cited

U.S. PATENT DOCUMENTS

| | | |
|---|---|---|
| 3,202,948 A | 8/1965 | Farrand |
| 3,387,286 A | 6/1968 | Dennard |
| 3,430,835 A | 3/1969 | Patzer et al. |
| 3,508,980 A | 4/1970 | Jackson, Jr. et al. |
| 3,559,282 A | 2/1971 | Lesk |
| 3,560,364 A | 2/1971 | Burkhardt |
| 3,602,982 A | 9/1971 | Kooi |
| 3,615,901 A | 10/1971 | Medicus |
| 3,636,358 A | 1/1972 | Groschwitz |
| 3,716,429 A | 2/1973 | Napoli et al. |
| 3,777,227 A | 12/1973 | Krishna et al. |
| 3,780,352 A | 12/1973 | Redwanz |
| 3,868,565 A | 2/1975 | Kuipers |
| 3,922,705 A | 11/1975 | Yerman |
| 3,932,932 A | 1/1976 | Goodman |
| 3,997,381 A | 12/1976 | Wanlass |
| 4,028,547 A | 6/1977 | Eisenberger |
| 4,070,230 A | 1/1978 | Stein |
| 4,104,418 A | 8/1978 | Park et al. |
| 4,131,985 A | 1/1979 | Greenwood et al. |
| 4,142,004 A | 2/1979 | Hauser, Jr. et al. |
| 4,196,232 A | 4/1980 | Schnable et al. |
| 4,246,595 A | 1/1981 | Noyori et al. |
| 4,249,302 A | 2/1981 | Crepeau |
| 4,251,909 A | 2/1981 | Hoeberechts |
| 4,262,631 A | 4/1981 | Kubacki |
| 4,393,127 A | 7/1983 | Greschner et al. |
| 4,394,401 A | 7/1983 | Shioya et al. |
| 4,401,986 A | 8/1983 | Trenkler et al. |
| 4,416,054 A | 11/1983 | Thomas et al. |
| 4,500,905 A | 2/1985 | Shibata |
| 4,528,072 A | 7/1985 | Kurosawa et al. |
| 4,539,068 A | 9/1985 | Takagi et al. |
| 4,566,037 A | 1/1986 | Takatsu et al. |
| 4,585,991 A | 4/1986 | Reid et al. |
| 4,597,163 A | 7/1986 | Tsang |
| 4,604,162 A | 8/1986 | Sobczak |
| 4,612,083 A | 9/1986 | Yasumoto et al. |
| 4,617,160 A | 10/1986 | Belanger et al. |
| 4,618,397 A | 10/1986 | Shimizu et al. |
| 4,618,763 A | 10/1986 | Schmitz |
| 4,622,632 A | 11/1986 | Tanimoto et al. |
| 4,633,438 A | 12/1986 | Kume et al. |
| 4,637,029 A | 1/1987 | Hayakawa et al. |
| 4,663,559 A | 5/1987 | Christensen |
| 4,684,436 A | 8/1987 | Burns et al. |
| 4,693,770 A | 9/1987 | Hatada |
| 4,702,336 A | 10/1987 | Seibert et al. |
| 4,702,936 A | 10/1987 | Maeda et al. |
| 4,706,166 A | 11/1987 | Go |
| 4,721,938 A | 1/1988 | Stevenson |
| 4,724,328 A | 2/1988 | Lischke |
| 4,761,681 A | 8/1988 | Reid |
| 4,766,670 A | 8/1988 | Gazdik et al. |
| 4,784,721 A | 11/1988 | Holmen et al. |
| 4,810,673 A | 3/1989 | Freeman |
| 4,810,889 A | 3/1989 | Yokomatsu et al. |
| 4,825,277 A | 4/1989 | Mattox et al. |
| 4,835,765 A | 5/1989 | Bergmans et al. |
| 4,841,483 A | 6/1989 | Furuyama |
| 4,849,857 A | 7/1989 | Butt et al. |
| 4,855,867 A | 8/1989 | Gazdik et al. |
| 4,857,481 A | 8/1989 | Tam et al. |
| 4,877,752 A | 10/1989 | Robinson |
| 4,890,157 A | 12/1989 | Wilson |
| 4,892,753 A | 1/1990 | Wang et al. |
| 4,892,842 A | 1/1990 | Corrie et al. |
| 4,897,708 A | 1/1990 | Clements |
| 4,919,749 A | 4/1990 | Mauger et al. |
| 4,924,589 A | 5/1990 | Leedy |
| 4,928,058 A | 5/1990 | Williamson |
| 4,934,799 A | 6/1990 | Chu |
| 4,937,653 A | 6/1990 | Blonder et al. |
| 4,939,568 A | 7/1990 | Kato |
| 4,939,694 A | 7/1990 | Eaton et al. |
| 4,940,916 A | 7/1990 | Borel et al. |
| 4,943,937 A | 7/1990 | Kasano et al. |
| 4,948,482 A | 8/1990 | Kobayashi et al. |
| 4,950,987 A | 8/1990 | Vranish et al. |
| 4,952,446 A | 8/1990 | Lee et al. |
| 4,954,865 A | 9/1990 | Rokos |
| 4,954,875 A | 9/1990 | Clements |
| 4,957,882 A | 9/1990 | Shinomiya |
| 4,965,415 A | 10/1990 | Young et al. |
| 4,966,663 A | 10/1990 | Mauger |
| 4,983,251 A | 1/1991 | Haisma et al. |
| 4,988,423 A | 1/1991 | Yamamoto et al. |
| 4,990,462 A | 2/1991 | Sliwa, Jr. |
| 4,994,336 A | 2/1991 | Benecke et al. |
| 4,994,735 A | 2/1991 | Leedy |
| 5,000,113 A | 3/1991 | Wang et al. |
| 5,008,619 A | 4/1991 | Keogh et al. |
| 5,010,024 A | 4/1991 | Allen et al. |
| 5,019,943 A | 5/1991 | Fassbender et al. |
| 5,020,219 A | 6/1991 | Leedy |
| 5,034,685 A | 7/1991 | Leedy |
| 5,045,921 A * | 9/1991 | Lin et al. ............... 257/680 |
| 5,051,326 A | 9/1991 | Celler et al. |
| 5,051,865 A | 9/1991 | Kato |
| 5,059,556 A | 10/1991 | Wilcoxen |
| 5,062,689 A | 11/1991 | Koehler |
| 5,064,275 A | 11/1991 | Tsunoda et al. |
| 5,070,026 A | 12/1991 | Greenwald et al. |
| 5,071,510 A | 12/1991 | Findler et al. |
| 5,087,585 A | 2/1992 | Hayashi |
| 5,098,865 A | 3/1992 | Machado et al. |
| 5,103,557 A | 4/1992 | Leedy |
| 5,110,373 A | 5/1992 | Mauger |
| 5,110,712 A | 5/1992 | Kessler et al. |
| 5,111,278 A | 5/1992 | Eichelberger |
| 5,116,777 A | 5/1992 | Chan et al. |
| 5,117,282 A | 5/1992 | Salatino |
| 5,119,164 A | 6/1992 | Sliwa et al. |
| 5,130,894 A | 7/1992 | Miller |
| 5,132,244 A | 7/1992 | Roy |
| 5,144,142 A | 9/1992 | Fueki et al. |
| 5,151,775 A | 9/1992 | Hadwin |
| 5,156,909 A | 10/1992 | Henager, Jr. et al. |
| 5,160,998 A | 11/1992 | Itoh et al. |
| 5,162,251 A | 11/1992 | Poole et al. |
| 5,166,962 A | 11/1992 | Murooka et al. |
| 5,169,805 A | 12/1992 | Mok et al. |
| 5,188,706 A | 2/1993 | Hori et al. |
| 5,191,405 A | 3/1993 | Tomita et al. |
| 5,198,888 A | 3/1993 | Sugano et al. |
| 5,198,965 A | 3/1993 | Curtis et al. |
| 5,202,754 A | 4/1993 | Bertin et al. |
| 5,203,731 A | 4/1993 | Zimmerman |

(56) References Cited

U.S. PATENT DOCUMENTS

| | | |
|---|---|---|
| 5,208,782 A | 5/1993 | Sakuta et al. |
| 5,225,771 A | 7/1993 | Leedy |
| 5,229,647 A | 7/1993 | Gnadinger |
| 5,236,118 A | 8/1993 | Bower et al. |
| 5,240,458 A | 8/1993 | Linglain et al. |
| 5,241,454 A | 8/1993 | Ameen et al. |
| 5,245,277 A | 9/1993 | Nguyen |
| 5,259,247 A | 11/1993 | Bantien |
| 5,262,341 A | 11/1993 | Fueki et al. |
| 5,262,351 A | 11/1993 | Bureau et al. |
| 5,270,261 A | 12/1993 | Bertin et al. |
| 5,273,940 A | 12/1993 | Sanders |
| 5,274,270 A | 12/1993 | Tuckerman |
| 5,278,839 A | 1/1994 | Matsumoto et al. |
| 5,279,865 A | 1/1994 | Chebi et al. |
| 5,283,107 A | 2/1994 | Bayer et al. |
| 5,284,796 A | 2/1994 | Nakanishi et al. |
| 5,284,804 A | 2/1994 | Moslehi |
| 5,293,457 A | 3/1994 | Arima et al. |
| 5,300,444 A | 4/1994 | Hachisuka et al. |
| 5,321,884 A | 6/1994 | Ameen et al. |
| 5,323,035 A | 6/1994 | Leedy |
| 5,323,060 A | 6/1994 | Fogal et al. |
| 5,324,687 A | 6/1994 | Wojnarowski |
| 5,338,975 A | 8/1994 | Cole, Jr. et al. |
| 5,343,075 A | 8/1994 | Nishino |
| 5,343,366 A | 8/1994 | Cipolla et al. |
| 5,345,563 A | 9/1994 | Uihlein et al. |
| 5,347,428 A | 9/1994 | Carson et al. |
| 5,354,695 A * | 10/1994 | Leedy .................. 438/411 |
| 5,357,473 A | 10/1994 | Mizuno et al. |
| 5,358,909 A | 10/1994 | Hashiguchi et al. |
| 5,363,021 A | 11/1994 | MacDonald |
| 5,373,189 A | 12/1994 | Massit et al. |
| 5,374,564 A | 12/1994 | Bruel |
| 5,374,569 A | 12/1994 | Yilmaz et al. |
| 5,374,920 A | 12/1994 | Evens |
| 5,385,632 A | 1/1995 | Goossen |
| 5,385,909 A | 1/1995 | Nelson et al. |
| 5,397,747 A | 3/1995 | Angiulli et al. |
| 5,399,505 A | 3/1995 | Dasse et al. |
| RE34,893 E | 4/1995 | Fujii et al. |
| 5,420,458 A | 5/1995 | Shimoji |
| 5,424,245 A | 6/1995 | Gurtler et al. |
| 5,424,920 A | 6/1995 | Miyake |
| 5,426,072 A | 6/1995 | Finnila |
| 5,426,363 A | 6/1995 | Akagi et al. |
| 5,432,444 A | 7/1995 | Yasohama et al. |
| 5,432,681 A | 7/1995 | Linderman |
| 5,432,729 A | 7/1995 | Carson et al. |
| 5,432,999 A * | 7/1995 | Capps et al. ................ 438/109 |
| 5,434,500 A | 7/1995 | Hauck et al. |
| 5,448,106 A | 9/1995 | Fujitsu |
| 5,450,603 A | 9/1995 | Davies |
| 5,451,489 A | 9/1995 | Leedy |
| 5,453,404 A | 9/1995 | Leedy |
| 5,457,879 A | 10/1995 | Gurtler et al. |
| 5,463,246 A | 10/1995 | Matsunami |
| 5,468,606 A | 11/1995 | Bogart et al. |
| 5,470,693 A | 11/1995 | Sachdev et al. |
| 5,476,813 A | 12/1995 | Naruse |
| 5,478,781 A | 12/1995 | Bertin et al. |
| 5,480,842 A | 1/1996 | Clifton et al. |
| 5,481,133 A | 1/1996 | Hsu |
| 5,489,554 A | 2/1996 | Gates |
| 5,500,312 A | 3/1996 | Harriott et al. |
| 5,502,333 A | 3/1996 | Bertin et al. |
| 5,502,667 A | 3/1996 | Bertin et al. |
| 5,503,704 A | 4/1996 | Bower et al. |
| 5,512,397 A | 4/1996 | Leedy |
| 5,514,628 A | 5/1996 | Enomoto et al. |
| 5,517,457 A | 5/1996 | Sakui et al. |
| 5,527,620 A | 6/1996 | Schulz-Harder |
| 5,527,645 A | 6/1996 | Pati et al. |
| 5,529,829 A | 6/1996 | Koskenmaki et al. |
| 5,534,465 A | 7/1996 | Frye et al. |
| 5,555,212 A | 9/1996 | Toshiaki et al. |
| 5,561,622 A | 10/1996 | Bertin et al. |
| 5,563,084 A | 10/1996 | Ramm et al. |
| 5,563,086 A | 10/1996 | Bertin et al. |
| 5,571,741 A | 11/1996 | Leedy |
| 5,572,689 A | 11/1996 | Gallup et al. |
| 5,574,729 A | 11/1996 | Kinoshita et al. |
| 5,577,050 A | 11/1996 | Bair et al. |
| 5,580,687 A | 12/1996 | Leedy |
| 5,581,498 A | 12/1996 | Ludwig et al. |
| 5,582,939 A | 12/1996 | Pierrat |
| 5,583,688 A | 12/1996 | Hornbeck |
| 5,592,007 A | 1/1997 | Leedy |
| 5,592,018 A | 1/1997 | Leedy |
| 5,595,933 A | 1/1997 | Heijboer |
| 5,606,186 A | 2/1997 | Noda |
| 5,615,163 A | 3/1997 | Sakui et al. |
| 5,620,915 A | 4/1997 | Chen et al. |
| 5,627,106 A | 5/1997 | Hsu |
| 5,627,112 A | 5/1997 | Tennant et al. |
| 5,629,137 A | 5/1997 | Leedy |
| 5,633,209 A | 5/1997 | Leedy |
| 5,637,536 A | 6/1997 | Val |
| 5,637,907 A | 6/1997 | Leedy |
| 5,654,127 A | 8/1997 | Leedy |
| 5,654,220 A | 8/1997 | Leedy |
| 5,656,552 A | 8/1997 | Hudak et al. |
| 5,661,339 A | 8/1997 | Clayton |
| 5,675,185 A | 10/1997 | Chen et al. |
| 5,694,588 A | 12/1997 | Ohara et al. |
| 5,703,747 A | 12/1997 | Voldman et al. |
| 5,712,194 A | 1/1998 | Kanazawa |
| 5,715,144 A | 2/1998 | Ameen et al. |
| 5,719,438 A | 2/1998 | Beilstein, Jr. et al. |
| 5,725,995 A | 3/1998 | Leedy |
| 5,731,945 A | 3/1998 | Bertin et al. |
| 5,733,814 A | 3/1998 | Flesher et al. |
| 5,736,448 A | 4/1998 | Saia et al. |
| 5,745,076 A | 4/1998 | Turlington et al. |
| 5,745,673 A | 4/1998 | Di Zenzo et al. |
| 5,750,211 A | 5/1998 | Weise et al. |
| 5,753,536 A | 5/1998 | Sugiyama et al. |
| 5,753,564 A | 5/1998 | Fukada |
| 5,760,478 A | 6/1998 | Bozso et al. |
| 5,763,943 A | 6/1998 | Baker et al. |
| 5,767,001 A | 6/1998 | Bertagnolli et al. |
| 5,773,152 A | 6/1998 | Okonogi |
| 5,777,379 A | 7/1998 | Karavakis et al. |
| 5,786,116 A | 7/1998 | Rolfson |
| 5,786,628 A | 7/1998 | Beilstein, Jr. et al. |
| 5,786,629 A | 7/1998 | Faris |
| 5,787,445 A | 7/1998 | Daberko |
| 5,793,115 A | 8/1998 | Zavracky et al. |
| 5,798,937 A | 8/1998 | Bracha et al. |
| 5,801,437 A | 9/1998 | Burns |
| 5,810,923 A | 9/1998 | Yano et al. |
| 5,818,748 A | 10/1998 | Bertin et al. |
| 5,831,280 A | 11/1998 | Ray |
| 5,834,162 A | 11/1998 | Malba |
| 5,834,334 A | 11/1998 | Leedy |
| 5,840,593 A | 11/1998 | Leedy |
| 5,847,929 A | 12/1998 | Bernier et al. |
| 5,851,894 A | 12/1998 | Ramm |
| 5,856,695 A | 1/1999 | Ito et al. |
| 5,868,949 A | 2/1999 | Sotokawa et al. |
| 5,869,354 A | 2/1999 | Leedy |
| 5,870,176 A | 2/1999 | Sweatt et al. |
| 5,877,034 A | 3/1999 | Ramm et al. |
| 5,880,010 A | 3/1999 | Davidson |
| 5,882,532 A | 3/1999 | Field et al. |
| 5,892,271 A | 4/1999 | Takeda et al. |
| 5,902,118 A | 5/1999 | Hubner |
| 5,902,650 A | 5/1999 | Feng et al. |
| 5,907,178 A | 5/1999 | Baker et al. |
| 5,915,167 A | 6/1999 | Leedy |
| 5,940,031 A | 8/1999 | Turlington et al. |
| 5,946,559 A | 8/1999 | Leedy |
| 5,953,635 A | 9/1999 | Andideh |

(56) References Cited

U.S. PATENT DOCUMENTS

| | | |
|---|---|---|
| 5,976,953 A | 11/1999 | Zavracky et al. |
| 5,985,693 A | 11/1999 | Leedy |
| 5,998,069 A | 12/1999 | Cutter et al. |
| 6,008,126 A | 12/1999 | Leedy |
| 6,008,530 A | 12/1999 | Kano |
| 6,017,658 A | 1/2000 | Rhee et al. |
| 6,020,257 A | 2/2000 | Leedy |
| 6,023,098 A | 2/2000 | Higashiguchi et al. |
| 6,027,958 A * | 2/2000 | Vu et al. ............... 438/110 |
| RE36,623 E | 3/2000 | Wang et al. |
| 6,045,625 A | 4/2000 | Houston |
| 6,050,832 A | 4/2000 | Lee et al. |
| 6,084,284 A | 7/2000 | Adamic, Jr. |
| 6,087,284 A | 7/2000 | Brix et al. |
| 6,092,174 A | 7/2000 | Roussakov |
| 6,097,096 A | 8/2000 | Gardner et al. |
| 6,133,626 A | 10/2000 | Hawke et al. |
| 6,133,640 A | 10/2000 | Leedy |
| 6,154,809 A | 11/2000 | Ikenaga et al. |
| 6,166,438 A | 12/2000 | Davidson |
| 6,166,711 A * | 12/2000 | Odake ............... 345/60 |
| 6,194,245 B1 | 2/2001 | Tayanaka |
| 6,197,456 B1 | 3/2001 | Aleshin et al. |
| 6,208,545 B1 | 3/2001 | Leedy |
| 6,230,233 B1 | 5/2001 | Lofgren et al. |
| 6,236,602 B1 | 5/2001 | Pati |
| 6,239,495 B1 | 5/2001 | Sakui et al. |
| 6,261,728 B1 | 7/2001 | Lin |
| 6,288,561 B1 | 9/2001 | Leedy |
| 6,294,909 B1 | 9/2001 | Leedy |
| 6,300,935 B1 | 10/2001 | Sobel et al. |
| 6,301,653 B1 | 10/2001 | Mohamed et al. |
| 6,313,517 B1 | 11/2001 | Lauterbach et al. |
| 6,320,593 B1 | 11/2001 | Sobel et al. |
| 6,322,903 B1 | 11/2001 | Siniaguine et al. |
| 6,335,491 B1 | 1/2002 | Alagaratnam et al. |
| 6,355,976 B1 * | 3/2002 | Faris ............... 257/686 |
| RE37,637 E | 4/2002 | Clifton et al. |
| 6,376,909 B1 | 4/2002 | Forbes et al. |
| 6,392,304 B1 | 5/2002 | Butler |
| 6,417,027 B1 * | 7/2002 | Akram ............... 438/109 |
| 6,437,990 B1 | 8/2002 | Degani et al. |
| 6,445,006 B1 | 9/2002 | Brandes et al. |
| 6,518,073 B2 | 2/2003 | Momohara |
| 6,551,857 B2 | 4/2003 | Leedy |
| 6,563,224 B2 | 5/2003 | Leedy |
| 6,617,671 B1 * | 9/2003 | Akram ............... 257/668 |
| 6,632,706 B1 | 10/2003 | Leedy |
| 6,682,981 B2 | 1/2004 | Leedy |
| 6,707,160 B2 | 3/2004 | Yamaji |
| 6,713,327 B2 | 3/2004 | Leedy |
| 6,714,625 B1 | 3/2004 | Leedy |
| 6,734,539 B2 | 5/2004 | Degani et al. |
| 6,740,964 B2 | 5/2004 | Sasaki |
| 6,747,347 B2 | 6/2004 | Farrar et al. |
| 6,765,279 B2 | 7/2004 | Leedy |
| 6,838,896 B2 | 1/2005 | Leedy |
| 6,867,486 B2 | 3/2005 | Hong |
| 6,873,057 B2 | 3/2005 | Chen et al. |
| 6,891,387 B2 | 5/2005 | Leedy |
| 6,894,392 B1 | 5/2005 | Gudesen et al. |
| 6,979,895 B2 | 12/2005 | Akram et al. |
| 7,106,646 B2 | 9/2006 | Schoenfeld et al. |
| 7,138,295 B2 | 11/2006 | Leedy |
| 7,176,545 B2 | 2/2007 | Leedy |
| 7,176,579 B2 | 2/2007 | Konishi et al. |
| 7,193,239 B2 | 3/2007 | Leedy |
| 7,223,696 B2 | 5/2007 | Leedy |
| 7,230,316 B2 | 6/2007 | Yamazaki et al. |
| 7,242,012 B2 | 7/2007 | Leedy |
| 7,307,020 B2 | 12/2007 | Leedy |
| 7,354,798 B2 | 4/2008 | Pogge et al. |
| 7,385,835 B2 | 6/2008 | Leedy |
| 7,402,897 B2 | 7/2008 | Leedy |
| 7,474,004 B2 | 1/2009 | Leedy |
| 7,479,694 B2 | 1/2009 | Leedy |
| 7,485,571 B2 | 2/2009 | Leedy |
| 7,485,955 B2 | 2/2009 | Kang et al. |
| 7,489,025 B2 | 2/2009 | Chen et al. |
| 7,504,732 B2 | 3/2009 | Leedy |
| 7,521,785 B2 | 4/2009 | Damberg et al. |
| 7,550,805 B2 | 6/2009 | Leedy |
| 7,615,837 B2 | 11/2009 | Leedy |
| 7,670,893 B2 | 3/2010 | Leedy |
| 7,705,466 B2 | 4/2010 | Leedy |
| 7,736,948 B2 | 6/2010 | Dekker et al. |
| 7,763,948 B2 | 7/2010 | Leedy |
| 7,820,469 B2 | 10/2010 | Leedy |
| 7,911,012 B2 | 3/2011 | Leedy |
| 8,410,617 B2 | 4/2013 | Leedy |
| 2001/0002711 A1 | 6/2001 | Gonzalez |
| 2001/0013423 A1 | 8/2001 | Dalal et al. |
| 2001/0014051 A1 * | 8/2001 | Watanabe et al. ........ 365/230.03 |
| 2002/0117689 A1 | 8/2002 | Akimoto |
| 2002/0127775 A1 | 9/2002 | Haba et al. |
| 2002/0132465 A1 | 9/2002 | Leedy |
| 2003/0011032 A1 | 1/2003 | Umebayashi |
| 2003/0173608 A1 | 9/2003 | Leedy |
| 2003/0184976 A1 | 10/2003 | Brandenburg et al. |
| 2003/0197253 A1 | 10/2003 | Gann et al. |
| 2003/0218182 A1 | 11/2003 | Leedy |
| 2003/0223535 A1 | 12/2003 | Leedy |
| 2004/0000708 A1 | 1/2004 | Rapport et al. |
| 2004/0021212 A1 | 2/2004 | Hamaguchi et al. |
| 2004/0070063 A1 | 4/2004 | Leedy |
| 2004/0140547 A1 | 7/2004 | Yamazaki et al. |
| 2004/0197951 A1 | 10/2004 | Leedy |
| 2004/0245617 A1 | 12/2004 | Damberg et al. |
| 2004/0251557 A1 | 12/2004 | Kee |
| 2005/0023656 A1 | 2/2005 | Leedy |
| 2005/0051841 A1 | 3/2005 | Leedy |
| 2005/0051904 A1 | 3/2005 | Kim et al. |
| 2005/0082641 A1 | 4/2005 | Leedy |
| 2006/0231927 A1 | 10/2006 | Ohno |
| 2007/0035033 A1 | 2/2007 | Ozguz et al. |
| 2008/0237591 A1 | 10/2008 | Leedy |
| 2008/0251941 A1 | 10/2008 | Leedy |
| 2008/0254572 A1 | 10/2008 | Leedy |
| 2008/0284611 A1 | 11/2008 | Leedy |
| 2008/0302559 A1 | 12/2008 | Leedy |
| 2009/0014897 A1 | 1/2009 | Ohno |
| 2009/0067210 A1 | 3/2009 | Leedy |
| 2009/0174082 A1 | 7/2009 | Leedy |
| 2009/0175104 A1 | 7/2009 | Leedy |
| 2009/0194768 A1 | 8/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0148371 A1 | 6/2010 | Kaskoun et al. |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2011/0042829 A1 | 2/2011 | Kaskoun et al. |
| 2011/0198672 A1 | 8/2011 | Leedy |

FOREIGN PATENT DOCUMENTS

| | | |
|---|---|---|
| EP | 0201380 | 12/1986 |
| EP | 0224418 | 6/1987 |
| EP | 0238089 | 9/1987 |
| EP | 0314437 | 5/1989 |
| EP | 0 444 943 A1 | 2/1991 |
| EP | 0419898 | 4/1991 |
| EP | 0455455 | 11/1991 |
| EP | 0 496 543 A2 | 1/1992 |
| EP | 0487302 | 5/1992 |
| EP | 0503816 | 9/1992 |
| EP | 0518283 | 12/1992 |
| EP | 0518774 | 12/1992 |
| EP | 0526551 | 2/1993 |

(56) References Cited

FOREIGN PATENT DOCUMENTS

| | | |
|---|---|---|
| EP | 0531723 | 3/1993 |
| EP | 0554063 | 8/1993 |
| EP | 0555252 | 8/1993 |
| EP | 0 672 931 A1 | 2/1995 |
| EP | 0 676 797 A2 | 3/1995 |
| EP | 0 689 036 A2 | 3/1995 |
| EP | 0 700 088 A2 | 8/1995 |
| EP | 0703618 | 3/1996 |
| EP | 0703619 | 3/1996 |
| EP | 0731525 | 9/1996 |
| FR | 2641129 | 6/1990 |
| GB | 2125168 | 2/1984 |
| GB | 2215168 | 2/1984 |
| GB | 2 256 967 | 12/1992 |
| GB | 2 274 945 | 8/1994 |
| GB | 2 276 979 | 10/1994 |
| JP | 6074643 | 4/1985 |
| JP | 60126871 | 7/1985 |
| JP | 6130059 | 2/1986 |
| JP | 61-288455 | 12/1986 |
| JP | 61-288456 | 12/1986 |
| JP | 61-288457 | 12/1986 |
| JP | 62-272556 | 11/1987 |
| JP | 62272556 | 11/1987 |
| JP | 63076484 | 4/1988 |
| JP | 01199476 | 9/1988 |
| JP | 63229862 | 9/1988 |
| JP | A 120049 | 5/1989 |
| JP | HI-120049 | 5/1989 |
| JP | 01157561 | 6/1989 |
| JP | 02027600 | 1/1990 |
| JP | 02037655 | 2/1990 |
| JP | 02082564 | 3/1990 |
| JP | 2239627 A | 9/1990 |
| JP | 03127816 | 5/1991 |
| JP | 3-151637 | 6/1991 |
| JP | H8-125120 | 6/1991 |
| JP | HS-151637 | 6/1991 |
| JP | 03174715 | 7/1991 |
| JP | 03284871 | 12/1991 |
| JP | 4-10649 | 1/1992 |
| JP | 4010649 A | 1/1992 |
| JP | 04042957 | 2/1992 |
| JP | 4-76946 | 3/1992 |
| JP | 04076946 | 3/1992 |
| JP | 04083371 | 3/1992 |
| JP | H4-76946 | 3/1992 |
| JP | 04107964 | 4/1992 |
| JP | 456956 A | 12/1992 |
| JP | 5-53689 | 3/1993 |
| JP | H5-53689 | 3/1993 |
| JP | 05109977 | 4/1993 |
| JP | 05-250900 | 9/1993 |
| JP | 05283607 | 10/1993 |
| JP | 06-251172 | 9/1994 |
| JP | 06-291250 | 10/1994 |
| JP | 7-14982 | 1/1995 |
| JP | 7-245432 | 9/1995 |
| JP | 08-017962 | 1/1996 |
| JP | 8-125120 | 5/1996 |
| JP | H3-151637 | 5/1996 |
| JP | H8-125120 | 5/1996 |
| JP | 04196263 | 7/1996 |
| JP | 09152979 | 6/1997 |
| JP | 10107065 | 4/1998 |
| JP | 10209371 | 8/1998 |
| JP | 2847890 | 11/1998 |
| JP | 261001 A | 9/1999 |
| WO | WO 8910255 | 11/1989 |
| WO | WO 9009093 | 8/1990 |
| WO | 91/00683 | 1/1991 |
| WO | WO 9105366 | 4/1991 |
| WO | WO 9203848 | 3/1992 |
| WO | WO 9217901 | 10/1992 |
| WO | 94/09513 | 4/1994 |
| WO | 9413121 | 6/1994 |
| WO | 95/09438 | 4/1995 |
| WO | 9509438 | 4/1995 |
| WO | 9641204 | 12/1996 |
| WO | 9641624 | 12/1996 |
| WO | WO9641264 | 12/1996 |
| WO | WO 9819337 | 5/1998 |
| WO | WO 03078305 | 9/2003 |

OTHER PUBLICATIONS

Interview Summary filed Oct. 16, 2013 in U.S. Appl. No. 13/734,874.
Bollmann et al., Three Dimensional Metallization for Vertically Integrated Circuits, Materials for Advanced Metallization, 1997, European Workshop; Date of Conference: Mar. 16-19, 1997.
Aboaf, J.A., "Stresses in SiO2 Films Obtained from the Thermal Decomposition of Tetraethylorthosilicate—Effect of Heat Treatment and Humidity," J. Electrochem. Soc.: Solid State Science; 116(12): 1732-1736 (Dec. 1969).
Allen, Mark G.; Senturia, Stephen D.; "Measurement of polyimide interlayer adhesion using microfabricated structures"; 1988; pp. 352-356.
Alloert, K., et al., "A Comparison Between Silicon Nitride Films Made by PCVD of N2-SiH4/Ar and N2-SiH4/He," Journal of the Electrochemical Society vol. 132, No. 7, pp. 1763-1766, (Jul. 1985).
Bailey, R., "Glass for Solid-State Devices: Glass film has low intrinsic compressive stress for isolating active layers of magnetic-bubble and other solid-state devices," NASA Tech Brief (1982).
Boyer, P.K.; Collins, G.J.; Moore, C.A.; Solanski, R.; Ritchie, W.K.; Roche, G.A.; Collins, G.J.; "Laser photolytic deposition of thin films"; 1983; pp. 119-127.
Chang, E.Y.; Cibuzar, G.T.; Pande, K.P.; "Passivation of GaAs FETs with PECVD silicon nitride films of different stress states"; Sep. 1988; pp. 1412-1418.
Chen, Y.S.; Fatemik, H.; "stress measurements on multilevel thin film dielectric layers used in Si integrated circuits"; May-Jun. 1986; pp. 645-649.
"Christensens Physics of Diagnostic Radiology," Currey et al., pp. 29-33, 1990.
Draper, B.L.; Hill, T.A.; "Stress and stress relaxation in integrated circuit metals and dielectrics"; Jul.-Aug. 1991; pp. 1956-1962.
Garino, T.J.; Harrington, H.M.; "Residual stress in PZT films and its effect on ferroelectric properties"; 1992; pp. 341-347.
Guckel, H.; "Surface micromachined pressure transducers"; 1991; pp. 133-146.
Hendricks et al., "Polyquinoline Coatings and Films: Improved Organic Dielectrics for ICs and MCMs, Eleventh IEEE/CHMT International Electronics Manufacturing Technology Symposium," pp. 361-365 (1991).
Hsieh, et al., "Directional Deposition of Dielectric Silicon Oxide by Plasma Enhanced TEOS Process," 1989 Proceedings, Sixth International IEEE VLSI Multilevel Interconnection Conference, pp. 411-415 (1989).
"Partitioning Function and Packaging of Integrated Circuits for Physical Security of Data," IBM Technical Disclosure Bulletin, IBM Corp.; 32(1): 46-49 (Jun. 1989).
Jones, R.E., Jr. "An evaluation of methods for passivating silicon integrated circuits"; Apr. 1972; pp. 23-28.
Knolle, W.R., et al., "Characterization of Oxygen-Doped, Plasma-Deposited Silicon Nitride," Journal of the Electrochemical Society, vol. 135, No. 5, pp. 1211-1217, (May 1988).
Kochugova, I.V.; Nikolaeva, L.V.; Vakser, N.M., (M.I. Kalinin Leningrad Polytechnic Institute (USSR); "Electrophysical investigation of thin-layered inorganic coatings"; 1989; pp. 826-828.
Mitsumasa Koyanagi et al.; "Design of 4-DBIT X 4-layer Optically Coupled Three-Dimensional Common Memory for Parallel Processor System," IEEE Journal of Solid-State Circuits, vol. 25, No. 1, Feb. 1, 1990.
Maw, T.; Hopla, R.E.; "Properties of a photoimageable thin polyimide film"; Nov. 26-29, 1990; pp. 71-76.
"Miniature Electron Microscopes Without Vacuum Pumps, Self-Contained Microfabricated Devices with Short Working Distances, Enable Operation in Air," NASA Tech Briefs 39-40 (1998).

(56) References Cited

OTHER PUBLICATIONS

Nguyen, S.V., Plasma Assisted Chemical Vapor Deposited Thin Films for Microelectronic Applications, J. Vac. Sci. Technol. vol. B4, No. 5, pp. 1159-1167, (Sep./Oct. 1986).
Olmer, et al., "Intermetal Dielectric Deposition by Plasma Enhanced Chemical Vapor Deposition," Fifth IEEE/CHMT.
International Electronic Manufacturing Technology Symposium—Design-to-Manufacturing Transfer Cycle, pp. 98-99.
Partial European Search Report for Application No. EP 02009643 (Oct. 8, 2002).
Phys. Rev. B., Condens, Matter Mater. Phys. (USA), Physical Review B (Condensed Matter and Materials Physics), Mar. 15, 2003, APS through AIP, USA.
Reche, J.J.H.; "Control of thin film materials properties used in high density multichip interconnect"; Apr. 24-28, 1989; p. 494.
Riley, P.E.; Shelley, A.; "Characterization of a spin-applied dielectric for use in multilevel metallization"; May 1988; pp. 1207-1210.
Runyan, W.R., "Deposition of Inorganic Thin Films," Semiconductor Integrated Circuit Processing Technology, p. 142 (1990).
Salazar, M.; Wilkins, C.W., Jr.; Ryan, V.W.; Wang, T.T.; "low stress films of cyclized polybutadiene dielectrics by vacuum annealing"; Oct. 21-22, 1986; pp. 96-102.
Scheuerman, R.J., "Fabrication of Thin Dielectric Films with Low Internal Stresses," J. Vac. Sci. and Tech., 7(1): 143-146 (1970).
"IC Tower Patent: Simple Technology Receives Patent on the IC Tower, a Stacked Memory Technology," http://www.simpletech.com/whatsnew/memory/©60824.htm (1998).
Sun, R.C.; Tisone, T.C.; Cruzan, P.D.; "Internal stresses and resistivity of low-voltage sputtered tungsten films (microelectronic cct. conductor)"; Mar. 1973; pp. 1009-1016.
Sung et al., "Well-aligned carbon nitride nanotubes synthesized in anodic alumina by electron cyclotron resonance chemical vapor deposition," Applied Physics Letters, vol. 74, No. 2, 197, 1999, Jan. 11, 1999.
Svechnikov, S.V.; Kobylyatskaya, M.F.; Kimarskii, V.I.; Kaufman, A.P.; Kuzolvlev, Yu.I.; Cherepov, Ye. I.; Fomin, B.I.; "A switching plate with aluminum membrane crossings of conductors"; 1972.
Sze, S.M., "surface Micromachining," Semiconductor Sensors, pp. 58-63 (1994).
Tamura, H.; Nishikawa, T.; Wakino, K.; Sudo, T.; "Metalized MIC substrates using high K dielectric resonator materials": Oct. 1988; pp. 117-126.
Tessler, et al., "An Overview of Dielectric Materials for Multichip Modules," SPE, Electrical & Electronic Div.; (6): 260-269 (1991).
Tielert, et al., "Benefits of Vertically Stacked Integrated Circuits for Sequential Logic," IEEE, XP-000704550, 121-124 (Dec. 5, 1996).
Townsend, P.H.; Huggins, R.A.; "Stresses in borophosphosilicate glass films during thermal cycling"; Oct. 21-22, 1986; pp. 134-141.
Treichel, et al., "Planaized Low-Stress Oxide/Nitride Passivation for ULSI Devices," J. Phys IV, Colloq. (France), 1 (C2): 839-846 (1991).
Vossen, John L., "Plasma-Enhanced Chemical Vapor Deposition," Thin Film Processes II, pp. 536-541 (1991).
Wade, T.E.; "low temperature double-exposed polyimide/oxide dielectric for VLSI multilevel metal interconnection"; 1982; pp. 516-519.
S. Wolf, Silicon Processing, 1990, Lattice Press, vol. 2, p. 111.
Wolf, Stanley and Richard N. Tauber; Silicon Processing for the VLSI Era, vol. 1: Process Technology; Sunset Beach, CA; Lattice Press, 1986, pp. 191-194.
Wolf, Stanley, "Basics of Thin Films," Silicon Processing for the VLSI Era, pp. 115, 192, 193, and 199 (1986).
Chu et al., ed., 3D Packaging for Integrated Circuit Systems, Sandia Report SAND96-2801, UC-704, Nov. 1996.
Hayashi et al., A New Three Dimensional IC Fabrication Technology, Stacking Thin Film Dual-CMOS Layers, NEC Microelectronics Research Laboratories, 1991 IEEE.
Krishmamoorthy, et al., "3-D Integration of MQW Modulators Over Active Submicron CMOS Circuits: 375 Mb/s Transimpedance Receiver-Transmitter Circuit," IEEE Photonics Technology Letters, 2(11): 1288-1290 (Nov. 1995).

Boyer et al., "Microelectronic Thin Film Deposition by UV Laser Photolysis" Proc. Soc. of Photo-Instrumentation Eng., Jan. 1983.
Olmer, et al., "Intermetal Dielectric Deposition by Plasma Enhanced Chemical Vapor Deposition," Fifth IEEE/CHMT International Electronic Manufacturing Technology Symposium—Design-to-Manufacturing Transfer Cycle, pp. 98-99; Oct. 10, 1988.
"3D Multichip Module to be Demonstrated," Electronic Design, Apr. 4, 1994, p. 27.
"3D Processor Module Stacked Standard ICs," Electronic Design, Sep. 10, 1996, p. 27.
"DRAMS set for orbit," Military & Aerospace Electronics, Sep. 1995, p. 4.
"High Density Interconnects Prove to be Reusable," Electronic Design, Jun. 11, 1996, p. 27.
"Irvine Bears Short Stack Markets," Electronic New, vol. 40 No. 2033, Sep. 26, 1994.
"Invine Sensors Now Sampling Short Stacks," Electronic News, Sep. 12, 1994, p. 74.
"Stacked RAMs Shrink Solid-State Recorders," Electronic Design, Jan. 24, 1994. p. 27.
Abbott, D., S. F. Al-sarawi, and Paul D. Franzon, "3D packaging technology for portable systems." IEEE. 1997.
Abbott, M., et al. "Durable memory RS/6000 system design." *Fault-Tolerant Computing*, 1994. FTCS-24. *Digest of Papers*, Twenty-Fourth International Symposium on IEEE, 1994.
Adler, Michael S. "GE high-density interconnect: a solution to the system interconnect problem" *Boston-DL tentative*. International Society for Optics and Photonics, 1991.
Agarwal et al., Potential Failure Mechanisms in Overlaid High Density Interconnects, ICMCM Proceedings, 1992.
Akasaka, Y., et al "The 3-D IC with 4-layer structure for the fast range sensing system." *Microelectronic Engineering* 15.1-4 (1991). 183-186.
Akasaka, Yoichi. "3D technologies." *Microelectronic Engineering* 8.3 (1988): 219-233.
Akasaka, Yoichi. "Three-dimensional IC trends." Proceedings of the IEEE74.12 (1988): 1703-1714.
Akasaka, Yoichi. "Three-dimensional integrated circuit: technology and application prospect." *Microelectronics Journal* 20.1 (1989): 105-112.
Akasaka, Yoichi, "Trends in three-dimensional integration." Solid State Device Research Conference, 1987, ESSDERC'87, 17th European, IEEE, 1987.
Al-Sarawi, Said F., Dersk Abbott, and Paul D. Frenzon. "A review of 3-D packaging technology." *Components, Packaging, and Manufacturing Technology, Part B: Advanced Packaging*, IEEE Transactions on 21.1 (1998): 2-14.
Anthony, T. R. "Forming electrical interconnections through semiconductor wafers." *Journal of Applied Physics* 52.8 (1981): 5340-5349.
Aubert, Jeffrey M. "Boundary scan modification to enhance multichip module testing," Aerospace and Electronics Conference, 1992. NAECON 1992, Proceedings of the IEEE 1992 National. IEEE, 1992.
Barrett, J., et al. "Performance and reliability of a three-dimensional plastic moulded vertical multichip module (MCM-V)." Electronic Components and Technology Conference, 1995. Proceedings., 45th, IEEE, 1995.
Benson, Donald, et al. "Advantages in MCM packaging for microprocessors." Electronic Components and Technology Conference, 1996. Proceedings., 46th. IEEE, 1996.
Berlin, Claude L., David J. Perlman, and Stuart N. Shanken. "Evaluation of a 3D memory cube system." Electronic Components and Technology Conference, 1993. Proceedings., 43rd. IEEE, 1993.
Bollmann, D., et al. "Three dimensional metallization for vertically integrated circuits." *Materials for Advanced Metallization*, 1997. MAM'97 Abstracts Booklet, European Workshop, IEEE, 1997.
Brown, Chet, "New IC stacking process ideal for high-density memory module and hybrid applications," Electro/95 International Professional Program Proceedings, IEEE, 1995.
Burdick, Bill, and Ray Fillion. "Extension of the Chip-on-Flex Technology to Known Good Die." 1996 International Conference on Multichip Modules, 5 th, Denver, CO, 1998.

(56) References Cited

OTHER PUBLICATIONS

Bustillo, James M., Roger T. Howe, and Richard S. Mueller. "Surface micromachining for microelectromechanical systems." Proceedings of the IEEE 86.8 (1998): 1552-1574.

Campbell, Michael L., and Scot T. Toborg, "3-D wafer scale architectures for neural computing." *Components, Hybrids, and Manufacturing Technology*, IEEE Transactions on 16.7 (1993): 646-655.

Carlson, "A high density copper/polymimide overlay interconnection." Proceedings of International Electronics Packaging Conference, Nov. 7-10, 1988.

Carlson, R. O., et al. "High Density Interconnect Overlay for Bare Chip Packaging." Second ASM International Electronic Materials and Processing Congress, Philadelphia, PA. 1989.

Carson, By John. "The emergence of stacked 3D silicon and its impact on microelectronics systems integration." *Innovative Systems in Silicon*, 1996. Proceedings., Eighth Annual IEEE International Conference on, IEEE, 1996.

Chu, Dahwey, and W. Doyle Miller. "Laser micromachining of through via innterconnects in active die for 3D multichip module." Electronics Manufacturing Technology Symposium, 1995. '*Manufacturing Technologies-Present and Future*'.

Chu, Nhi-Anh, and Henry Dardy. *A Survey of High Density Packaging for High Performance Computing System*, No. NRL/FR/5560-92-9329. Naval Research Lab Washington DC, 1992.

Chu, Wen-Hwa, and Mehran Mehregany. "study of risidual stress distribution through the thickness of p+ silicon films [thermal oxidation effects]." *Electron Devices, IEEE Transactions on* 40.7 (1993): 1245-1250.

Cole, H. S., et al. "Laser Processing for Interconnect Technology." 1968 *Los Angeles Symposium—OE/LASE'68*. International Society for Optics and Photonics, 1988.

Concept One CVD System Process Specifications, Novellus, Nov. 1991.

Cook, Rick. "More memory in less space." *Byte* 20.8 (1995): 3.

Cote, Donna R., et al. "Low-temperature chemical vapor deposition processes and dielectrics for microelectronic circuit manufacturing at IBM,"*IBM Journal of Research and Development* 39.4 (1995): 437-464.

Crowley, Robert T., and E Jan Vardaman. "3-D Multichip Packaging for Memory Modules," *Multichip Modules*, 1994. Proceedings of the International Conference on. IEEE, 1994.

Cubic to unleash new wave 3-D chip. Wilmington Morning Star, Sep. 22, 1994.

Datasheet, Intel 430HX PCSET 82439HX System Controller (TXC), Apr. 1997.

Daum, Wolfgang, William E. Burdick Jr, and Raymond A. Fillion. "Overlay high-density interconnect: A chips-first multichip module technology,"*Computer* 26.4 (1993). 23-29.

Dual-Port Dynamic RAM Controller, Intel Memory Components Handbook 1986, p. 3-76.

EerNisse, E. P. "Stress in thermal SiO2 during growth," *Applied Physics Letters* 35.1 (1979); 8-10.

Eichelberger, C W., et al. "High-density interconnects for electronic packaging." 1988 Los Angeles Symposium—OE/LASE'88. International Society for Optics and Photonics, 1988.

Electronic Packaging Technology, Dec. 1991 (In Japanese).

Fahey, Paul M., et al. "Stress-induced dislocations in silicon integrated circuits." *IBM journal of research and development* 36.2 (1992): 158-182.

File History, U.S. Pat. No. 5,327,327 issued Jul. 5, 1994.

Fillion, R. A. "Status and update on the GE HDI multichip module technology." *ISHM—Multichip Advanced Technology Workshop*, Workshop Presentation. 1990.

Fillion, R. A., et al. "3-D stacking using the GE high density multichip module technology." *MCM and VLSI Packaging Techniques and Manufacturing Technologies*, 1994. Workshop on IEEE, 1994.

Fillion, R. A., et al. "Non-digital extensions of an embedded chip MCM technology," *Multichip Modules*, 1994. Proceedings of the 1994 International Conference on. IEEE, 1994.

Fillion, R. A., R. J. Wojnarowski. and W. Daum. "Bare chip test techniques for multichip modules." *Electronic Components and Technology Conference*, 1990.., 40th, IEEE, 1990.

Fillion, R. S., et al. "Multichip Modules-Chips First vs. Chips Last Analysis."Proceedings—SPIE the International Society for Optical Engineering. SPIE International Society for Optical, 1992.

Fillion, Raymond A. "A forecast on the future of hybrid wafer scale integration technology." *Components, Hybrids, and Manufacturing Technology*, IEEE Transactions on 16.7 (1993): 615-625.

Fillion, Raymond A., et al. "Conformal multichip-on-flex (MCM-F) technology." *Multichip Modules*, vol. 2575. 1995.

Fillion, Raymond A.. et al. "Demonstration of a Chip Scale, Chip-On Technology." *Multichip Modules*. vol. 2794. 1996.

Forman, G. A., et al. "Development of GE's plastic thin-zero outline package (TZOP) technology." *Electric Components and Technology Conference*, 1996, Proceedings. 45th. IEEE, 1995.

Frew, Dean L. "High-density memory packaging technology high-speed imaging applications." San Diego'90, Jul. 8-13. International Society for Optics and Photonics, 1991.

Fultz, William W., and Gerold W. Neudeck. "A Nitrided-oxide Dielectric for Epitaxial Lateral Overgrowth Applications." (1995).

Ganasan, Jaya R. "3D packaging—combining chip on chip (COC) and chip on board (COB) packages—process and design considerations." *Electronic Components and Technology Conference*, 1997. Proceedings., 47th. IEEE, 1997.

Garrou, Philip. "Polymer dielectrics for multichip module packaging."Proceedings of the IEEE 80.12 (1992): 1942-1954.

Gdula, M., et al. "A 36-chip multiprocessor multichip module made with the General Electric high density interconnect technology." *Electronic Components and Technology Conference*, 1991. Proceedings., 41st. IEEE, 1991.

Gdula, Michael, et al. "The GE high density overlay MCM interconnect method solves high power needs of GaAs system design." *Wafer Scale Integration*. 1993. Proceedings., Fifth Annual IEEE International Conference on. IEEE, 1993.

Gdula, Michael, William P. Kornrumpf, and Barry K. Gilbert. "An overlay interconnect technology for 1 GHz and above MCMs" *Multi-Chip Module Conference*, 1992. MCMC-92. Proceedings 1992 IEEE. IEEE, 1992, pp. 171-174.

Gösele, U. M., et al. "History and future of semiconductor wafer bonding."*Solid State Phenomena*. vol. 47. Trans Tech Publications, 1995.

Gösele, Ulrich M., M. Reiche, and Q-Y, Tong. "Wafer bonding: an overview."*Solid-State and Integrated Circuit Technology*, 1995 4th International Conference on. IEEE, 1995.

Grief, Malcolm K., and James A. Steele Jr. "Warpage and mechanical strength studies of ultra thin 150 mm wafers." *Electronics Manufacuring Technology Symposium*, 1996., Nineteenth IEEE/CPMT. IEEE. 1996.

Haller et al., "CAD for the GE high density interconnect process." Proceedings, National Electronic Packaging and Production Conference (NEPCON) West, Mar. 26-Feb. 1, 1990; Cahners Exposition Group, 1990.

Haller, Theodore R., et al. "High frequency performance of GE high density interconnect modules." *Components, Hybrids, and Manufacturing Technology*, IEEE Transactions on 16.1 (1993); 21-27.

Hass et al., *Physics of Thin Films: Advances in Research and Development* (1966).

Hayashi, Y. "Evaluation of CUBIC (CUmulatively Bonded IC) Devices."*Extended Abstracts of 9th Symposium on Future Electron Devices*. 1990.

Hayashi, Y. et al. "A new three dimensional IC fabrication technology, stacking thin film dual-CMOS layers." *Electron Devices Meeting*, 1991. IEDM'91. Technical Digest., International. IEEE, 1991.

Hayashi, Yasuhim, et al. "Fabrication of three-dimensional IC usingcumulatively bonded IC'(CUBIC) technology" *VLSI Technology, 1990. Digest of Technical Papers*. 1990 Symposium on IEEE, 1990.

Hirano, K., et al. "A New three-dimensional multiport memory for shared memory in high performance parallel processor system." *Solid State Devices and Materials* (1996): 824-826.

Hoffman, R. W. "The mechanical properties of thin condensed films. "*Physics of thin films* 3 (1966): 211-273.

(56) References Cited

OTHER PUBLICATIONS

Inoue, Ken, et al. "A 10 Mb 3D frame buffer memory with Z-compare and alpha-blend units." *Solid-State Circuits Conference, 1995. Digest of Technical Papers*. 41st ISSCC, 1995 IEEE International IEEE, 1995.

Irvine Sensors Corporation, High Density Inter-chip Optical Interconnect, ISC Proposal CMP 9411, vol. I of II, Phase II Proposal, Jan. 18, 1994. Submitted to: Ballistic Missile Defense Organization (BMDO).

Isrnail, Mohd Saileh. *Technology and Application of Aligned Wafer Bonding for Three Dimensional Microstructures and Microdevices*. 1993.

Isobe, Atsuo, et al. "Dielectric film influence on stress-migration." *VLSI Multilevel Interconnection Conference, 1990. Proceedings., Seventh International IEEE*. IEEE, 1990.

Kaneko, Shinji, et al. "Monolithic fabrication of flexible film and thinned integrated circuits." *Micro Electro Mechanical Systems, 1997, MEMS'97, Proceedings, IEEE.. Tenth Annual International Workshop on, IEEE*, 1997.

Kim, N. P., et al. "Thin film passive components integrated into silicon based multi-chip modules for aerospace applications," *Advanced Packaging Materials, Proceedings., 3rd International Symposium on, IEEE*, 1997.

Kleiner, Michael B., et al. "Performance improvement of the memory hierarchy of RISC-systems by application of 3-D technology." *Components, Packaging, and Manufacturing Technology, Part B: Advanced Packaging*, IEEE Transactions on 19.4.

Kleiner, Michael B., et al. "Thermal analysis of vertically integrated circuits."*Electron Devices Meeting*, 1995. IEDM'95., International, IEEE, 1995.

Kleiner, Michael B., Stefan A. Kühn, and Werner Weber, "Modeling the impact of 3-D-Technology on the performace of the Memory Hierarchy of RISC Systems." *Circuits and Systems*. 1995. ISCAS'95., 1995 IEEE International Symposium on vol. 3, pp. 2305-2308.

Klokholm, Erik. "Delamination and fracture of thin films." *IBM journal of research and development* 31.5(1987): 585-591.

Koren, Israel, and Adit D. Singh. "Fault tolerance in VLSI circuits." Computer7 (1990): 73-83.

Koyanagi, M. "Roadblocks in achieving three-dimensional LSI." *Extended Abstracts of 8th Symp. on Future Electron Devices*. 1989.

Koyanagi, Mitsumasa, et al. "Future system-on-silicon LSI chips." *Micro, IEEE* (1998): 17-22.

Koyanagi, Mitsumasa, et al. "Neuromophic vision chip fabricated using three-dimensional integration technology." *Solid-State Circuits Conference, 2001. Digest of Technical Papers*. ISSCC. 2001 IEEE International. IEEE, 2001.

Koyanagi, Mitsumasa, et al. "Three-dimensional integration technology based on wafer bonding with vertical buried interconnections." *Electron Devices*, IEEE Transactions on 53.11 (2006): 2799-2808.

Kühn, Stefan A., et al. "Interconnect capacitances, crosstalk, and signal delay in vertically integrated circuits." *Electron Devices Meeting*. 1995. IEDM'95., International, IEEE, 1995.

Kuhn, Stefan A., et al. "Performance modeling of the interconnect structure ofa three-dimensional integrated RISC processor/cache system."*Components, Packaging, and Manufacturing Technology, Part B: Advanced Packaging*, IEEE, (1996) pp. 706-727.

Kunio, T., et al. "Three dimensional ICs, having four stacked active device layers," *Electron Devices Meeting*, 1989. IEDM'89. Technical Digest., International. IEEE, 1989.

Kunio, Takemitsu, "Three Dimensional IC Technology, Using Cubic Method." *Journal of the JWS, Japan Welding Society* 63.3 (1994), 185-189.

Kurino, H., et al. "Intelligent image sensor chip with three dimensional structure." *Electron Devices Meeting*. 1999. IEDM'99. Technical Digest. International. IEEE, 1999.

Kurino, H., et al. "Three-dimensional integration technology for real time micro-vision system," *Innovative Systems in Silicon*, 1997, Proceedings., Second Annual IEEE International Conference on. IEEE. 1997.

Kurino, Hiroyuki, et al. "A new wafer scale chip-on-chip (W-CoC) packaging technology using adhesive injection method." *Japanese journal of applied physics* 38.4S (1999): 2406.

Kurino, Hiroyuki, et al. "Smart vision chip fabricated using three dimensional integration technology." *Advances in Neural Information Processing Systems* 13 (2001): 720-726.

Laconte, Jean, Denis Flandre, and Jean-Pierre Raskin. *Micromachined thin-film sensors for SOI-CMOS co-integration* Chapter 2, Thin dielectric films stress extraction; Springer Science & Business Media, 2006.

Lau, John H. "Evolution, challenge, and outlook of TSV, 3D IC integration and 3D silicon integration." *Advanced Packaging Materials (APM)*. 2011 International Symposium on IEEE, 2011.

Lee, K. W., et al. "Three-dimensional shared memory fabricated using wafer stacking technology." *Electron Devices Meeting*, 2000. IEDM'00, Technical Digest. International, IEEE, 2000.

Levinson, L. M., et al. "High density interconnects using laser lithography."*ISHM*. vol. 88. 1988.

Lim, "The impact of wafer back surface finish on chip strength." Proceedings, Reliability Physics, Apr. 11-13, 1989; IEEE, 1989.

Lim, Thiam Beng. "The impact of wafer back surface finish on chip strength." *Reliability Physics Symposium*, 1989. 27th Annual Proceedings., International. IEEE, 1989.

Linder, Stefan. *Chip stacks for memory applications*. Diss. Techn. Wiss. ETH Zürich, Nr. 11347, 1996. Ref.: H. Baltes; Korref.; ML Reed, 1996.

Lui, Y. S., H. S. Cole, and R. Guida. "Laser ablation of polymers for high-density interconnect." *Microelectronic engineering* 20.1 (1993); 15-29.

Lyke, James. "Two-and-three-dimensional high performance, patterned overlay multi-chip module technology." (1993).

Matiniak, David. "Memory-chip stacks send density skyward." *Electronic Design* 42.17 (1994): 69.

Matsumoto et al., Three-Dimensional Integration Technology Based on Wafer Bonding Technique Using Micro-Bumps, Extended Abstracts of the 1995 International Conference on Solid State Devices and Materials, Aug. 21-24, 1995, Osaka, pp. 1073-1074.

Matsumoto, Takuji, et al. "New three-dimensional wafer bonding technology using the adhesive injection method." *Japanese journal of applied physics* 37.3S (1998): 1217.

Matsunami, Mitsuo, Masayoshi Koba, and Ryuichiro Miyake. "A study of high density multilayer LSI."*Wafer Scale Integration*, 1990. Proceedings.,[2nd] International Conference on. IEEE, 1990.

MB9887514-80 DRAM Memory Card data sheet, Fujitsu Memory Products 1994 Data Book.

Minahan, J. A., et al. "The 3D stack in short form [memory chip packaging]."*Electronic Components and Technology Conference*. 1992, Proceedings., 42nd. IEEE, 1992.

Mitani, Kiyoshi, and Takao Abe, "Wafer bonding technology for SOI applications: a review." *SOI Conference*, 1992. IEEE International. IEEE, 1992.

Nakanishi, Hiroyuki, et al. "Development of high density memory IC package by stacking IC chips." *Electronic Components and Technology Conference*, 1995. Proceedings., 45th IEEE, 1995.

NASA Tech Briefs, May 1993.

Neugebauser, C. A., et al. "High-Performance Interconnections Between VLSI Chips." *Solid State Technology* 31.6 (1988): 93-96.

Neugebauer, C., et al. "Multichip module designs for high performance applications." *Microelectronics International* 7.1 (1990); 28-32.

Nishimura, T., et al. "Three dimensional IC for high performance image signal processor." *Electron Devices Meeting*, 1987 International, vol. 33, IEEE, 1987.

Novellus datasheet.

Obeng, Yaw S., et al. "Dielectric Materials for Advanced VLSI and ULSI Technologies." *AT&T Technical Journal* 73.3 (1994): 94-111.

O'Malley, C. "RIP PCMCIA." *Popular Science* 246.2 (1995): 36.

Paik, Kyung W., "Evaluation of Various AIN Substrate Materials for High Density Interconnection Applications." *International Sumposium on Microelectronics*, Oct. 19-21, 1992; SPIE, 1992.

Paik, Kyung W., and Edward S. Bernard. "Reliability studies on GE high density interconnect (HDI) modules." *MRS Proceedings*. vol. 323. Cambridge University Press. 1993.

(56) References Cited

OTHER PUBLICATIONS

Ryan, James G., et al. "The evolution of interconnection technology at IBM." *IBM Journal of Research and Development* 39.4 (1995): 371-381.
Sailer, Philip M., et al. "Creating 3D circuits using transferred films." *Circuits and Devices Magazine*, IEEE 13.6 (1997): 27-30.
Semiconductor Technology Symposium, Semicon Korea 1997; Semiconductor Equipment and Materials International, 1997.
Semiconductor World, Sep. 1990 (In Japanese).
Shimoto, Tadanori, et al. "High-density multilayer substrate using benzocyclobutene dielectric." *NEC research & development* 34.2 (1993); 191-198.
Spinoff 1996, NASA.
Sugahara, K., et al. "SOI/SOI/bulk-Si triple-level structure for three-dimensional devices." *Electron Device Letters*, IEEE 7.3 (1986); 193-195.
Sutardja, Pantas, William G. Oldham, and Dah B. Kao. "Modeling of stress-effects in silicon oxidation including the non-linear viscosity of oxide." *Electron Devices Meeting*, 1987 International. vol. 33. IEEE, 1987.
Takahashi, Kenji, et al. "Current status of research and development for three-dimensional chip stack technology." *Japanese Journal of Applied Physics* 40.4S (2001): 3032.
Takahashi, Shuji, et al. "A new 3-D MCM fabrication technology for high-speed chip-to-chip communication: vertically connected thin-film chip (VCTC) technology." *VLSI Technology*, 1995. Digest of Technical Papers. 1995 Symposium on. IEEE, 1995.
Takahashi, Shuji, et al. "Characteristics of thin-film devices for a stack-type MCM." Multi-Chip Module Conference, 1992. MCMC-92. Proceedings 1992 IEEE. IEEE, 1992.
Tetsuno, Sheridan "Japan's push into creative semiconductor research: 3-dimensional IC's." *Solid State Technol* (1987): 29-30.
Technical Seminar—Advanced Passivation System for sub 0.35um VLSI Manufacturing by K.P. MacWilliams et al.; Novellus, Spring 1997.
Technical Seminar—Characterization of PECVD SIN Sidewall Integrity for Integrated Circuit Passivation by K. MacWilliams et al.; Novellus, Spring 1997.
Technologies and Applications of 3-D ICs by T. Nishimura et al, Fourth International Symposium on Silicon-on-Insulators Technology and Devices, Electrochemical Society, 1990.
Terao et al., *Purposes of Three-Dimensional Circuits*, IEEE Circuits and Devices Magazine, Nov. 1987.
Terrill, Rob, and Gary L. Beene. "3D packaging technology oveiview and mass memory applications." Aerospace Applications Conference, 1996. Proceedings., 1995 IEEE, vol. 2. IEEE, 1996.
Test, Howard. "Trends in semiconductor packaging, a merchant house view." *Custom Integrated Circuits Conference*, 1988. Proceedings of the IEEE 1988. IEEE, 1988.
Tong, Q-Y., and U. Gösele. "Semiconductor wafer bonding: recent developments." *Materials Chemisty and Physics* 37.2 (1994): 101-127.
Tuckerman, D. B., et al. "Laminated memory: a new 3-dimensional packaging technology for MCMs." Muiti-Chip Module Conference, 1994 MCMC-94, Proceedings., 1994 IEEE. IEEE, 1994.
Van de Ven, Evert P., I-Wen Connick, and Alain S. Harrus. "Advantages of dual frequency PECVD for deposition of ILD and passivation films." VLSI Multilevel Interconnection Conference, 1990. Proceedings., Seventh International IEEE. IEEE, 1990.
Walter, David. "Flexibility and Performance of Texas Instruments Multi-Layer Thin Film/Laminate Interconnect Technology." *Multichip Modules* . vol. 2575. 1995.
Williams, Ronald, and Ogden Marsh. "Future WSI technology: stacked monolithic WSI." *Components, Hybridsm and Manufacturing Technology*, IEEE Transactions on 16.7 (1993): 610-614.
Windischmann, Henry. "Intrinsic stress in sputter-deposited thin films." *Critical Reviews in Solid State and Material Sciences* 17.6 (1992): 547-596.
Wojnarowski, R. J., et al. "Three dimensional hybrid wafer scale integration using the GE high density interconnect technology." *Wafer Scale Integration*. 1993. Proceedings., Fifth Annual IEEE International Conference on. IEEE, 1993.
Wolf, Stanley, and Richard N. Tauber. Silicon Processing for the VLSI Era vol. 1: Process technology, 1986.
Wolf, Stanley, and Richard N. Tauber. "Silicon Processing for the VLSI ERA, 1986." Chapter 4. Basics of Thin Films; Lattice Press.
Wolf, Stanley, and Richard N. Tauber. "Silicon Processing for the VLSI ERA, 1986." Lattice Press.
Wolf, Stanley. "PhD., Silicon Procewing for the VLSI Era, vol. 2-Process Integration," (1990).
Wong. C. P. "Thermal-mechanical enhanced high-performance silicone gels and elastomeric encapsulants in microelectronic packaging." *Components, Packaging, and Manufacturing Technology, Part A*, IEEE Transactions on 18.2 (1995): 270-273.
Yamazaki, K., et al. "4-layer 3-D IC technologies for parallel signal processing." Electron Devices Meeting, 1990, IEDM'90. *Technical Digest.*, International, IEEE, 1990.
Yasumoto, M., H. Hayama, and T. Enomoto, "Promissing new fabrication process developed for stacked LSI's." Electron Devices Meeting. 1984 International. vol. 30. IEEE, 1984.
Yeh, Ching-Fa, Shyue-Shyh Lin, and Water Lur. "Stress in Liquid-Phase Deposited Oxide Films." *Journal of the Electrochemical Society* 143.8 (1998): 2658-2662.
Yu et al., Real-time microvision systems with three-dimensional integration structure: in Multisensor fusion and integration for intelligent systems, p. 831; Springer, 2009.
Yu, Kee-Ho. et al. "Development of real-time microvision system based on three-dimensional LSI technology." *Journal of intelligent material systems and structures* 7.3 (1996): 342-345.
Yu, Kee-Ho, et al. "Real-time microvision system with three-dimensional integration structure." *Multisensor Fusion and Integration for Intelligent Systems*, 1995. IEEE/SICE/RSJ International Conference on. IEEE, 1996.
Zanotti, L., et al. "Process characterization for LPCVD TEOS-ozone based SiO2 films." *Le Journal de Physique IV* 3.C3 (1993): C3-337.

\* cited by examiner

STACKED INTEGRATED MEMORY DEVICE

RELATED APPLICATIONS

This application is a divisional of U.S. Ser. No. 10/222,816 filed Aug. 19, 2002 now U.S. Pat. No. 7,504,732, which is a divisional of U.S. Ser. No. 09/776,885 filed Feb. 6, 2001, now U.S. Pat. No. 6,551,857, which is a continuation of U.S. Ser. No. 09/607,363 filed Jun. 30, 2000, now U.S. Pat. No. 6,632,706, which is a continuation of U.S. Ser. No. 08/971,565 filed Nov. 17, 1997, now U.S. Pat. No. 6,133,640, which is a divisional of U.S. Ser. No. 08/835,190 filed Apr. 4, 1997, now U.S. Pat. No. 5,915,167.

BACKGROUND OF THE INVENTION

1. Field of the Invention

The present invention relates to stacked integrated circuit memory.

2. State of the Art

Manufacturing methods for increasing the performance and decreasing the cost of electronic circuits, nearly without exception, are methods that increase the integration of the circuit and decrease its physical size per equivalent number of circuit devices such as transistors or capacitors. These methods have produced as of 1996 microprocessors capable of over 100 million operations per second that cost less than $1,000 and 64 Mbit DRAM circuits that access data in less than 50 ns and cost less than $50. The physical size of such circuits is less than 2 cm². Such manufacturing methods support to a large degree the economic standard of living in the major industrialized countries and will most certainly continue to have significant consequences in the daily lives of people all over the world.

Circuit manufacturing methods take two primary forms: process integration and assembly integration. Historically the line between these two manufacturing disciplines has been clear, but recently with the rise in the use of MCMs (Multi-Chip Modules) and flip-chip die attach, this clear separation may soon disappear. (The predominate use of the term Integrated Circuit (IC) herein is in reference to an Integrated Circuit in singulated die form as sawed from a circuit substrate such as s semiconductor wafer versus, for example, an Integrated Circuit in packaged form.) The majority of ICs when in initial die form are presently individually packaged, however, there is an increasing use of MCMs. Die in an MCM are normally attached to a circuit substrate in a planar fashion with conventional IC die I/O interconnect bonding methods such as wire bonding, DCA (Direct Chip Attach) or FCA (Flip-Chip Attach).

Integrated circuit memory such as DRAM, SRAM, flash EPROM, EEPROM, Ferroelectric, GMR (Giant MagnetoResistance), etc. have the common architectural or structural characteristic of being monolithic with the control circuitry integrated on the same die with the memory array circuitry. This established (standard or conventional) architecture or circuit layout structure creates a design trade-off constraint between control circuitry and memory array circuitry for large memory circuits. Reductions in the fabrication geometries of memory cell circuitry has resulted in denser and denser memory ICs, however, these higher memory densities have resulted in more sophisticated control circuitry at the expense of increased area of the IC. Increased IC area means at least higher fabrication costs per IC (fewer ICs per wafer) and lower IC yields (fewer working ICs per wafer), and in the worst case, an IC design that cannot be manufactured due to its non-competitive cost or unreliable operation.

As memory density increases and the individual memory cell size decreases more control circuitry is required. The control circuitry of a memory IC as a percentage of IC area in some cases such as DRAMs approaches or exceeds 40%. One portion of the control circuitry is the sense amp which senses the state, potential or charge of a memory cell in the memory array circuitry during a read operation. The sense amp circuitry is a significant portion of the control circuitry and it is a constant challenge to the IC memory designer to improve sense amp sensitivity in order to sense ever smaller memory cells while preventing the area used by the sense amp from becoming too large.

If this design constraint or trade-off between control and memory circuits did not exist, the control circuitry could be made to perform numerous additional functions, such as sensing multiple storage states per memory cell, faster memory access through larger more sensitive sense amps, caching, refresh, address translation, etc. But this trade-off is the physical and economic reality for memory ICs as they are presently made by all manufacturers.

The capacity of DRAM circuits increase by a factor of four from one generation to the next; e.g. 1 Mbit, 4 Mbit, 16 Mbit and 64 Mbit DRAMs. This four times increase in circuit memory capacity per generation has resulted in larger and larger DRAM circuit areas. Upon introduction of a new DRAM generation the circuit yields are too low and, therefore, not cost effective for high volume manufacture. It is normally several years between the date prototype samples of a new DRAM generation are shown and the date such circuits are in volume production.

Assembling die in a stacked or three dimensional (3D) manner is disclosed in U.S. Pat. No. 5,354,695 of the present inventor, incorporated herein by reference. Furthermore, assembling die in a 3D manner has been attempted with regard to memory. Texas Instruments of Dallas Tex., Irvine Sensors of Costa Mesa Calif. and Cubic Memory Corporation of Scotts Valley Calif., have all attempted to produce stacked or 3D DRAM products. In all three cases, conventional DRAM circuits in die form were stacked and the interconnect between each DRAM in the stack was formed along the outside surface of the circuit stack. These products have been available for the past several years and have proved to be too expensive for commercial applications, but have found some use in space and military applications due to their small physical size or footprint.

The DRAM circuit type is referred to and often used as an example in this specification, however, this invention is clearly not limited to the DRAM type of circuit. Undoubtedly memory cell types such as EEPROMs (Electrically Erasable Programmable Read Only Memories), flash EPROM, Ferroelectric, or combinations (intra or inter) of such memory cells can also be used with the present Three Dimensional Structure (3DS) methods to form 3DS memory devices.

The present invention furthers, among others, the following objectives:

1. Several-fold lower fabrication cost per megabyte of memory than circuits conventionally made solely with monolithic circuit integration methods.

2. Several-fold higher performance than conventionally made memory circuits.

3. Many-fold higher memory density per IC than conventionally made memory circuits.

4. Greater designer control of circuit area size, and therefore, cost.

5. Circuit dynamic and static self-test of memory cells by an internal controller.

6. Dynamic error recovery and reconfiguration.

7. Multi-level storage per memory cell.

8. Virtual address translation, address windowing, various address functions such as indirect addressing or content addressing, analog circuit functions and various graphics acceleration and microprocessor functions.

SUMMARY OF THE INVENTION

The present 3DS memory technology is a stacked or 3D circuit assembly technology. Features include:

1. Physical separation of the memory circuits and the control logic circuit onto different layers;

2. The use of one control logic circuit for several memory circuits;

3. Thinning of the memory circuit to less than about 50 μm in thickness forming a substantially flexible substrate with planar processed bond surfaces and bonding the circuit to the circuit stack while still in wafer substrate form; and 4. The use of fine-grain high density inter layer vertical bus connections.

The 3DS memory manufacturing method enables several performance and physical size efficiencies, and is implemented with established semiconductor processing techniques. Using the DRAM circuit as an example, a 64 Mbit DRAM made with a 0.25 μm process could have a die size of 84 mm$^2$, a memory area to die size ratio of 40% and a access time of about 50 ns for 8 Mbytes of storage; a 3DS DRAM IC made with the same 0.25 μm process would have a die size of 18.6 mm$^2$, use 17 DRAM array circuit layers, a memory area to die size ratio of 94.4% and an expected access time of less than 10 ns for 64 Mbytes of storage. The 3DS DRAM IC manufacturing method represents a scalable, many-fold reduction in the cost per megabyte versus that of conventional DRAM IC manufacturing methods. In other words, the 3DS memory manufacturing method represents, at the infrastructure level, a fundamental cost savings that is independent of the process fabrication technology used.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1A:
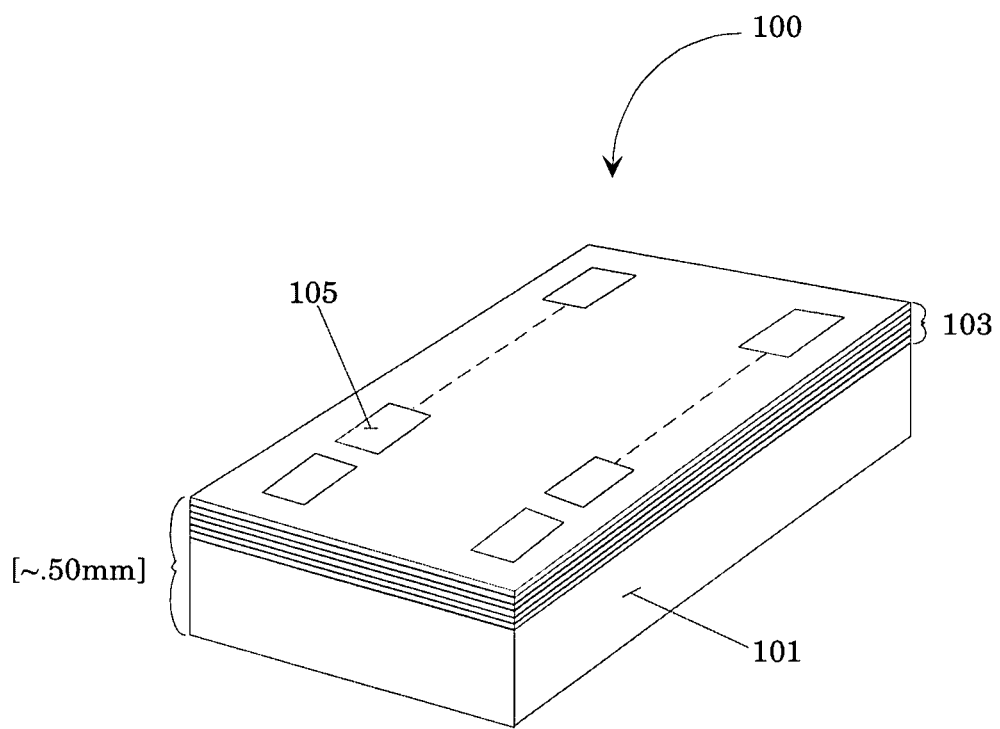
FIG. 1a is a pictorial view of a 3DS DRAM IC manufactured with Method A or Method B and demonstrating the same physical appearance of I/O bond pads as a conventional IC die.
Figure 1B:
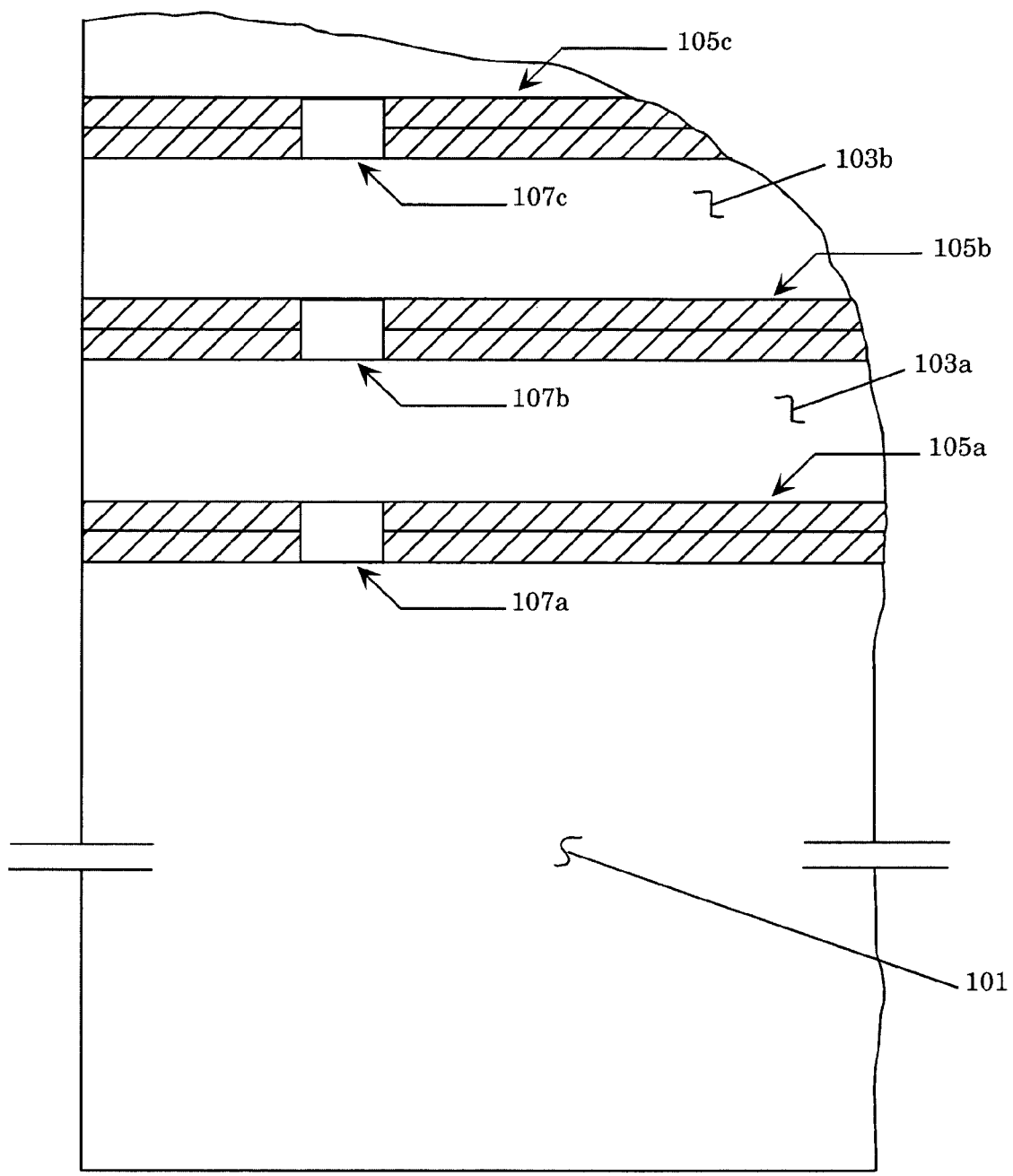
FIG. 1b is a cross-sectional view of a 3DS memory IC showing the metal bonding interconnect between several thinned circuit layers.
Figure 2A:
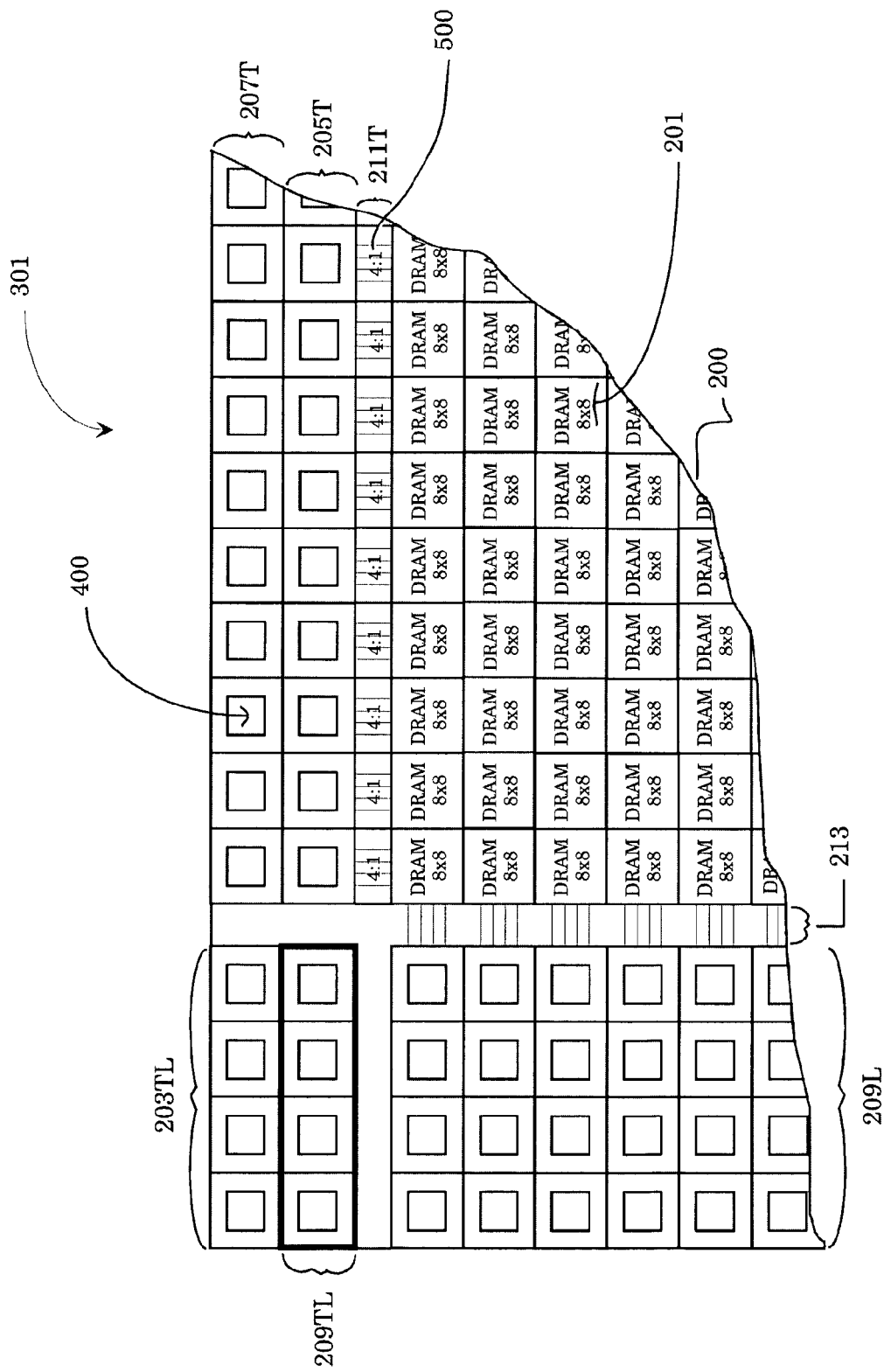
FIG. 2a is a diagram showing the physical layout of a 3DS DRAM array circuit block with one data-line set of bus lines, i.e one port.
Figure 2B:
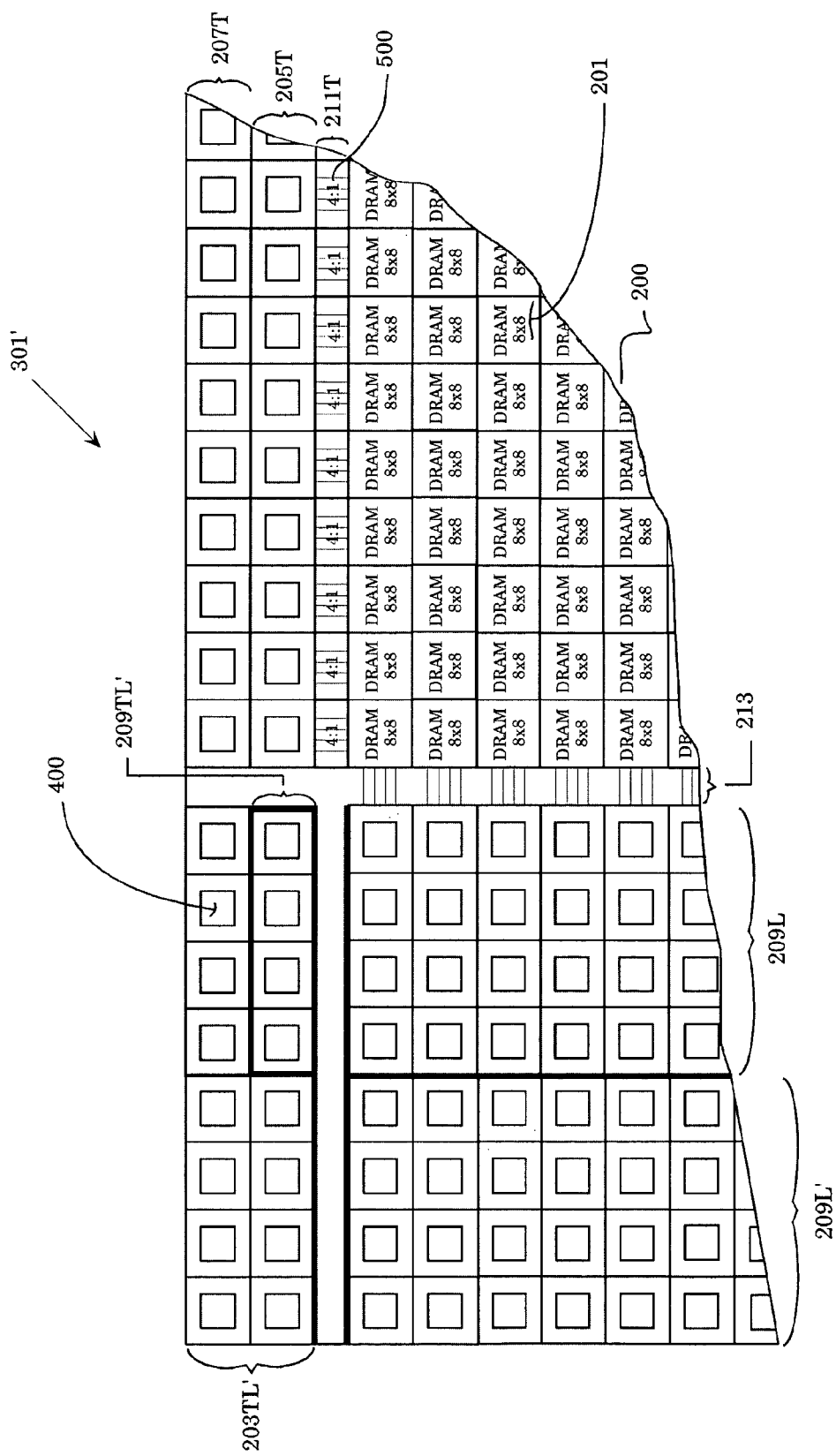
FIG. 2b is a diagram showing the physical layout of a 3DS DRAM array circuit block with two sets of data-line bus lines, i.e. two ports.

Referring to FIG. 1a and FIG. 1b, the 3DS (Three Dimensional Structure) memory device 100 is a stack of integrated circuit layers with fine-grain vertical interconnect between all circuit layers. The term fine-grain inter-layer vertical interconnect is used to mean electrical conductors that pass through a circuit layer with or without an intervening device element and have a pitch of nominally less than 100 μm and more typically less than 10 μm, but not limited to a pitch of less than 2 μm, as best seen in FIG. 2a and FIG. 2b. The fine-grain inter-layer vertical interconnect also functions to bond together the various circuit layers. As shown in FIG. 1b, although the bond and interconnect layers 105a, 105b, etc., are preferably metal, other material may also be used as described more fully hereinafter.

The pattern 107a, 107b, etc. in the bond and interconnect layers 105a, 105b, etc. defines the vertical interconnect contacts between the integrated circuit layers and serves to electrically isolate these contacts from each other and the remaining bond material; this pattern takes the form of either voids or dielectric filled spaces in the bond layers.

The 3DS memory stack is typically organized as a controller circuit 101 and some number of memory array circuit layers 103, typically between nine (9) and thirty-two (32), but there is no particular limit to the number of layers. The controller circuit is of nominal circuit thickness (typically 0.5 mm or greater), but each memory array circuit layer is a thinned and substantially flexible circuit with net low stress, less than 50 μm and typically less than 10 μm in thickness. Conventional I/O bond pads are formed on a final memory array circuit layer for use with conventional packaging methods. Other metal patterns may be used such as insertion interconnection (disclosed in U.S. Pat. Nos. 5,323,035 and 5,453,404 of the present inventor), DCA (Direct Chip Attach) or FCA (Flip-Chip Attach) methods.

Figure 1C:
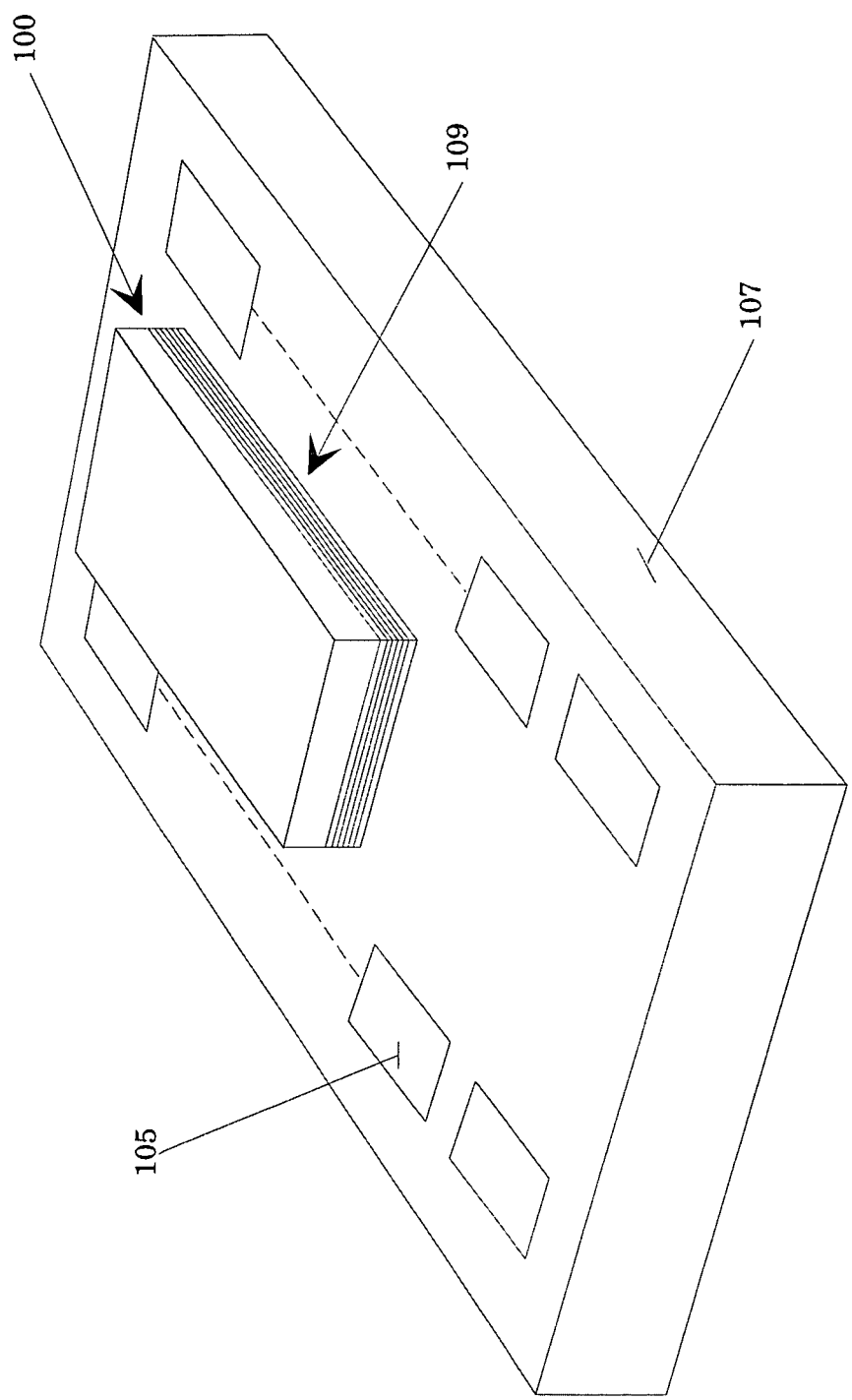
FIG. 1c is a pictorial view of a 3DS DRAM IC stack bonded and interconnected face-down onto a larger conventional IC or another 3DS IC.

Further, the fine grain inter-layer vertical interconnect can be used for direct singulated die bonding between a 3DS memory die and a conventional die (wherein the conventional die could be the controller circuit as shown in FIG. 1c) or a 3DS memory die and another 3DS memory die; it should be assumed that the areas (sizes) of the respective dice to be bonded together can vary and need not be the same. Referring more particularly to FIG. 1c, a 3DS DRAM IC stack 100 bonded and interconnected face-down onto a larger conventional IC or another 3DS IC 107. Optionally the 3DS stack 100 can be composed of only DRAM array circuits with the DRAM controller circuitry as part of the larger die. If the DRAM controller circuitry is part of the larger die, then fine-grain vertical bus interconnect would be required (at the face 109 of the 3DS DRAM IC stack 100) to connect the 3DS DRAM array circuit to the DRAM controller, otherwise larger grain conventional interconnection could be incorporated (patterned) into the planarized bond layer.

Figure 3:
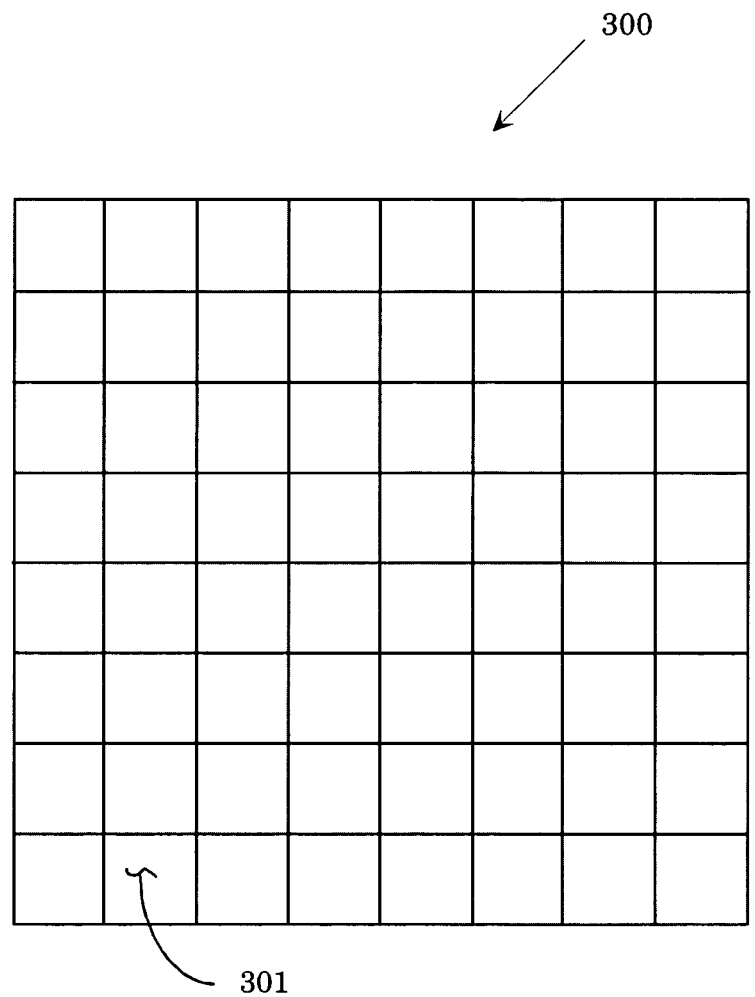
FIG. 3 is a diagram showing the physical layout of a 3DS DRAM array circuit showing partitions for sixty-four (64) 3DS DRAM array blocks.

As shown in FIG. 3, each memory array circuit layer includes a memory array circuit 300 composed of memory array blocks 301 (nominally less than 5 mm$^2$ in area) and each block is composed of memory cells (in much the same manner as the cell array of a DRAM or EEPROM circuit), busing electrodes, and—at the option of the designer—enabling gates for selection of specific rows or columns of the memory array. The controller circuit is composed of sense amps, address, control and drive logic that would normally be found at the periphery of a typical memory circuit of monolithic design such as in a conventional DRAM.

Fine-grain busing vertically connects the controller independently to each memory array layer such that the controller can provide drive (power) or enable signals to any one layer without affecting the state of any of the other layers. This allows the controller to test, read or write independently each of the memory circuit layers.

FIG. 2a and FIG. 2b show examples of layouts of possible blocks of a memory array such as the block 301 of FIG. 3. Although only a portion of the block is shown, in the illustrated embodiment, the blocks exhibit bilateral symmetry such that the layout of the complete block may be ascertained from the illustrated portion. Abbreviations "T", "L", and "TL" are used following various reference numerals to indicate "Top", "Left" and Top-Left," respectively, implying corresponding elements not shown in the figure.

Referring to FIG. 2a, a core portion 200 of the block is composed of a "sea" of memory cells. Logically, the aggregation of memory cells may be subdivided into "macrocells" 201 each containing some number of memory cells, e.g. an 8×8 array of 64 memory cells. At the periphery of the core is formed fine-grain vertical interconnect comprising interlayer bond and bus contact metallizations 400, described in greater detail hereinafter with reference to FIG. 4. The fine-grain vertical interconnect includes I/O power and ground bus lines 203TL, memory circuit layer selects 205T, memory macro cell column selects 207T, data lines 209L, and gate-line multiplexer ("mux") selects 209TL. Gate-line multiplexers 211T are, in the illustrated embodiment, 4:1 multiplexers used to select one of four columns within an eight-wide memory macro cell column. Corresponding bottom-side 4:1 multiplexers combine with the topside multiplexers 211T to form equivalent 8:1 multiplexers for selecting a single gate-line from an eight-gate-line-wide memory macro cell column.

Figure 5:
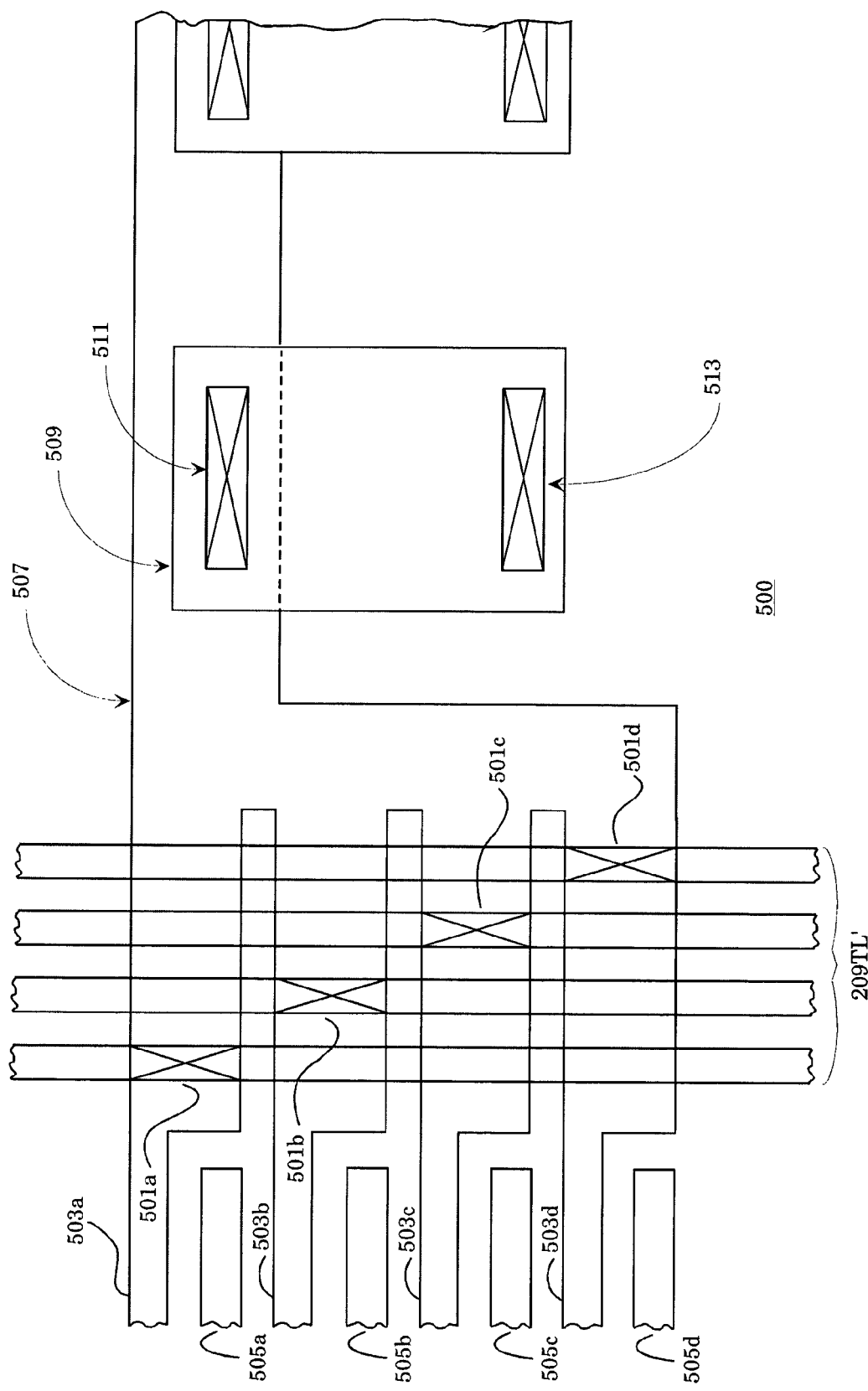
FIG. 5 is a diagram showing the layout of a 3DS memory multiplexer for down-selecting gate-line read or write selection.

One implementation of a 4:1 gate-line bus multiplexer 500 is shown in FIG. 5. Gate-line enables 209TL' (formed in a Metal-1 layer, for example) control transistors 501a through 501d, respectively. Coupled to the transistors are respective gate lines 503a through 503d. Also partly visible are gate-lines 505a through 505d which are coupled to a corresponding 4:1 multiplexer (not shown). When one of the gate-line enables is active, the corresponding gate-line is coupled to an output line 507 of the multiplexer (formed in a Metal-2 layer, for example). The output line is connected to one or more vertical bus connects through a line 509 (formed in a Metal-3 layer and corresponding to metal contact 400 of vertical bus interconnect, for example) and tungsten plugs 511 and 513. The tungsten plug 513 joins the line 509 to a vertical interconnect (not shown).

Referring again to FIG. 2a, in the case of a memory circuit layer, the layer may also include output line enables (gates) from controller layer enable signals 205T, for which I/O enables (gates) 213 may be provided.

Note that at the memory layer level, each memory block 301 is electrically isolated from every other memory block 301. Accordingly, the yield probability for each memory block is independent.

Additional read/write ports can be added as can additional gate-line vertical interconnections; additional vertical interconnection can be used in a redundant manner to improve vertical interconnect yield. The 3DS memory circuit can be designed to have one or more data read and write bus port interconnections. Referring to FIG. 2b, a memory block 301' is shown as having a port $P_0$, (209L) and a further port $P_1$ (209L'). The only limitation on the number of vertical interconnections is the overhead such vertical interconnections impose on the cost of the circuit. The fine-grain vertical interconnect method allows thousands of interconnects per block at an increase in die area of only a few percent.

As an example, the overhead of the vertical interconnect shown in FIG. 2b for a DRAM memory block of 4 Mbits with two read/write ports and implemented in 0.35 μm or 0.15 μm design rules consists of approximately 5,000 connections and is less than 6% of the total area of the memory array block. Therefore, the vertical interconnect overhead for each memory array circuit layer in the 3DS DRAM circuit is less than 6%. This is significantly less than that presently experienced in monolithic DRAM circuit designs where the percentage of non-memory cell area can exceed 40%. In a completed 3DS DRAM circuit the percentage of non-memory cell area is typically less than 10% of the total area of all circuits in the stacked structure.

The 3DS memory device decouples control functions that normally would be found adjacent the memory cells of monolithic memory circuits and segregates them to the controller circuit. The control functions, rather than occurring on each memory array layer as in conventional memory ICs, occur only once in the controller circuit. This creates an economy by which several memory array layers share the same controller logic, and therefore, lowers the net cost per memory cell by as much as a factor of two versus conventional memory design.

The segregation of the control functions to a separate controller circuit allows more area for such functions (i.e., an area equal to the area one or several of the memory array blocks). This physical segregation by function also allows fabrication process segregation of the two very different fabrication technologies used for the control logic and the memory array, again realizing additional fabrication cost savings versus the more complicated combined logic/memory fabrication process used for conventional memory. The memory array can also be fabricated in a process technology without consideration of the process requirements of control logic functions. This results in the ability to design higher performance controller functions at lower cost than is the case with present memory circuits. Furthermore, the memory array circuit can also be fabricated with fewer process steps and nominally reduce memory circuit fabrication costs by 30% to 40% (e.g., in the case of a DRAM array, the process technology can be limited to NMOS or PMOS transistors versus CMOS).

Hence, although bonding of sufficiently planar surfaces of a memory controller substrate and a memory array substrate using thermal diffusion metal bonding is preferred, in the broader aspects of the present invention, the invention contemplates bonding of separate memory controller and memory array substrates by any of various conventional surface bonding methods, such as anisotropically conductive epoxy adhesive, to form interconnects between the two to provide random access data storage.

Figure 2C:
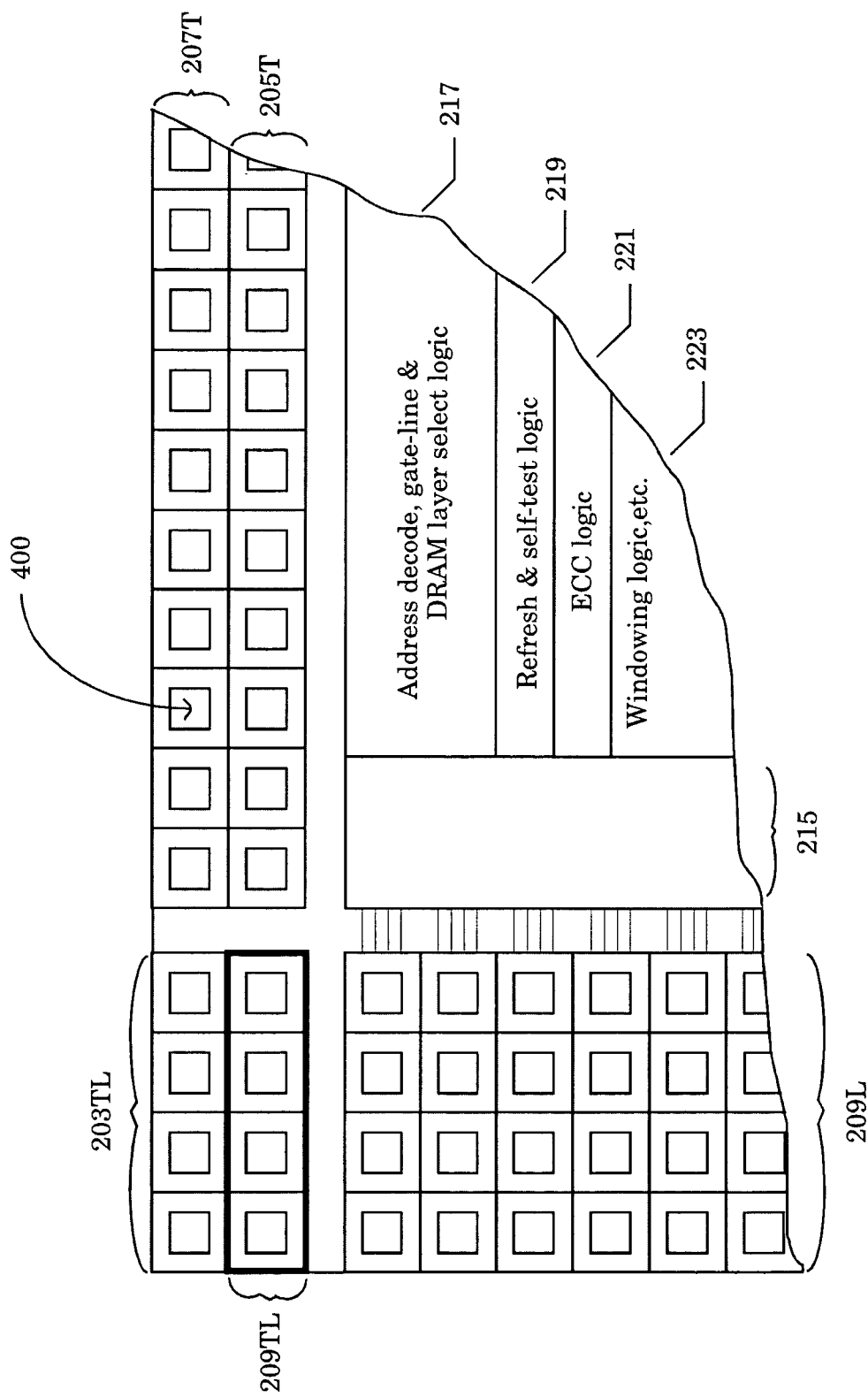
FIG. 2c is a diagram showing the physical layout of a portion of an exemplary memory controller circuit.

Referring to FIG. 2c, the layout of a portion of an exemplary memory controller circuit is shown. The inter-layer bond and bus contact metallization has the same pattern as previously described in relation to FIG. 2a. Instead of a sea of memory cells, however, there is provided memory controller circuitry including, for example, sense amps and data line buffers 215. Because of the increased availability of die area, multi-level logic may be provided in conjunction with the sense amps and data line buffers 215. Also shown are address decode, gate-line and DRAM layer select logic 217, refresh and self-test logic 219, ECC logic 221, windowing logic 223, etc. Note that self-test logic, ECC logic, and windowing logic are provided in addition to functions normally found within a DRAM memory controller circuit. Depending on die size or the number of controller circuit layers used, any of numerous other functions may also be provided including, for example, virtual memory management, address functions such as indirect addressing or content addressing, data compression, data decompression, audio encoding, audio decoding, video encoding, video decoding, voice recognition, handwriting recognition, power management, database processing, graphics acceleration functions, microprocessor functions (including adding a microprocessor substrate), etc.

The size of the 3DS memory circuit die is not dependent on the present constraint of containing the necessary number of memory cells and control function logic on one monolithic layer. This allows the circuit designer to reduce the 3DS circuit die size or choose a die size that is more optimal for the yield of the circuit. 3DS memory circuit die size is primarily a function of the size and number of memory array blocks and the number of memory array layers used to fabricate the final 3DS memory circuit. (The yield of a nineteen (19) layer, 0.25 µm process 3DS DRAM memory circuit may be shown to be greater than 90% as described below.) This advantage of selecting the 3DS circuit die size enables an earlier first production use of a more advanced process technology than would normally be possible for conventional monolithic circuit designs. This, of course, implies additional cost reductions and greater performance over the conventional memory circuits.

3DS Memory Device Fabrication Methods

There are two principal fabrication methods for 3DS memory circuits. The two 3DS memory fabrication methods, however, have a common objective which is the thermal diffusion metal bonding (also referred to as thermal compression bonding) of a number of circuit substrates onto a rigid supporting or common substrate which itself may optionally also be a circuit component layer.

The supporting or common substrate can be a standard semiconductor wafer, a quartz wafer or a substrate of any material composition that is compatible with the processing steps of the 3DS circuit, the operation of the circuit and the processing equipment used. The size and shape of the supporting substrate is a choice that best optimizes available manufacturing equipment and methods. Circuit substrates are bonded to the supporting substrate and then thinned through various methods. Circuit substrates may be formed on standard single crystal semiconductor substrates or as polysilicon circuits formed on an appropriate substrate such as silicon or quartz.

Polysilicon transistor circuits have the important cost saving option of incorporating a parting layer (film) that allows the substrate upon which the polysilicon circuits are formed to be released and reused. Polysilicon transistor or TFTs (Thin Film Transistor) devices are widely used, and need not be made solely from silicon.

The various circuit layers of the 3DS memory circuit are bonded together by use of thermal diffusion of two metal surfaces, typically aluminum. The surface of the circuits to be bonded are smooth and sufficiently planar as is the case with the surface of an unprocessed semiconductor wafer or a processed semiconductor wafer that has been planarized with the CMP (Chemical Mechanical Processing) method with a surface planarity of less than 1 µm and preferably less than 1,000 Å over at least the area of the surface of the circuit (formed on the substrate) to be bonded. The metal bonding material on the surfaces of the circuits to be bonded are patterned to be mirror images of each other and to define the various vertical interconnect contacts as indicated in FIG. 2a, FIG. 2b, FIG. 2c and FIG. 5. The step of bonding two circuit substrates results in simultaneously forming the vertical interconnection between the two respective circuit layers or substrates.

The thermal diffusion bonding of the circuit layers takes place preferably in an equipment chamber with controlled pressure and atmospheric components such as $N_2$ with little $H_2O$ and $O_2$ content. The bonding equipment aligns the patterns of the substrates to be bonded, presses them together with a set of programmed pressures and at one or more temperatures for a period of time as required by the type of metal used as the bonding material. The thickness of the bonding material is nominally in a range of 500 Å to 15,000 Å or greater with a preferred thickness of 1,500 Å. The initial bonding of the substrates is preferably done at lower than standard pressure such as a negative pressure between 1 torr and 740 torr depending on the design of the bond pattern. This can leave an interior negative pressure between the bonding surfaces once external atmospheric pressure is returned which further assists in the formation of the bond and enhances the reliability of the bond.

The preferred bonding material is pure aluminum or an alloy of aluminum, but it is not limited to aluminum and may include, for example, such metals as Sn, Ti, In, Pb, Zn, Ni, Cu, Pt, Au or alloys of such metals that provide acceptable surface bond diffusion capabilities at acceptable temperatures and forming periods. The bonding material is not limited to metal, and could be a combination of bonding materials, such as highly conductive polysilicon, some of which are non-conducting such as silicon dioxide, and the foregoing exemplary types of bond material choices should not be considered to be limitations on how the circuit layers can be bonded.

In the case where metal bond materials form a native surface oxide that either inhibits the forming of a satisfactory bond or may increase the resistance in the vertical interconnections formed by the bond, the oxide should be removed. The bonding equipment provides an oxide reduction capability such that bonding surfaces of the bond material are rendered without native surface oxide. The methods of forming gas atmospheres for the reduction of surface oxides are well known, and there are other methods for removing the native oxide such as sputter etching, plasma etching or ion mill etching. In the case where aluminum is used as the bonding material, it is preferred that the thin native aluminum oxide film of approximately 40 Å on the bonding surfaces be removed prior to bonding.

The thinned (substantially flexible) substrate circuit layers of the 3DS memory circuit are typically memory array circuits, however, the thinned substrate circuit layers are not limited to memory circuits. Other circuit layer types can be controller circuits, non-volatile memory such as EEPROM, additional logic circuitry including microprocessor logic and application specific logic functions such as those that support graphic or database processing, etc. The selection of such circuit layer types follows from the functional requirements of the design of the circuit and is not limited by the 3DS memory fabrication process.

The thinned (substantially flexible) substrate circuit layers are preferably made with dielectrics in low stress (less than $5 \times 10^8$ dynes/cm$^2$) such as low stress silicon dioxide and silicon nitride dielectrics as opposed to the more commonly used higher stress dielectrics of silicon oxide and silicon nitride used in conventional memory circuit fabrication. Such low stress dielectrics are discussed at length in U.S. Pat. No. 5,354,695 of the present inventor, incorporated herein by reference. The use of dielectrics with conventional stress levels could be used in the assembly of a 3DS DRAM circuit, however, if more than a few layers comprise the stacked assembly, each layer in the assembly will have to be stress balanced so that the net stress of the deposited films of a layer is less than $5\times10^8$ dynes/cm$^2$. The use of intrinsically low stress deposited films is the preferred method of fabrication versus the use of the method where the stress of individually deposited films are not equal but are deposited to create a net balanced lower stress.

Method A, 3DS Memory Device Fabrication Sequence

This fabrication sequence assumes that several circuit layers will be bonded to a common or support substrate and subsequently thinned in place. An example of a resulting 3DS memory circuit is shown in FIG. 1a.

1. Align, and bond to the common substrate the topside of a second circuit substrate.

2A. Grind the backside or exposed surface of the second circuit substrate to a thickness of less than 50 μm and then polish or smooth the surface. The thinned substrate is now a substantially flexible substrate.

Optionally an etch stop may be incorporated in the second substrate from less than a micron to several microns below the semiconductor surface prior to device fabrication. This etch stop can be an epitaxially formed film such as GeB (described in U.S. Pat. Nos. 5,354,695 and 5,323,035 of the present inventor, incorporated herein by reference) or a low density implanted layer of $O_2$ or $N_2$ to form a buried oxide or nitride barrier etch stop layer just below the device layer on the topside of the second substrate. After a preliminary grinding of a significant portion of the backside of the substrate, the remaining portion of the backside of the second substrate is then selectively etched in a chemical bath which stops on the surface of the epitaxial or implanted layer. Subsequent polishing and RIE steps as necessary can then be used to complete the thinning of the second substrate.

Alternately, a parting layer such as $H_2$ implanted into the topside surface of the second substrate prior to device fabrication can be used with a thermal step to crack off the majority of the backside of the second substrate, allowing its reuse.

2B. The second substrate may alternatively be a circuit formed of polysilicon transistors or TFTs over a parting layer such as aluminum, titanium, AlAs, KBr, etc. which can be activated by a specific chemical release agent. The backside of the second substrate is then removed upon activating (dissolving) the release layer and followed as needed by interconnect semiconductor processing steps.

3. Process the thinned backside of the second substrate to form vertical interconnections such as that shown in FIG. 4 with the bonded surface side of the second substrate. The backside processing typically comprises conventional semiconductor processing steps of dielectric and metal deposition, lithography and RIE, the order of which can vary to a great degree. The completion of the backside processing will also result in a patterned metal layer that is similar to the topside bond material pattern to facilitate the subsequent bonding of an additional circuit substrate, a terminal pattern such as a conventional I/O IC bond pad (wire bonding) pattern, a pattern for thermal diffusion bonding of the 3DS memory circuit to another die (either another 3DS circuit or a conventional die), or a pattern for insertion interconnection, conventional DCA (Direct Chip Attach) or FCA (Flip-Chip Attach).

Figure 4:
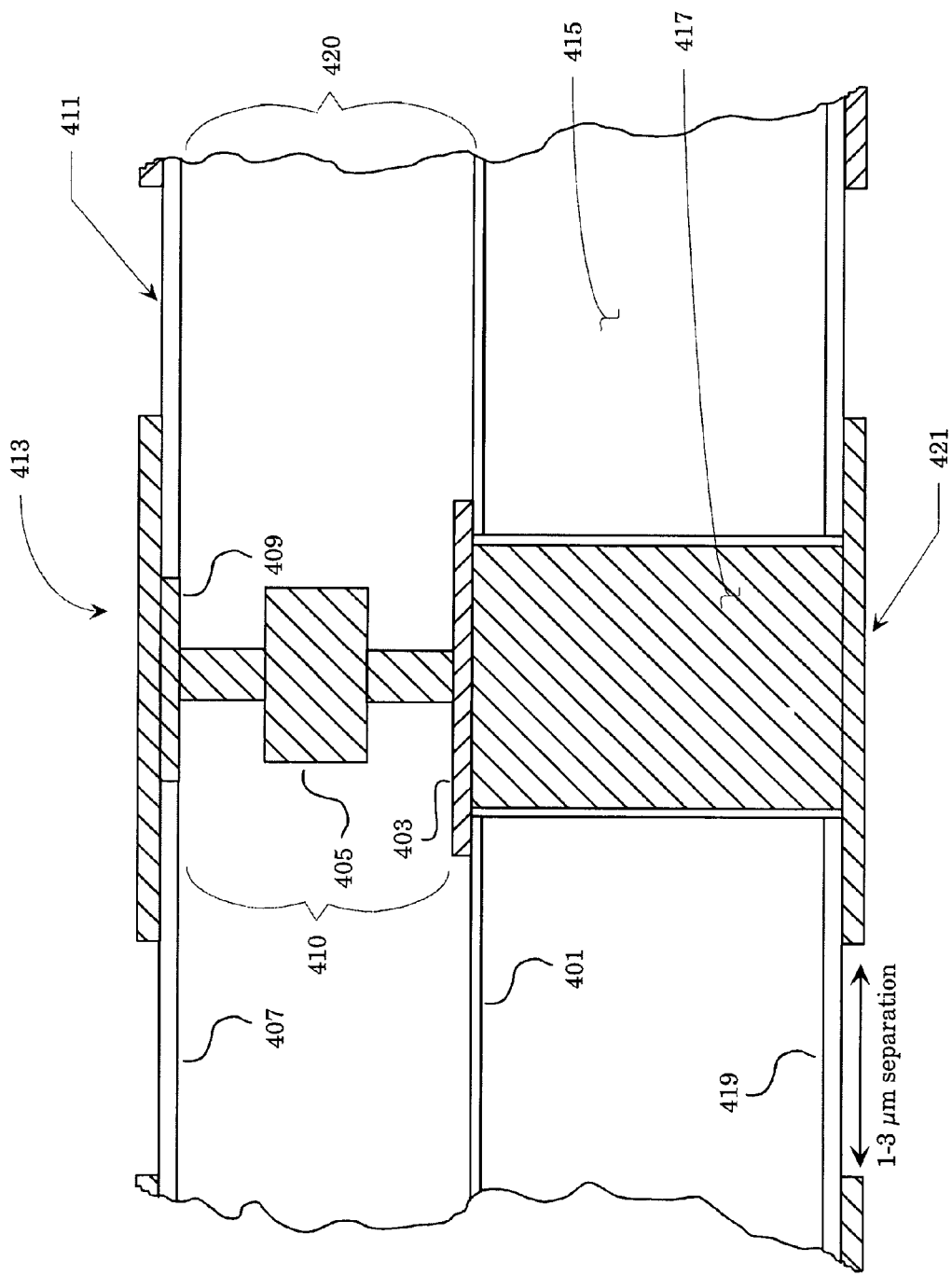
FIG. 4 is a cross-sectional view of a generic 3DS vertical interconnection or feed-through in a thinned substrate.

Referring more particularly to FIG. 4, during the fabrication of active circuit devices, an oxide mask 401 is thermally grown or deposited. Vertical bus contacts 403 are then formed, for example from highly-doped polysilicon coincident with a polysilicon gate forming step. Alternatively, contact 403 may be formed of metal. Conventional DRAM interconnect structures 410 are then formed using conventional processing. The DRAM interconnect may include an internal pad 405. The "DRAM processed" portion 420 of the wafer includes various dielectric and metal layers. A final passivation layer 407 is deposited, after which vias 409 are formed. Conventional CMP processing is then used to obtain a planar surface 411. Contacts 413 and bond surfaces not shown are then patterned in a top-most metal layer (e.g, Metal-3).

After bonding and thinning of the backside of the second substrate to about 1-8 μm of silicon (or other semiconductor) substrate 415, feed-throughs 417 are then formed in registration with the contacts 403. A passivation layer 419 and contacts 421 are then formed. The contacts 421 may be formed so as to form a mirror image of the contacts 413, allowing for the bonding of further wafers.

4. If another circuit layer is to be bonded to the 3DS circuit stack, steps 1-3 are repeated.

5A. The circuits of the finished 3DS memory substrate are then conventionally sawed into die (singulated), resulting in a circuit of the type shown in FIG. 1a, and packaged as would be the case with conventional integrated circuits.

5B. The circuits of the finished 3DS memory substrate are then conventionally sawed and then individually aligned and thermal diffusion bonded (metal pattern down) to the surface of a second (conventional IC) die or MCM substrate in a manner similar to that used in the bonding of the circuit substrates of step 1 above. (The conventional die or MCM substrate may have a larger area than the 3DS memory substrate and may include a graphics controller, video controller or microprocessor, such that the 3DS becomes embedded as part of another circuit.) This final bonding step typically incorporates a fine-grain interconnect between the 3DS memory circuit and the die or MCM substrate, but could also use a conventional interconnect pattern. Further, a 3DS memory circuit can be bonded face up to a conventional IC in die form or MCM substrate and wire bonding used to form conventional I/O interconnections.

Method B, 3DS Memory Device Fabrication Sequence

This fabrication sequence assumes that a circuit substrate will first be bonded to a transfer substrate, thinned and then bonded to a common substrate as a layer of the circuit stack. The transfer substrate is then released. This method has the advantage over Method A of allowing substrates to be thinned prior to being bonded to the final circuit stack and allows for simultaneous thinning and vertical interconnect processing of substrate circuit layers.

1. Bond to a transfer substrate a second circuit substrate using a release or parting layer. A transfer substrate may have high tolerance parallel surfaces (TTV or Total Thickness Variance of less than 1 μm) and may be perforated with an array of small holes to assist the parting process. The parting layer can be a blanket deposition of a bonding metal. Precise alignment of the surfaces is not required.

2. Perform step 2A or 2B of Method A.

3. Process the backside of the second substrate to form interconnections with the bonded topside surface of the second substrate as shown in FIG. 4. The backside processing typically comprises conventional semiconductor processing steps of dielectric and metal deposition, lithography and RIE, the order of which can vary to great degree. The completion of the backside processing will also result in a patterned metal layer that is similar to the bond material pattern of the common substrate to facilitate the subsequent bonding of an additional circuit layer.

4. Bond the second circuit to a common or support substrate (3DS stack) and release the transfer substrate by activating the parting layer between it and the second circuit.

5. Process the now exposed topside of the second substrate to form interconnections for subsequent substrate bonding or a terminal pattern for conventional I/O bonding (wire bonding) pad pattern, a pattern for thermal diffusion bonding of the 3DS memory circuit to another die (either another 3DS circuit or a conventional die), or a pattern for conventional insertion interconnect, DCA (Direct Chip Attach) or FCA (Flip-Chip Attach). If another circuit layer is to be bonded to the 3DS circuit stack, steps 1 through 4 are repeated.

6. Perform step 5A or 5B of Method A.

3DS Memory Device Yield Enhancement Methods

The 3DS circuit may be considered a vertically assembled MCM (Multi-Chip Module) and as with an MCM the final yield is the product of the yield probabilities of each component circuit (layer) in the completed 3DS circuit. The 3DS circuit uses several yield enhancement methods that are synergistic in their combined usage within a single memory IC. The yield enhancement methods used in the 3DS memory circuit include small memory array block size, memory array block electrical isolation through physically unique or separate vertical bus interconnections, intra memory array block gate-line sparing, memory array layer sparing (inter-block gate-line sparing), controller sparing and ECC (Error Correcting Codes). The term sparing is used to mean substitution by a redundant element.

The selected size of the memory array block is the first component in the yield equation for the 3DS memory circuit. Each memory array block is individually (uniquely) accessed and powered by the controller circuit and is physically independent of each and every other memory array block including those on the same memory array layer in addition to those on a different memory array layer. The size of the memory array block is typically less than 5 mm$^2$ and preferably less than 3 mm$^2$, but is not limited to a specific size. The size of memory array block, the simplicity of its NMOS or PMOS fabrication process and its physical independence from each of the other memory array blocks, for nearly all production IC processes, provides a conservatively stated nominal yield of greater than 99.5%. This yield assumes that most point defects in the memory array block such as open or shorted interconnect lines or failed memory cells can be spared (replaced) from the intra-block or inter-block set of redundant gate-lines. Major defects in a memory array block which render the complete memory array block unusable result in the complete sparing of the block from a redundant memory array layer or the rejection of the 3DS circuit.

In the example of a 3DS DRAM circuit the yield of a stack of memory array blocks is calculated from the yield equation $Ys=((1-(1-P_y)^2)^n)^b$, where n is the number DRAM array layers, b is the number of blocks per DRAM array and $P_y$ is the effective yield (probability) of a DRAM array block less than 3 mm$^2$ in area. Assuming a DRAM array block redundancy of 4% for gate-lines in the DRAM array block lines and one redundant DRAM array layer, and assuming further that the number of blocks per layer is 64, the number of memory array layers in the stack is 17 and the effective value for Py is 0.995, then the stack yield Ys for the complete memory array (including all memory array block stacks) is 97.47%.

The Ys memory array stack yield is then multiplied by the yield of the controller Yc. Assuming a die size of less than 50 mm$^2$, a reasonable Yc for a controller fabricated from a 0.5 μm BiCMOS or mixed signal process would be between 65% and 85%, giving a net 3DS memory circuit yield of between 63.4% and 82.8%. If a redundant controller circuit layer is added to the 3DS memory stack, the yield probabilities would be between 85.7% and 95.2%.

The effective yield of a memory array block can be further increased by the optional use of ECC logic. ECC logic corrects data bit errors for some group size of data bits. The syndrome bits necessary for the operation of ECC logic would be stored on redundant gate-lines of any of the memory array layers in a vertically associated block stack. Further, if necessary, in order to accommodate the storage of ECC syndrome bits, additional memory array layers could be added to the circuit.

Advantageous 3DS Memory Device Controller Capabilities

As compared to a conventional memory circuit, the 3DS memory controller circuit can have various advantageous capabilities due the additional area available for controller circuitry and the availability of various mixed signal process fabrication technologies. Some of these capabilities are self-test of memory cells with dynamic gate-line address assignment, virtual address translation, programmable address windowing or mapping, ECC, data compression and multi-level storage.

Dynamic gate-line address assignment is the use of programmable gates to enable the layer and gate-line for a read/write operation. This allows the physical order of memory storage to be separate or different from the logical order of stored memory.

The testing of each generation of memory devices has resulted in significantly increased test costs. The 3DS memory controller reduces the cost of testing by incorporating sufficient control logic to perform an internal test (self-test) of the various memory array blocks. Circuit testing in the conventional ATE manner is required only for verification of controller circuit functions. The scope of the internal test is further extended to the programmable (dynamic) assignment of unique addresses corresponding to the various gate-lines of each memory array block on each layer. Self-test capability of the 3DS controller circuit can be used anytime during the life of the 3DS memory circuit as a diagnostic tool and as a means to increase circuit reliability by reconfiguring (sparing) the addresses of gate-lines that fail after the 3DS memory circuit is in use in a product.

ECC is a circuit capability that, if included in the controller circuit, can be enabled or disabled by a programming signal or made a dedicated function.

Data compression logic will allow the total amount of data that can be stored in the 3DS memory array to be increased. There are various generally known data compression methods available for this purpose.

Larger sense amps allow greater dynamic performance and enable higher speed read operations from the memory cells. Larger sense amps are expected to provide the capability to store more than one bit (multi-level storage) of information in each memory cell; this capability has already been demonstrated in non-volatile memory circuits such as flash EPROM. Multi-level storage has also been proposed for use in the 4 Gbit DRAM generation circuits.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An apparatus comprising:
    a first integrated circuit;
    a second integrated circuit stacked with the first integrated circuit;
    a thermal diffusion bond layer physically joining the first and second integrated circuits and providing a primary means of attachment of the first and second integrated circuits;
    wherein at least one of the first integrated circuit and the second integrated circuit is substantially flexible and comprises a substantially flexible semiconductor substrate of one piece made from a semiconductor wafer, thinned by at least one of abrasion, etching and parting, and subsequently polished or smoothed after being thinned to form a polished or smoothed surface; and a plurality of vertical interconnects each of which extends through one of a plurality of holes in semiconductor material of the substantially flexible semiconductor substrate from a first surface of the substantially flexible semiconductor substrate to an opposite surface thereof and comprises within the one of the plurality of holes a conductive center portion and a silicon-based dielectric insulating portion surrounding the conductive center portion, wherein the vertical interconnects are closely arrayed.

2. The apparatus of claim 1, further comprising: a third integrated circuit stacked with the first and second integrated circuits; and a thermal diffusion bond layer physically joining the second and third integrated circuits.

3. The apparatus of claim 2, wherein the vertical interconnects extend continuously between all of the first, second and third integrated circuits.

4. The apparatus of claim 3, wherein the first, second and third integrated circuits have circuit devices formed at least primarily on a front surface thereof only, the front surfaces of the first and second integrated circuits being bonded together, and the front surface of the third integrated circuit being bonded to a back surface of the second integrated circuit.

5. The apparatus of claim 2, further comprising a plurality of vertical interconnects formed at least in part by bonds of the thermal diffusion bond layer joining the second and third integrated circuits and connecting circuitry of the second and third integrated circuits.

6. The apparatus of claim 4, wherein said circuit devices are formed from one of single crystal semiconductor material and polycrystalline semiconductor material.

7. The apparatus of claim 4, wherein the vertical interconnects are formed at least in part by bonds of the thermal diffusion bond layers.

8. The apparatus of claim 1, wherein the first integrated circuit and the second integrated circuit are each formed with one of single crystal semiconductor material and polycrystalline semiconductor material.

9. The apparatus of claim 1, wherein one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance.

10. The apparatus of claim 1, wherein at least one of the first and second integrated circuits comprises a microprocessor.

11. The apparatus of claim 1, wherein the first integrated circuit comprises a memory integrated circuit and the second integrated circuit comprises a logic integrated circuit, wherein the logic integrated circuit performs testing of the memory integrated circuit via the vertical interconnects.

12. The apparatus of claim 1, wherein at least one of the first and second integrated circuits comprises a memory integrated circuit having multiple memory locations, wherein data from a spare one of the memory locations is used instead of data from a defective one of the memory locations.

13. The apparatus of claim 1, wherein the first integrated circuit comprises a memory integrated circuit and the second integrated circuit comprises a logic integrated circuit, wherein the logic integrated circuit performs programmable gate line address assignment with respect to the memory integrated circuit.

14. The apparatus of claim 1, wherein the vertical interconnects traverse the at least one of the first integrated circuit and the second integrated circuit that is substantially flexible.

15. The apparatus of claim 1, wherein the vertical interconnects connect circuitry of the first and second integrated circuits.

16. The apparatus of claim 15, wherein information processing is performed by the circuitry of one of the first and second integrated circuits on data routed between the circuitry of the first and second integrated circuits via the vertical interconnects.

17. The apparatus of claim 1, wherein at least one of the first and second integrated circuits has reconfiguration circuitry.

18. The apparatus of claim 1, wherein at least one of the first and second integrated circuits comprises logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing.

19. The apparatus of claim 1, wherein:
the first integrated circuit comprises a memory array having a plurality of memory cells, a plurality of data lines, and a plurality of gate lines, each memory cell storing a data value and comprising circuitry for coupling that data value to a corresponding one of said data lines in response to a gate control signal on a corresponding one of said gate lines;
the second integrated circuit comprises circuitry for generating gate control signals in response to addresses based on a mapping of addresses to gate lines; and
the second integrated circuit comprises circuitry for determining at least one of whether there are defective ones of said memory cells and whether there are defective ones of the gate lines and for reconfiguring said mapping for at least one of eliminating references to the corresponding ones of the gate lines for said defective ones of said memory cells and eliminating references to the defective ones of the gate lines.

20. The apparatus of claim 1, further comprising:
one or more controller integrated circuits including the first integrated circuit;
one or more memory integrated circuits including the second integrated circuit;
a plurality of data lines and a plurality of gate lines on each memory integrated circuit;
an array of memory cells on each memory integrated circuit, each memory cell storing a data value and comprising circuitry for coupling that data value to a corresponding one of said data lines in response to selection of a corresponding one of said gate lines;
gate line selection logic on at least one of the one or more controller integrated circuits for selecting gate lines for memory operations, said gate line selection circuit comprising programmable gates to receive programmed address assignments for said gate lines, each programmed address assignment for determining which of said gate lines is to be selected; and
test logic on at least one of the one or more controller integrated circuits for determining at least one of whether there are defective ones of said array memory cells and whether there are defective ones of the gate lines and for reconfiguring said programmed address assignments for at least one of eliminating references to the corresponding ones of the gate lines for the defective ones of the memory cells and eliminating references to the defective ones of the gate lines.

21. The apparatus of claim 20, wherein said test logic is configured to test periodically to determine at least one of whether there are defective ones of the memory cells and whether there are defective ones of the gate lines.

22. The apparatus of claim 20, wherein at least one of the one or more controller integrated circuits further comprises programmable logic to prevent the use of data values from the corresponding ones of the data lines for the defective ones of the memory cells.

23. The apparatus of claim 20, wherein said memory cells are arranged within physical space in a physical order and are arranged within an address space in a logical order, wherein said physical order of at least one memory cell is different than the logical order of the at least one memory cell.

24. The apparatus of claim 21, wherein external testing of the test logic together with the testing by the test logic achieves a functional testing of at least one of a preponderance of the memory cells and a preponderance of the gate lines.

25. The apparatus of claim 21, wherein the testing by the test logic substantially reduces or eliminates the need for external testing.

26. The apparatus of claim 20, wherein reconfiguring the programmed address assignments comprises at least one of replacing references to the corresponding ones of the gate lines for the defective ones of the memory cells with references to the corresponding ones of the gate lines for spare ones of the memory cells and replacing references to the defective ones of the gate lines with references to spare ones of the gate lines.

27. The apparatus of claim 1, wherein the first integrated circuit is fabricated using one process technology, and the second integrated circuit is fabricated using a different process technology.

28. The apparatus of claim 1, wherein at least one of the first and second integrated circuits has a thickness of at least one of 10 microns or less and 50 microns or less.

29. The apparatus of claim 1, wherein the substantially flexible semiconductor substrate is a monocrystalline semiconductor substrate.

30. The apparatus of claim 1, wherein a back surface of the substantially flexible semiconductor substrate is the polished or smoothed surface.

31. The apparatus of claim 1, wherein the insulating portion of each vertical interconnect has a stress of less than $5 \times 10^8$ dynes/cm$^2$ tensile.

32. The apparatus of claim 1, wherein at least one of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects including a bond of the thermal diffusion bond layer, connecting circuitry of the first integrated circuit and circuitry of the second integrated circuit; wherein the at least one of the first and second integrated circuits that is substantially flexible comprises a silicon-based dielectric layer with a stress of less than $5 \times 10^8$ dynes/cm$^2$ tensile; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations.

33. The apparatus of claim 1, wherein at least two of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects including a bond of the thermal diffusion bond layer, connecting circuitry of the first integrated circuit and circuitry of the second integrated circuit; wherein the at least one of the first and second integrated circuits that is substantially flexible comprises a silicon-based dielectric layer with a stress of less than $5 \times 10^8$ dynes/cm$^2$ tensile; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein plurality of said circuit block stacks are configured to independently perform memory operations; wherein at least one of the integrated circuits comprises a front surface and a back surface opposite the front surface, further comprising a tensile low stress silicon-based dielectric with a stress of less than $5 \times 10^8$ dynes/cm$^2$ tensile on the back surface.

34. The apparatus of claim 1, wherein at least three of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects including a bond of the thermal diffusion bond layer, connecting circuitry of the first integrated circuit and circuitry of the second integrated circuit; wherein the at least one of the first and second integrated circuit that is substantially flexible comprises a silicon-based dielectric layer with a stress of less than $5\times10^8$ dynes/cm$^2$ tensile; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations.

35. The apparatus of claim 1, wherein the vertical interconnects are formed at least in part by bonds of the thermal diffusion bond layer and connect circuitry of the first and second integrated circuits.

36. The apparatus of claim 1, wherein the first integrated circuit and the second integrated circuit form at least part of a stacked integrated circuit memory, wherein at least a portion of the stacked integrated circuit memory is partitioned into a plurality of block stacks, each block stack comprising circuit blocks that are on different ones of the first and second integrated circuits and are vertically interconnected by a corresponding array of the vertical interconnects for the block stack, wherein the block stacks are configured to perform memory operations independently of each other.

37. The apparatus of claim 36, wherein the corresponding arrays of the vertical interconnects for the block stacks transfer data independently of each other during the memory operations performed independently by the block stack.

38. The apparatus of claim 1, further comprising a silicon-based dielectric insulating layer formed on the at least one of the first integrated circuit and the second integrated circuit that is substantially flexible, wherein both the silicon-based dielectric insulating layer and the silicon-based dielectric insulating portions of the vertical interconnects have a low stress of less than $5\times10^8$ dynes/cm$^2$ tensile, and wherein the at least one of the first integrated circuit and the second integrated circuit that is substantially flexible is so from the combination of the substantially flexible semiconductor substrate being substantially flexible from being thinned and having the polished or smoothed surface, and the silicon-based dielectric insulating layer having the low stress.

39. The apparatus of claim 1, wherein the at least one of the first integrated circuit and second integrated circuit that is substantially flexible comprises a low stress silicon-based dielectric layer with a stress of less than $5\times10^8$ dynes/cm$^2$ tensile on the polished or smoothed surface of the substantially flexible semiconductor substrate.

40. The apparatus of claim 1, wherein:
the substantially flexible semiconductor substrate is monocrystalline and made substantially flexible when it is thinned and polished or smoothed by first grinding away semiconductor wafer material thereof to leave an exposed surface thereof, and then polishing or smoothing the exposed surface;
the at least one of the first integrated circuit and the second integrated circuit that is substantially flexible further comprises at least one low stress silicon-based dielectric layer having a low stress of less than $5\times10^8$ dynes/cm$^2$ tensile and is substantially flexible based at least on the combination of the low stress of the at least one low-stress silicon-based dielectric layer and the substantially flexible semiconductor substrate being substantially flexible; and
the at least one of the first integrated circuit and the second integrated circuit that is substantially flexible has edges that define its size in area, wherein the substantially flexible semiconductor substrate extends in one piece across a substantial portion of the area between the edges.

41. The apparatus of claim 19, wherein the mapping is reconfigured by at least one of replacing references to the corresponding ones of the gate lines for the defective ones of the memory cells with references to the corresponding ones of the gate lines for spare ones of the memory cells and replacing references to the defective ones of the gate lines with references to spare ones of the gates lines.

42. The apparatus of claim 40, wherein the substantially flexible semiconductor substrate is polished or smoothed to reduce vulnerability to fracture as a result of flexing.

43. An apparatus comprising:
a first integrated circuit, a second integrated circuit stacked with the first integrated circuit and a plurality of vertical interconnects connecting circuitry of the first integrated circuit and circuitry of the second integrated circuit, wherein at least some of the vertical interconnects are closely arrayed;
wherein at least one of the first integrated circuit and the second integrated circuit is substantially flexible and comprises a substantially flexible semiconductor substrate of one piece made from a semiconductor wafer, thinned by at least one of abrasion, etching and parting, and subsequently polished or smoothed after being thinned to form a polished or smoothed surface;
wherein each of said vertical interconnects extends through one of a plurality of holes in semiconductor material of the substantially flexible semiconductor substrate from a first surface of the substantially flexible semiconductor substrate to an opposite surface thereof and comprises within the one of the plurality of holes a conductive center portion and a silicon-based dielectric insulating portion surrounding the conductive center portion and having a stress of less than $5\times10^8$ dynes/cm$^2$ tensile.

44. The apparatus of claim 43, further comprising: a third integrated circuit stacked with the first and second integrated circuits; wherein the vertical interconnects extend continuously between all of the first, second and third integrated circuits and connect the circuitry of the first integrated circuit, the circuitry of the second integrated circuit, and circuitry of the third integrated circuit.

45. The apparatus of claim 43, further comprising a circuit substrate separate from and stacked with the first and second integrated circuits.

46. The apparatus of claim 43, wherein the first and second integrated circuits are bonded together by a thermal diffusion bond layer.

47. The apparatus of claim 44, wherein the first, second and third integrated circuits have circuit devices formed at least primarily on a front surface thereof, front surfaces of the first and second integrated circuits being bonded together, and a front surface of the third integrated circuit being bonded to a back surface of the second integrated circuit.

48. The apparatus of claim 45, wherein the first and second integrated circuits have circuit devices formed at least primarily on a front surface thereof, wherein at least one of:
the front surface of the second integrated circuit is bonded to a back surface of the first integrated circuit; and
the front surface of the first integrated circuit is bonded to a front surface of the circuit substrate.

49. The apparatus of claim 46, wherein the vertical interconnects are formed at least in part by bonds of the thermal diffusion bond layer.

50. The apparatus of claim 47, wherein the first and second integrated circuits are bonded together by a thermal diffusion bond layer and the second and third integrated circuits are bonded together by a thermal diffusion bond layer.

51. The apparatus of claim 47, wherein said circuit devices are formed from one of single crystal semiconductor material and polycrystalline semiconductor material.

52. The apparatus of claim 48, wherein said circuit devices are formed from one of single crystal semiconductor material and polycrystalline semiconductor material.

53. The apparatus of claim 43, wherein the first integrated circuit and the second integrated circuit are each formed with one of single crystal semiconductor material and polycrystalline semiconductor material.

54. The apparatus of claim 43, wherein one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance.

55. The apparatus of claim 43, wherein at least one of the first and second integrated circuits comprises a microprocessor.

56. The apparatus of claim 43, wherein the first integrated circuit comprises a memory integrated circuit and the second integrated circuit comprises a logic integrated circuit, wherein the logic integrated circuit performs testing of the memory integrated circuit via the vertical interconnects.

57. The apparatus of claim 43, wherein at least one of the first and second integrated circuit comprises a memory integrated circuit having multiple memory locations, wherein data from a spare one of the memory locations is used instead of data from a defective one of the memory locations.

58. The apparatus of claim 43, wherein the first integrated circuit comprises a memory integrated circuit and the second integrated circuit comprises a logic integrated circuit, wherein the logic integrated circuit performs programmable gate line address assignment with respect to the memory integrated circuit.

59. The apparatus of claim 43, wherein the vertical interconnects traverse the at least one of the first integrated circuit and the second integrated circuit that is substantially flexible.

60. The apparatus of claim 50, wherein the vertical interconnects are formed at least in part by bonds of the thermal diffusion bond layers.

61. The apparatus of claim 43, wherein information processing is performed by the circuitry of one of the first and second integrated circuits on data routed between the circuitry of the first integrated circuit and the circuitry of the second integrated circuit via the vertical interconnects.

62. The apparatus of claim 43, wherein at least one of the first and second integrated circuits has reconfiguration circuitry.

63. The apparatus of claim 43, wherein at least one of the first and second integrated circuit comprises logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing.

64. The apparatus of claim 43, wherein:
the first integrated circuit comprises a memory array having a plurality of memory cells, a plurality of data lines, and a plurality of gate lines, each memory cell storing a data value and comprising circuitry for coupling that data value to a corresponding one of said data lines in response to a gate control signal on a corresponding one of said gate lines;
the second integrated circuit comprises circuitry for generating gate control signals in response to addresses based on a mapping of addresses to gate lines; and
the second integrated circuit comprises circuitry for at least one of determining whether there are defective ones of said memory cells and reconfiguring said mapping to eliminate references to the corresponding ones of the gate lines for said defective ones of said memory cells and determining whether there are defective ones of the gate lines and reconfiguring the mapping to eliminate references to the defective ones of the gate lines.

65. The apparatus of claim 43, further comprising:
one or more controller integrated circuits including the first integrated circuit;
one or more memory integrated circuits including the second integrated circuit;
a plurality of data lines and a plurality of gate lines on each memory integrated circuit;
an array of memory cells on each memory integrated circuit, each memory cell storing a data value and comprising circuitry for coupling that data value to a corresponding one of said data lines in response to selection of a corresponding one of said gate lines;
gate line selection logic on at least one of the one or more controller integrated circuits for selecting gate lines for memory operations, said gate line selection logic comprising programmable gates to receive programmed address assignments for said gate lines, each programmed address assignment for determining which of said gate lines is to be selected; and
test logic on at least one of the one or more controller integrated circuits for at least one of determining whether there are defective ones of said memory cells and reconfiguring the programmed address assignments to eliminate references to the corresponding ones of the gate lines for the defective ones of the memory cells and determining whether there are defective ones of the gate lines and reconfiguring the programmed address assignments to eliminate references to the defective ones of the gate lines.

66. The apparatus of claim 65, wherein said test logic is configured to test periodically to determine at least one of whether there are defective ones of said memory cells and whether there are defective ones of the gate lines.

67. The apparatus of claim 65, wherein at least one of the one or more controller integrated circuits further comprises programmable logic to prevent the use of data values from the corresponding ones of the data lines for the defective ones of the memory cells.

68. The apparatus of claim 65, wherein said memory cells are arranged within physical space in a physical order and are arranged within an address space in a logical order, wherein said physical order of at least one memory cell is different than the logical order of the at least one memory cell.

69. The apparatus of claim 66, wherein external testing of the test logic together with the testing by the test logic achieves a functional testing of at least one of a preponderance of the memory cells and a preponderance of the gate lines.

70. The apparatus of claim 66, wherein the testing by the test logic substantially reduces or eliminates the need for external testing.

71. The apparatus of claim 65, wherein reconfiguring the programmed address assignments comprises at least one of replacing references to the corresponding ones of the gate lines for the defective ones of the memory cells with references to the corresponding ones of the gate lines for spare ones of the memory cells and replacing references to the defective ones of the gate lines with references to spare ones of the gate lines.

72. The apparatus of claim 43 wherein the vertical interconnects are internal to the apparatus.

73. The apparatus of claim 43, wherein at least one of the first and second integrated circuits has a thickness of at least one of 10 microns or less and 50 microns or less.

74. The apparatus of claim 43, wherein the substantially flexible semiconductor substrate is a monocrystalline semiconductor substrate.

75. The apparatus of claim 43, wherein a back surface of the substantially flexible semiconductor substrate is the polished or smoothed surface.

76. The apparatus of claim 43, wherein the insulating portion surrounding the conductive center portion of each vertical interconnect comprises a silicon-based dielectric material having a stress of less than $5 \times 10^8$ dynes/cm$^2$ tensile.

77. The apparatus of claim 42, wherein at least one of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects includes a thermal diffusion bond, connecting circuitry of the first integrated circuit and circuitry of the second integrated circuit; wherein the at least one of the first and second integrated circuits that is substantially flexible comprises a silicon-based dielectric layer with a stress of less than $5 \times 10^8$ dynes/cm$^2$ tensile; wherein the first integrated circuit and the second integrated circuit form at least a part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations.

78. The apparatus of claim 43, wherein at least two of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects includes a thermal diffusion bond, connecting circuitry of the first integrated circuit and circuitry of the second integrated circuit; wherein the at least one of the first and second integrated circuits that is substantially flexible comprises a silicon-based dielectric layer with a stress of less than $5 \times 10^8$ dynes/cm$^2$ tensile; wherein the first integrated circuit and the second integrated circuit form at least a part of a stacked integrated memory circuit, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the integrated circuits comprises a front surface and a back surface opposite the front surface, further comprising a tensile low stress silicon-based dielectric with a stress of less than $5 \times 10^8$ dynes/cm$^2$ tensile on the back surface.

79. The apparatus of claim 43, wherein at least three of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects includes a thermal diffusion bond, connecting circuitry of the first integrated circuit and circuitry of the second integrated circuit; wherein the at least one of the first and second integrated circuits that is substantially flexible comprises a silicon-based dielectric layer with a stress of less than $5 \times 10^8$ dynes/cm$^2$ tensile; wherein the first integrated circuit and the second integrated circuit form at least part of a stacked integrated memory circuit, wherein at least a portion of the stacked integrated circuit memory is partitioned into a plurality of circuit block stacks each comprising vertically interconnected circuit blocks, wherein a plurality of said circuit block stacks are configured to independently perform memory operations.

80. The apparatus of claim 50, wherein the vertical interconnects are formed at least in part by bonds of the thermal diffusion bond layers.

81. The apparatus of claim 43, wherein the at least one of the first integrated circuit and the second integrated circuit that is substantially flexible further comprises a silicon-based dielectric layer on the substantially flexible semiconductor substrate with a tensile stress of less than $5 \times 10^8$ dynes/cm$^2$.

82. The apparatus of claim 81, wherein the low stress silicon-based dielectric layer is at least one of a silicon dioxide dielectric and an oxide of silicon dielectric.

83. The apparatus of claim 43, wherein the first integrated circuit and the second integrated circuit form at least part of a stacked integrated circuit memory, wherein at least a portion of the stacked integrated circuit memory is partitioned into a plurality of block stacks, each block stack comprising circuit blocks that are on different ones of the first and second integrated circuits and are vertically interconnected by a corresponding array of the vertical interconnects for the block stack, wherein the block stacks are configured to perform memory operations independently of each other.

84. The apparatus of claim 83, wherein the corresponding arrays of the vertical interconnects for the block stacks transfer data independently of each other during the memory operations performed independently by the block stacks.

85. The apparatus of claim 43, further comprising a silicon-based dielectric insulating layer formed on the at least one of the first integrated circuit and the second integrated circuit that is substantially flexible, wherein both the silicon-based dielectric insulating layer and the silicon-based dielectric insulating portions of the vertical interconnects have a low stress of less than $5 \times 10^8$ dynes/cm$^2$ tensile, and wherein the at least one of the first integrated circuit and the second integrated circuit that is substantially flexible is so from the combination of the substantially flexible semiconductor substrate being substantially flexible from being thinned and having the polished or smoothed surface, and the silicon-based dielectric insulating layer having the low stress.

86. The apparatus of claim 43, wherein the at least one of the first integrated circuit and second integrated circuit that is substantially flexible comprises a low stress silicon-based dielectric layer with a stress of less than $5 \times 10^8$ dynes/cm$^2$ tensile on the polished or smoothed surface of the substantially flexible semiconductor substrate.

87. The apparatus of claim 43, wherein:
the substantially flexible semiconductor substrate is monocrystalline and made substantially flexible when it is thinned and polished or smoothed by first grinding away semiconductor wafer material thereof to leave an exposed surface thereof, and then polishing or smoothing the exposed surface;
the at least one of the first integrated circuit and the second integrated circuit that is substantially flexible comprises at least one low stress silicon-based dielectric layer having a low stress of less than $5 \times 10^8$ dynes/cm$^2$ tensile and is substantially flexible based at least on the combination of the low stress of the at least one low-stress silicon-based dielectric layer and the substantially flexible semiconductor substrate being substantially flexible; and
the at least one of the first integrated circuit and the second integrated circuit that is substantially flexible comprises a singulated die having a die area defined by its perimeter, wherein the substantially flexible semiconductor substrate extends in one piece across a substantial portion of the die area.

88. The apparatus of claim 64, wherein the mapping is reconfigured by at least one of replacing references to the corresponding ones of the gate lines for the defective ones of the memory cells with references to the corresponding ones of the gate lines for spare ones of the memory cells and replacing references to the defective ones of the gate lines with references to spare ones of the gates lines.

89. The apparatus of claim 87, wherein the substantially flexible semiconductor substrate is polished or smoothed to reduce vulnerability to fracture as a result of flexing.

90. An apparatus comprising:
a first integrated circuit;
a second integrated circuit stacked with the first integrated circuit;
wherein at least one of the first integrated circuit and the second integrated circuit is substantially flexible and comprises a substantially flexible semiconductor substrate of one piece made from a semiconductor wafer thinned by at least one of abrasion, etching and parting, and subsequently polished or smoothed after being thinned to form a polished or smoothed surface;
a bond layer joining the first and second integrated circuits and providing a primary means of means of attachment of the first and second integrated circuits; and
a plurality of vertical interconnects each of which extends through one of a plurality of holes in semiconductor material of the substantially flexible semiconductor substrate from a first surface of the substantially flexible semiconductor substrate to an opposite surface thereof and within the one of the plurality of holes comprises a conductive center portion and a silicon-based dielectric insulating portion surrounding the conductive center portion, wherein at least some of the vertical interconnects are closely arrayed.

91. The apparatus of claim 90, further comprising: a third integrated circuit stacked with the first and second integrated circuits; and a bond layer joining the second and third integrated circuits.

92. The apparatus of claim 91, wherein the vertical interconnects that are closely arrayed extend continuously between all of the first, second and third integrated circuits.

93. The apparatus of claim 92, wherein the vertical interconnects that are closely arrayed are formed at least in part by bonds of the bond layers.

94. The apparatus of claim 91, wherein at least one of the first, second and third integrated circuits have circuit devices formed at least primarily on a front surface thereof only, front surfaces of the first and second integrated circuits being bonded together, and a front surface of the third integrated circuit being bonded to a back surface of the second integrated circuit.

95. The apparatus of claim 94, wherein the circuit devices are formed from one of single crystal semiconductor material and polycrystalline semiconductor material.

96. The apparatus of claim 90, wherein the first integrated circuit and the second integrated circuit are each formed with one of single crystal semiconductor material and polycrystalline semiconductor material.

97. The apparatus of claim 90, wherein one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance.

98. The apparatus of claim 90, wherein at least one of the first and second integrated circuits comprises a microprocessor.

99. The apparatus of claim 90, wherein the first integrated circuit comprises a memory integrated circuit and the second integrated circuit comprises a logic integrated circuit, wherein the logic integrated circuit performs testing of the memory integrated circuit via the vertical interconnects that are closely arrayed.

100. The apparatus of claim 90, wherein the first integrated circuit comprises a memory integrated circuit having multiple memory locations, wherein data from a spare one of the memory locations is used instead of data from a defective one of the memory locations.

101. The apparatus of claim 90, wherein the first integrated circuit comprises a memory integrated circuit and the second integrated circuit comprises a logic integrated circuit, wherein the logic integrated circuit performs programmable gate line address assignment with respect to the memory integrated circuit.

102. The apparatus of claim 90, wherein the vertical interconnects that are closely arrayed traverse the at least one of the first and second integrated circuits that is substantially flexible.

103. The apparatus of claim 90, wherein the vertical interconnects that are closely arrayed connect circuitry of the first and second integrated circuits.

104. The apparatus of claim 103, wherein information processing is performed by the circuitry of one of the first and second integrated circuits on data routed between the circuitry of the first and second integrated circuits via the vertical interconnects that are closely arrayed.

105. The apparatus of claim 90, wherein at least one of the first and second integrated circuits has reconfiguration circuitry.

106. The apparatus of claim 90, wherein at least one of the first and second integrated circuits comprises logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing.

107. The apparatus of claim 90, wherein:
the first integrated circuit comprises a memory array having a plurality of memory cells, a plurality of data lines, and a plurality of gate lines, each memory cell storing a data value and comprising circuitry for coupling that data value to a corresponding one of said data lines in response to a gate control signal on a corresponding one of said gate lines;
the second integrated circuit comprises circuitry for generating gate control signals in response to addresses based on a mapping of addresses to gate lines; and
the second integrated circuit comprises circuitry for determining at least one of whether there are defective ones of said memory cells and whether there are defective ones of the gate lines and for reconfiguring said mapping for at least one of eliminating references to the corresponding ones of the gate lines for said defective ones of said memory cells and eliminating references to the defective ones of the gate lines.

108. The apparatus of claim 90, further comprising:
one or more controller integrated circuits including the first integrated circuit;
one or more memory integrated circuits including the second integrated circuit;
a plurality of data lines and a plurality of gate lines on each memory integrated circuit;
an array of memory cells on each memory integrated circuit, each memory cell storing a data value and comprising circuitry for coupling that data value to a corresponding one of said data lines in response to selection of a corresponding one of said gate lines;
gate line selection logic on at least one of the one or more controller integrated circuits for selecting gate lines for memory operations, said gate line selection logic comprising programmable gates to receive programmed address assignments for said gate lines, each programmed address assignment for determining which of said gate lines is to be selected; and
test logic on at least one of the one or more controller integrated circuits for determining at least one of whether there are defective ones of said array memory cells and whether there are defective ones of the gate lines and for reconfiguring the programmed address assignments for at least one of eliminating references to the corresponding ones of the gate lines for the defective ones of the memory cells and eliminating references to the defective ones of the gate lines.

109. The apparatus of claim 108, wherein said test logic is configured to test periodically to determine at least one of whether there are defective ones of said memory cells and whether there are defective ones of the gate lines.

110. The apparatus of claim 108, wherein at least one of the one or more controller integrated circuits further comprises programmable logic to prevent the use of data values from the corresponding ones of the data lines for the defective ones of the memory cells.

111. The apparatus of claim 108, wherein said memory cells are arranged within physical space in a physical order and are arranged within an address space in a logical order, wherein said physical order of at least one memory cell is different than the logical order of the at least one memory cell.

112. The apparatus of claim 109, wherein external testing of the test logic together with the testing by the test logic achieves a functional testing of at least one of a preponderance of the memory cells and a preponderance of the gate lines.

113. The apparatus of claim 109, wherein the testing by the test logic substantially reduces or eliminates the need for external testing.

114. The apparatus of claim 108, wherein reconfiguring the programmed address assignments comprises at least one of replacing references to the corresponding ones of the gate lines for the defective ones of the memory cells with references to the corresponding ones of the gate lines for spare ones of the memory cells and replacing references to the defective ones of the gate lines with references to spare ones of the gate lines.

115. The apparatus of claim 90, wherein the first integrated circuit is fabricated using one process technology, and the second integrated circuit is fabricated using a different process technology.

116. The apparatus of claim 90, wherein at least one of the first and second integrated circuits has a thickness of at least one of 10 microns or less and 50 microns or less.

117. The apparatus of claim 90, wherein the substantially flexible semiconductor substrate is a monocrystalline semiconductor substrate.

118. The apparatus of claim 90, wherein a back surface of the substantially flexible semiconductor substrate is the polished or smoothed surface.

119. The apparatus of claim 90, wherein at least one of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects including a bond of the bond layer, connecting circuitry of the first integrated circuit and circuitry of the second integrated circuit; wherein the at least one of the first and second integrated circuits that is substantially flexible comprises a silicon-based dielectric layer with a stress of less than $5 \times 10^8$ dynes/cm$^2$ tensile; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations.

120. The apparatus of claim 90, wherein at least two of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects including a bond of the bond layer, connecting circuitry of the first integrated circuit and circuitry of the second integrated circuit; wherein the at least one of the first and second integrated circuits that is substantially flexible comprises a silicon-based dielectric layer with a stress of less than $5 \times 10^8$ dynes/cm$^2$ tensile; wherein the first integrated circuit and the second integrated circuit form at least part of a stacked circuit integrated memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the integrated circuit layers comprises a front surface and a back surface opposite the front surface, further comprising a tensile low stress silicon-based dielectric with a stress of less than $5 \times 10^8$ dynes/cm$^2$ tensile on the back surface.

121. The apparatus of claim 90, wherein at least three of the following: the insulating portion surrounding the conductive center portion of said vertical interconnects comprises a silicon-based dielectric material having a stress of less than $5 \times 10^8$ dynes/cm$^2$ tensile; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects including a bond of the bond layer, connecting circuitry of the first integrated circuit and circuitry of the second integrated circuit; wherein the at least one of the first and second integrated circuits that is substantially flexible comprises a silicon-based dielectric layer with a stress of less than $5 \times 10^8$ dynes/cm$^2$ tensile; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations.

122. The apparatus of claim 90, wherein the vertical interconnects are formed at least in part by bonds of the bond layer and connect circuitry of the first and second integrated circuits.

123. The apparatus of claim 90, wherein the at least one of the first integrated circuit and the second integrated circuit that is substantially flexible further comprises a silicon-based dielectric layer on the substantially flexible semiconductor substrate with a tensile stress of less than $5 \times 10^8$ dynes/cm$^2$.

124. The apparatus of claim 123, wherein the low stress silicon-based dielectric layer is at least one of a silicon dioxide dielectric and an oxide of silicon dielectric.

125. The apparatus of claim 93, wherein the bond layers comprise thermal diffusion bond layers.

126. The apparatus of claim 90, wherein the bond layer comprises a thermal diffusion bond layer.

127. The apparatus of claim 90, wherein the first integrated circuit and the second integrated circuit form at least part of a stacked integrated circuit memory, wherein at least a portion of the stacked integrated circuit memory is partitioned into a plurality of block stacks, each block stack comprising circuit blocks that are on different ones of the first and second integrated circuits and are vertically interconnected by a corresponding array of the vertical interconnects for the block stack, wherein the block stacks are configured to perform memory operations independently of each other.

128. The apparatus of claim 127, wherein the corresponding arrays of the vertical interconnects for the block stacks transfer data independently of each other during the memory operations performed independently by the block stacks.

129. The apparatus of claim 90, further comprising a silicon-based dielectric insulating layer formed on the at least one of the first integrated circuit and the second integrated circuit that is substantially flexible, wherein both the silicon-based dielectric insulating layer and the silicon-based dielectric insulating portions of the vertical interconnects have a low stress of less than $5 \times 10^8$ dynes/cm$^2$ tensile, and wherein the at least one of the first integrated circuit and the second integrated circuit that is substantially flexible is so from the combination of the substantially flexible semiconductor substrate being substantially flexible from being thinned and having the polished or smoothed surface, and the silicon-based dielectric insulating layer having the low stress.

130. The apparatus of claim 90, wherein the at least one of the first integrated circuit and second integrated circuit that is substantially flexible comprises a low stress silicon-based dielectric layer with a stress of less than $5 \times 10^8$ dynes/cm$^2$ tensile on the polished or smoothed surface of the substantially flexible semiconductor substrate.

131. The apparatus of claim 90, wherein:
the substantially flexible semiconductor substrate is monocrystalline and made substantially flexible when it is thinned and polished or smoothed by first grinding away semiconductor wafer material thereof to leave an exposed surface thereof, and then polishing or smoothing the exposed surface;
the at least one of the first integrated circuit and the second integrated circuit that is substantially flexible comprises at least one low stress silicon-based dielectric layer having a low stress of less than $5 \times 10^8$ dynes/cm$^2$ tensile and is substantially flexible based at least on the combination of the low stress of the at least one low-stress silicon-based dielectric layer and the substantially flexible semiconductor substrate being substantially flexible; and
the at least one of the first integrated circuit and the second integrated circuit that is substantially flexible has edges that define its size in area, wherein the substantially flexible semiconductor substrate extends in one piece across a substantial portion of the area between the edges.

132. The apparatus of claim 107, wherein the mapping is reconfigured by at least one of replacing references to the corresponding ones of the gate lines for the defective ones of the memory cells with references to the corresponding ones of the gate lines for spare ones of the memory cells and replacing references to the defective ones of the gate lines with references to spare ones of the gates lines.

133. The apparatus of claim 131, wherein the substantially flexible semiconductor substrate is polished or smoothed to reduce vulnerability to fracture as a result of flexing.

134. An information processing integrated circuit comprising:
a plurality of integrated circuit layers in a stacked relationship, wherein at least one of the integrated circuit layers is substantially flexible and comprises a silicon-based dielectric layer having a stress of less than $5 \times 10^8$ dynes/cm$^2$ tensile and a substantially flexible monocrystalline semiconductor substrate of one piece that is made from a semiconductor wafer, thinned by at least one of abrasion, etching and parting, and subsequently polished or smoothed after being thinned to form a polished or smoothed surface; and
a plurality of vertical interconnects interior to overlying portions of the integrated circuit layers for the transfer of data between at least two of the integrated circuit layers, each vertical interconnect extending through one of a plurality of holes in semiconductor material of the substantially flexible monocrystalline semiconductor substrate from a first surface of the substantially flexible monocrystalline semiconductor substrate to an opposite surface thereof and comprises within the one of the plurality of holes a conductive center portion and a silicon-based dielectric insulating portion surrounding the conductive center portion and having a stress of less than $5 \times 10^8$ dynes/cm$^2$ tensile.

135. The information processing integrated circuit of claim 134, wherein the integrated circuit layers are each formed with one of single crystal semiconductor material and polycrystalline semiconductor material.

136. The information processing integrated circuit of claim 134, wherein one of the integrated circuit layers is formed using a different process technology than another of the integrated circuit layers, the different process technology being selected from a group consisting of DRAM, SRAM, FLASH, EPROM, EEPROM, Ferroelectric and Giant Magneto Resistance.

137. The information processing integrated circuit of claim 134, wherein at least one of the integrated circuit layers comprises a microprocessor.

138. The information processing integrated circuit of claim 134, wherein a first one of the integrated circuit layers comprises a memory layer and a second one of the integrated circuit layers comprises a logic layer, wherein the logic layer performs testing of the memory layer via the vertical interconnects.

139. The information processing integrated circuit of claim 134, wherein at least one of the integrated circuit layers comprises a memory layer having multiple memory locations, wherein data from a spare one of the memory locations is used instead of data from a defective one of the memory locations.

140. The information processing integrated circuit of claim 134, wherein the integrated circuit layers comprise at least one memory layer and at least one logic layer, wherein the at least one logic layer performs programmable gate line address assignment with respect to the at least one memory layer.

141. The information processing integrated circuit of claim 134, wherein the vertical interconnects traverse the at least one of the integrated circuit layers that is substantially flexible.

142. The information processing integrated circuit of claim 134, wherein the vertical interconnects connect circuitry of the integrated circuit layers.

143. The information processing integrated circuit of claim 142, wherein information processing is performed by the circuitry of a first one of the integrated circuit layers on data routed between the circuitry of a second one integrated circuit layers via the vertical interconnects.

144. The information processing integrated circuit of claim 134, wherein at least one of the integrated circuit layers has reconfiguration circuitry.

145. The information processing integrated circuit of claim 134, wherein the integrated circuit layers comprise at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing.

146. The information processing integrated circuit of claim 134, wherein:
- a first one of the integrated circuit layers comprises a memory array having a plurality of memory cells, a plurality of data lines, and a plurality of gate lines, each memory cell storing a data value and comprising circuitry for coupling that data value to one of said data lines in response to a gate control signal on one of said gate lines;
- a second one of the integrated circuit layers comprises circuitry for generating a gate control signal in response to an address, including means for mapping addresses to gate lines; and
- the second one of the integrated circuit layers comprises circuitry for at least one of determining whether there are defective ones of said memory cells and reconfiguring said mapping to eliminate references to the corresponding ones of the gate lines for said defective ones of said memory cells and determining whether there are defective ones of the gate lines and reconfiguring the mapping to eliminate references to the defective ones of the gate lines.

147. The information processing integrated circuit of claim 134, wherein:
- the integrated circuit layers comprise one or more controller layers and one or more memory layers;
- the one or more memory layers comprise a plurality of data lines, a plurality of gate lines, and an array of memory cells on each memory layer, each memory cell storing a data value and comprising circuitry for coupling that data value to a corresponding one of said data lines in response to selection of a corresponding one of said gate lines;
- the one or more controller layers comprise gate line selection logic for selecting gate lines for memory operations, said gate line selection logic comprising programmable gates to receive programmed address assignments for said gate lines, each programmed address assignment for determining which of said gate lines is to be selected; and
- the one or more controller layers comprise test logic for at least one of determining whether there are defective ones of said memory cells and reconfiguring the programmed address assignments to eliminate references to the corresponding ones of the gate lines for the defective ones of the memory cells and determining whether there are defective ones of the gate lines and reconfiguring the programmed address assignments to eliminate references to the defective ones of the gate lines.

148. The information processing integrated circuit of claim 147, wherein said test logic tests periodically to determine at least one of whether there are defective ones of said memory cells and whether there are defective ones of the gate lines.

149. The information processing integrated circuit of claim 147, wherein the one or more controller layers comprise programmable logic to prevent the use of data values from the corresponding ones of the data lines for the defective ones of the memory cells.

150. The information processing integrated circuit of claim 147, wherein said memory cells are arranged within physical space in a physical order and are arranged within an address space in a logical order, wherein said physical order of at least one memory cell is different than the logical order of the at least one memory cell.

151. The information processing integrated circuit of claim 148, wherein external testing of the test logic together with the testing by the test logic achieves a functional testing of at least one of a preponderance of the memory cells and a preponderance of the gate lines.

152. The information processing integrated circuit of claim 148, wherein the testing by the test logic substantially reduces or eliminates the need for external testing.

153. The information processing integrated circuit of claim 147, wherein reconfiguring the programmed address assignments comprises at least one of replacing references to the corresponding ones of the gate lines for the defective ones of the memory cells with references to the corresponding ones of the gate lines for spare ones of the memory cells and replacing references to the defective ones of the gate lines with references to spare ones of the gate lines.

154. The information processing integrated circuit of claim 134, wherein a first one of the integrated circuit layers is fabricated using one process technology, and a second one of the integrated circuit layers is fabricated using a different process technology.

155. The information processing integrated circuit of claim 134, wherein at least one of the integrated circuit layers has a thickness of at least one of 10 microns or less and 50 microns or less.

156. The information processing integrated circuit of claim 134, wherein the silicon-based dielectric layer is at least one of a silicon dioxide dielectric and an oxide of silicon dielectric.

157. The information processing integrated circuit of claim 134, wherein a back surface of the substantially flexible monocrystalline semiconductor substrate is the polished or smoothed surface.

158. The information processing integrated circuit of claim 134, wherein at least one of the following: the insulating portion surrounding the conductive center portion of said vertical interconnects comprises a silicon-based dielectric material having a stress of less than $5 \times 10^8$ dynes/cm$^2$ tensile; one of the integrated circuits layers is formed using a different process technology than another of the integrated circuit layers, the different process technology being selected from a group consisting of DRAM, SRAM, FLASH, EPROM, EEPROM, Ferroelectric and Giant Magneto Resistance; at least one of the integrated circuit layers comprises a microprocessor; the integrated circuit layers comprise at least one memory integrated circuit layer and at least one logic integrated circuit layer, wherein the at least one logic integrated circuit layer performs testing of the at least one memory integrated circuit layer; a plurality of interior vertical interconnects traverse at least one of the integrated circuit layers; continuous vertical interconnects connect circuitry of the integrated circuit layers; information processing is performed on data routed between circuitry on the integrated circuit layers; at least one integrated circuit layer has reconfiguration circuitry; at least one of the plurality of vertical interconnects includes a thermal diffusion bond, connecting circuitry of the integrated circuit layers; wherein the at least one of the integrated circuit layers that is substantially flexible comprises a silicon-based dielectric layer with a stress of less than $5\times10^8$ dynes/cm$^2$ tensile; wherein the integrated circuit layers form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations.

159. The information processing integrated circuit of claim 134, wherein at least two of the following: the insulating portion surrounding the conductive center portion of said vertical interconnects comprises a silicon-based dielectric material having a stress of less than $5\times10^8$ dynes/cm$^2$ tensile; one of the integrated circuit layers is formed using a different process technology than another of the integrated circuit layers, the different process technology being selected from a group consisting of DRAM, SRAM, FLASH, EPROM, EEPROM, Ferroelectric and Giant Magneto Resistance; at least one of the integrated circuit layers comprises a microprocessor; the integrated circuit layers comprise at least one memory integrated circuit layer and at least one logic integrated circuit layer, wherein the at least one logic integrated circuit layer performs testing of the at least one memory integrated circuit layer; a plurality of interior vertical interconnects traverse at least one of the integrated circuit layers; continuous vertical interconnects connect circuitry of the integrated circuit layers; information processing is performed on data routed between circuitry on the integrated circuit layers; at least one integrated circuit layer has reconfiguration circuitry; at least one of the plurality of vertical interconnects includes a thermal diffusion bond, connecting circuitry of the integrated circuit layers; wherein the at least one of the integrated circuit layers that is substantially flexible comprises a silicon-based dielectric layer with a stress of less than $5\times10^8$ dynes/cm$^2$ tensile; wherein the integrated circuit layers form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the integrated circuit layers comprises a front surface and a back surface opposite the front surface, further comprising a tensile low stress silicon-based dielectric with a stress of less than $5\times10^8$ dynes/cm$^2$ tensile on the back surface.

160. The information processing integrated circuit of claim 134, wherein at least three of the following: the insulating portion surrounding the conductive center portion of said vertical interconnects comprises a silicon-based dielectric material having a stress of less than $5\times10^8$ dynes/cm$^2$ tensile; one of the integrated circuits layers is formed using a different process technology than another of the integrated circuit layers, the different process technology being selected from a group consisting of DRAM, SRAM, FLASH, EPROM, EEPROM, Ferroelectric and Giant Magneto Resistance; at least one of the integrated circuit layers comprises a microprocessor; the integrated circuit layers comprise at least one memory integrated circuit layer and at least one logic integrated circuit layer, wherein the at least one logic integrated circuit layer performs testing of the at least one memory integrated circuit layer; a plurality of interior vertical interconnects traverse at least one of the integrated circuit layers; continuous vertical interconnects connect circuitry of the integrated circuit layers; information processing is performed on data routed between circuitry on integrated circuit layers; at least one integrated circuit layer has reconfiguration circuitry; at least one of the plurality of vertical interconnects includes a thermal diffusion bond, connecting circuitry of the integrated circuit layers; wherein the at least one of the integrated circuit layers that is substantially flexible comprises a silicon-based dielectric layer with a stress of less than $5\times10^8$ dynes/cm$^2$ tensile; wherein the first integrated circuit layer and the second integrated circuit layer form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations.

161. The information processing integrated circuit of claim 134, wherein the integrated circuit layers are bonded together by thermal diffusion bond layers.

162. The information processing integrated circuit of claim 161, wherein the vertical interconnects are formed at least in part by bonds of the thermal diffusion bond layers and connect circuitry of the integrated circuit layers.

163. The apparatus of claim 1, wherein the at least one of the first integrated circuit and the second integrated circuit that is substantially flexible further comprises a silicon-based dielectric layer on the substantially flexible semiconductor substrate with a tensile stress of less than $5\times10^8$ dynes/cm$^2$.

164. The apparatus of claim 163, wherein the low stress silicon-based dielectric layer is at least one of a silicon dioxide dielectric and an oxide of silicon dielectric.

165. The information processing integrated circuit of claim 134, further comprising thermal diffusion bond layers physically joining the integrated circuit layers and providing a primary means of attachment of the integrated circuits layers.

166. The information processing integrated circuit of claim 134, wherein the integrated circuit layers form at least part of a stacked integrated circuit memory, wherein at least a portion of the stacked integrated circuit memory is partitioned into a plurality of block stacks, each block stack comprising circuit blocks that are on different ones of the integrated circuit layers and are vertically interconnected by a corresponding array of the vertical interconnects for the block stack, wherein the block stacks are configured to perform memory operations independently of each other.

167. The information processing integrated circuit of claim 166, wherein the corresponding arrays of the vertical interconnects for the block stacks transfer data independently of each other during the memory operations performed independently by the block stacks.

168. The information processing integrated circuit of claim 134, wherein the at least one of the integrated circuit layers that is substantially flexible is so from the combination of the substantially flexible monocrystalline semiconductor substrate being substantially flexible from being thinned and having the polished or smoothed surface, and the silicon-based dielectric insulating layer having a low stress of less than $5\times10^8$ dynes/cm$^2$ tensile.

169. The information processing integrated circuit of claim 134, wherein the at least one of the integrated circuit layers that is substantially flexible further comprises a low stress silicon-based dielectric layer with a stress of less than $5\times10^8$ dynes/cm$^2$ tensile on the polished or smoothed surface of the substantially flexible monocrystalline semiconductor substrate.

170. The information processing integrated circuit of claim 134, wherein:
the substantially flexible monocrystalline semiconductor substrate is made substantially flexible when it is thinned and polished or smoothed by first grinding away semiconductor wafer material thereof to leave an exposed surface thereof, and then polishing or smoothing the exposed surface;

the at least one of the integrated circuit layers that is substantially flexible is substantially flexible based at least on the combination of the low stress of the at least one low-stress silicon-based dielectric layer being less than $5 \times 10^8$ dynes/cm$^2$ tensile and the substantially flexible monocrystalline semiconductor substrate being substantially flexible; and the at least one of the integrated circuit layers that is substantially flexible comprises a singulated die having a die area defined by its perimeter, wherein the substantially flexible monocrystalline semiconductor substrate extends in one piece across a substantial portion of the die area.

171. The apparatus of claim 146, wherein the mapping is reconfigured by at least one of replacing references to the corresponding ones of the gate lines for the defective ones of the memory cells with references to the corresponding ones of the gate lines for spare ones of the memory cells and replacing references to the defective ones of the gate lines with references to spare ones of the gates lines.

172. The information processing integrated circuit of claim 170, wherein the substantially flexible monocrystalline semiconductor substrate is polished or smoothed to reduce vulnerability to fracture as a result of flexing.

173. An integrated circuit structure comprising:
a plurality of substrates in a stacked relationship;
wherein at least one of the plurality of substrates is substantially flexible and comprises: a silicon-based dielectric layer with a low stress of less than $5 \times 10^8$ dynes/cm$^2$ tensile; a monocrystalline semiconductor substrate; a plurality of vertical interconnects that each comprise a vertical through-substrate conductor that extends through a hole in the monocrystalline semiconductor substrate and a vertical silicon-based dielectric insulator extending through the hole, insulating the vertical through-substrate conductor from the monocrystalline semiconductor substrate, and having a stress of less than $5 \times 10^8$ dynes/cm$^2$ tensile.

174. The integrated circuit structure of claim 173, wherein the monocrystalline semiconductor substrate is substantially flexible.

175. The integrated circuit structure of claim 173, wherein the plurality of substrates comprise at least first and second integrated circuit layers, and wherein at least two of: the first integrated circuit layer and the second integrated circuit layer are formed with one of single crystal semiconductor material and polycrystalline semiconductor material; one of the first and second integrated circuit layers is formed using a different process technology than another of the first and second integrated circuit layers, the different process technology being selected from a group consisting of DRAM, SRAM, FLASH, EPROM, EEPROM, Ferroelectric and Giant Magneto Resistance; at least one of the first and second integrated circuit layers comprises a microprocessor; information processing is performed on data routed between circuitry on the first and second integrated circuit layers; the stacked integrated circuit further comprises at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing; at least one of the integrated circuit layers has a thickness of at least one of 10 microns or less and 50 microns or less; at least one of the integrated circuit layers is formed with a low stress silicon-based dielectric, wherein the low stress silicon-based dielectric is at least one of a silicon dioxide dielectric and an oxide of silicon dielectric and is caused to have a stress of less than $5 \times 10^8$ dynes/cm$^2$ tensile; a back surface of the first integrated circuit layer is polished or smoothed; wherein the first integrated circuit layer and the second integrated circuit layer form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the substrates comprises a front surface and a back surface opposite the front surface, further comprising a tensile low stress silicon-based dielectric with a stress of less than $5 \times 10^8$ dynes/cm$^2$ tensile on the back surface.

176. The integrated circuit structure of claim 174, wherein the at least one of the plurality of substrates that is substantially flexible is so from the combination of the monocrystalline semiconductor substrate being substantially flexible having the low stress.

177. The integrated circuit structure of claim 173, wherein the silicon-based dielectric layer is on a back surface of the monocrystalline semiconductor substrate.

178. The integrated circuit structure of claim 173, wherein:
the monocrystalline semiconductor substrate is made substantially flexible when it is thinned and polished or smoothed by first grinding away semiconductor wafer material thereof to leave an exposed surface thereof, and then polishing or smoothing the exposed surface;
the at least one of the plurality of substrates that is substantially flexible is substantially flexible based at least on the combination of the low stress of the at least one low-stress silicon-based dielectric layer and the monocrystalline semiconductor substrate being substantially flexible; and
the at least one of the plurality of substrates that is substantially flexible has edges that define its size in area, wherein the monocrystalline semiconductor substrate extends in one piece across a substantial portion of the area between the edges.

179. The integrated circuit structure of claim 178, wherein the monocrystalline semiconductor substrate is polished or smoothed to reduce vulnerability to fracture as a result of flexing.

180. A stacked integrated circuit, comprising:
a first integrated circuit layer comprising a semiconductor substrate formed from a semiconductor wafer or portion thereof;
a second integrated circuit layer comprising a semiconductor substrate formed from a semiconductor wafer or portion thereof and stacked together with the first integrated circuit layer;
wherein at least one of the first integrated circuit layer and the second integrated circuit layer is substantially flexible and its semiconductor substrate is a substantially flexible semiconductor substrate of one piece made from a semiconductor wafer or portion thereof, thinned by at least one of abrasion, etching and parting, and subsequently polished or smoothed after being thinned to form a polished or smoothed surface; and
a plurality of vertical interconnects that each extend through a hole in semiconductor material and pass vertically through the substantially flexible semiconductor substrate and interconnect integrated circuitry of the first integrated circuit layer and integrated circuitry of the second integrated circuit layer.

181. The stacked integrated circuit of claim 180, wherein at least two of: the first integrated circuit layer and the second integrated circuit layer are formed with one of single crystal semiconductor material and polycrystalline semiconductor material; one of the first and second integrated circuit layers is formed using a different process technology than another of the first and second integrated circuit layers, the different process technology being selected from a group consisting of DRAM, SRAM, FLASH, EPROM, EEPROM, Ferroelectric and Giant Magneto Resistance; at least one of the first and second integrated circuit layers comprises a microprocessor; information processing is performed on data routed between circuitry on the first and second integrated circuit layers; the stacked integrated circuit further comprises at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing; at least one of the integrated circuit layers has a thickness of at least one of 10 microns or less and 50 microns or less; at least one of the integrated circuit layers is formed with a low stress silicon-based dielectric, wherein the low stress silicon-based dielectric is at least one of a silicon dioxide dielectric and an oxide of silicon dielectric and is caused to have a stress of less than $5 \times 10^8$ dynes/cm$^2$ tensile; a back surface of the first integrated circuit layer is polished or smoothed; wherein the first integrated circuit layer and the second integrated circuit layer form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the integrated circuit layers comprises a front surface and a back surface opposite the front surface, further comprising a tensile low stress silicon-based dielectric with a stress of less than $5 \times 10^8$ dynes/cm$^2$ tensile on the back surface.

182. The stacked integrated circuit of claim 180, further comprising a silicon-based dielectric insulating layer formed on the at least one of the first integrated circuit layer and the second integrated circuit layer that is substantially flexible, wherein each vertical interconnect comprises within the hole of the substantially flexible semiconductor substrate a conductive center portion and a silicon-based dielectric insulating portion surrounding the conductive center portion, wherein both the silicon-based dielectric insulating layer and the silicon-based dielectric insulating portion of each vertical interconnect have a low stress of less than $5 \times 10^8$ dynes/cm$^2$ tensile, and wherein the at least one of the first circuit layer and the second circuit layer that is substantially flexible is so from the combination of the substantially flexible semiconductor substrate being substantially flexible from being thinned and having the polished or smoothed surface, and the silicon-based dielectric insulating layer having the low stress.

183. The stacked integrated circuit of claim 180, wherein the substantially flexible semiconductor substrate is monocrystalline and the at least one of the first integrated circuit layer and the second integrated circuit layer that is flexible comprises a low stress silicon-based dielectric layer with a stress of less than $5 \times 10^8$ dynes/cm$^2$ tensile on the polished or smoothed surface of the substantially flexible semiconductor substrate.

184. The stacked integrated circuit of claim 180, wherein:
the substantially flexible semiconductor substrate is monocrystalline and made substantially flexible when it is thinned and polished or smoothed by first grinding away semiconductor wafer material thereof to leave an exposed surface thereof, and then polishing or smoothing the exposed surface;
the at least one of the first integrated circuit layer and the second integrated circuit layer that is substantially flexible comprises at least one low stress silicon-based dielectric layer and is substantially flexible based at least on the combination of the low stress of the at least one low-stress silicon-based dielectric layer and the substantially flexible semiconductor substrate being substantially flexible; and
the at least one of the first integrated circuit layer and the second integrated circuit layer that is substantially flexible has edges that define its size in area, wherein the substantially flexible semiconductor substrate extends in one piece across a substantial portion of the area between the edges.

185. The stacked integrated circuit of claim 184, wherein the substantially flexible semiconductor substrate is polished or smoothed to reduce vulnerability to fracture as a result of flexing.

186. A stacked integrated circuit, comprising:
a first integrated circuit layer comprising a semiconductor substrate formed from a semiconductor wafer or portion thereof and integrated circuitry formed on the semiconductor substrate of the first circuit layer;
a second integrated circuit layer comprising a semiconductor substrate formed from a semiconductor wafer or portion thereof and integrated circuitry formed on the semiconductor substrate of the second circuit layer, the second circuit layer stacked together with the first circuit layer in contact therewith;
wherein at least one of the first integrated circuit layer and the second integrated circuit layer is substantially flexible and its semiconductor substrate is a substantially flexible monocrystalline semiconductor substrate of one piece made from a semiconductor wafer or portion thereof, thinned by at least one of abrasion, etching and parting, and subsequently polished or smoothed after being thinned to form a polished or smoothed surface; and
a plurality of vertical interconnects that each extend through a hole in semiconductor material and pass vertically through the substantially flexible monocrystalline semiconductor substrate and interconnect the integrated circuitry of the first integrated circuit layer and the integrated circuitry of the second integrated circuit layer;
wherein the first integrated circuit layer and the second integrated circuit layer are joined together using metal-to-metal bonding as a primary means of attachment.

187. The stacked integrated circuit of claim 186, wherein at least two of: the first integrated circuit layer and the second integrated circuit layer are formed with one of single crystal semiconductor material and polycrystalline semiconductor material; one of the first and second integrated circuit layers is formed using a different process technology than another of the first and second integrated circuit layers, the different process technology being selected from a group consisting of DRAM, SRAM, FLASH, EPROM, EEPROM, Ferroelectric and Giant Magneto Resistance; at least one of the first and second integrated circuit layers comprises a microprocessor; information processing is performed on data routed between circuitry on the first and second integrated circuit layers; the stacked integrated circuit further comprises at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing; at least one of the integrated circuit layers has a thickness of at least one of 10 microns or less and 50 microns or less; at least one of the integrated circuit layers is formed with a low stress silicon-based dielectric, wherein the low stress silicon-based dielectric is at least one of a silicon dioxide dielectric and an oxide of silicon dielectric and is caused to have a stress of less than $5 \times 10^8$ dynes/cm$^2$ tensile; a back surface of the first integrated circuit layer is polished or smoothed; wherein the first integrated circuit layer and the second integrated circuit layer form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the integrated circuit layers comprises a front surface and a back surface opposite the front surface, further comprising a tensile low stress silicon-based dielectric with a stress of less than $5 \times 10^8$ dynes/cm$^2$ tensile on the back surface.

188. The stacked integrated circuit of claim 186, wherein the first integrated circuit layer and the second integrated circuit layer form at least part of a stacked integrated circuit memory, wherein at least a portion of the stacked integrated circuit memory is partitioned into a plurality of block stacks, each block stack comprising circuit blocks that are on different ones of the first and second integrated circuit layers and are vertically interconnected by a corresponding array of the vertical interconnects for the block stack, wherein the block stacks are configured to perform memory operations independently of each other.

189. The stacked integrated circuit of claim 188, wherein the corresponding arrays of the vertical interconnects for the block stacks transfer data independently of each other during the memory operations performed independently by the block stacks.

190. The stacked integrated circuit of claim 186, further comprising a silicon-based dielectric insulating layer formed on the at least one of the first integrated circuit layer and the second integrated circuit layer that is substantially flexible, wherein each vertical interconnect comprises within the hole of the substantially flexible monocrystalline semiconductor substrate a conductive center portion and a silicon-based dielectric insulating portion surrounding the conductive center portion, wherein both the silicon-based dielectric insulating layer and the silicon-based dielectric insulating portion of each vertical interconnect have a low stress of less than $5 \times 10^8$ dynes/cm$^2$ tensile, and wherein the at least one of the first integrated circuit layer and the second integrated circuit layer that is substantially flexible is so from the combination of the substantially flexible monocrystalline semiconductor substrate being substantially flexible from being thinned and having the polished or smoothed surface, and the silicon-based dielectric insulating layer having the low stress.

191. The stacked integrated circuit of claim 186, wherein the at least one of the first integrated circuit layer and the second integrated circuit layer that is flexible comprises a low stress silicon-based dielectric layer with a stress of less than $5 \times 10^8$ dynes/cm$^2$ tensile on the polished or smoothed surface of the substantially flexible monocrystalline semiconductor substrate.

192. The stacked integrated circuit of claim 186, wherein:
the substantially flexible monocrystalline semiconductor substrate is made substantially flexible when it is thinned and polished or smoothed by first grinding away semiconductor wafer material of the semiconductor substrate to leave an exposed surface thereof, and then polishing or smoothing the exposed surface;
the at least one of the first integrated circuit layer and the second integrated circuit layer that is substantially flexible comprises at least one low stress silicon-based dielectric layers and is substantially flexible based at least on the combination of the low stress of the at least one low-stress silicon-based dielectric layers and the substantially flexible monocrystalline semiconductor substrate being substantially flexible; and
the at least one of the first integrated circuit layer and second circuit layer that is substantially flexible comprises a singulated die having a die area defined by its perimeter, wherein the substantially flexible monocrystalline semiconductor substrate extends in one piece across a substantial portion of the die area.

193. The stacked integrated circuit of claim 192, wherein the substantially flexible monocrystalline semiconductor substrate is polished or smoothed to reduce vulnerability to fracture as a result of flexing.

194. The stacked integrated circuit of one of claims 180 and 186, wherein:
the first integrated circuit layer comprises a control circuit layer and the second integrated circuit layer comprises a memory circuit layer;
the control circuit layer comprises reconfiguration logic for performing reconfiguration of the memory circuit layer after manufacture of the apparatus has been completed and during a useful life of the apparatus;
the control circuit layer comprises memory test logic for performing functional testing of the memory circuit layer via at least some of the vertical interconnects;
the control circuit layer comprises memory error correction logic for performing error correction of data read from the memory circuit layer via at least some of the vertical interconnects; and,
the memory circuit layer comprises an array of memory cells including spare or redundant cells for replacement of defective cells of the memory cells; and,
the vertical interconnects include spare or redundant interconnects for replacement of defective interconnects of the vertical interconnects.

195. The stacked integrated circuit of claim 194, wherein the control circuit layer comprises refresh logic for performing refresh of at least some of the memory cells of the memory circuit layer via at least some of the vertical interconnects.

196. The stacked integrated circuit of one of claim 194, wherein a process technology used to make the control circuit layer is different from a process technology used to make the memory circuit layer.

197. The stacked integrated circuit of one of claims 180 and 186, further comprising:
a plurality of memory circuit layers stacked with the first integrated circuit layer and including the second integrated circuit layer;
wherein the first integrated circuit layer comprises a control circuit layer; and
wherein the control circuit layer and the memory circuit layers form a stacked integrated circuit memory, the stacked integrated circuit memory is partitioned into a plurality of block stacks, each block stack comprises circuit blocks that are on different ones of the control circuit layer and the memory circuit layers and an array of the vertical interconnects that vertically interconnect the circuit blocks of the block stack, and the block stacks are configured to perform memory operations independently of each other.

198. The stacked integrated circuit of claim 197, wherein: the array of the vertical interconnects of each block stack pass through at least one of the control circuit layer and the memory circuit layers;
the arrays of the vertical interconnects of the block stacks transfer data independently of each other during the memory operations performed independently by the block stacks.

199. The stacked integrated circuit of claim 197, wherein each block stack comprises a controller circuit block on the control circuit layer and memory circuit blocks on the memory circuit layers, the controller circuit block of each block stack performs error correction on read data from the memory circuit blocks of the block stack, the read data in each block stack is transferred through the array of the vertical interconnects of the block stack, and the read data in each block stack includes ECC data used by the controller circuit block of the block stack to perform error correction on the read data.

200. The stacked integrated circuit of claim 197, wherein each block stack comprises a controller circuit block on the control circuit layer and memory circuit blocks on the memory circuit layers, the controller circuit block of each block stack performs reconfiguration of the array of the vertical interconnects of the block stack to avoid using defective memory portions of the memory circuit blocks of the block stack, and the controller circuit block of each block stack performs substitution of the defective memory portions of the memory circuit blocks of the block stack with redundant memory portions of the memory circuit blocks of the block stack.

201. The stacked integrated circuit of claim 197, wherein each block stack comprises a controller circuit block on the control circuit layer and memory circuit blocks on the memory circuit layers, and the controller circuit block of each block stack performs refresh of memory portions of the memory circuit blocks of the block stack using the array of the vertical interconnects of the block stack.

202. The stacked integrated circuit of claim 197, wherein each block stack comprises a controller circuit block on the control circuit layer and memory circuit blocks on the memory circuit layers, and the controller circuit block of each block stack performs functional testing of memory portions of the memory circuit blocks of the block stack using the array of the vertical interconnects of the block stack.

203. An apparatus comprising:
a first integrated circuit layer, a plurality of second integrated circuit layers stacked with the first integrated circuit layer and a plurality of vertical interconnects that each extend through the second integrated circuit layers and connect circuitry of the first integrated circuit layer and circuit devices of the second integrated circuit layers, wherein at least some of the plurality of vertical interconnects are closely arrayed;
wherein the first integrated circuit layer is substantially flexible and comprises a substantially flexible semiconductor substrate of one piece made from a semiconductor wafer, thinned by at least one of abrasion, etching and parting, and subsequently polished or smoothed after being thinned to form a polished or smoothed surface;
wherein the second integrated circuit layers each comprise a conductive layer; and
wherein each vertical interconnect comprises within each second integrated circuit layer a conductive portion and a low stress silicon-based dielectric insulating portion around the conductive portion, insulating the conductive portion from the conductive layer of the second integrated circuit layer, and having a stress of less than $5\times10^8$ dynes/cm$^2$ tensile.

204. The apparatus of claim 203, wherein at least two of: the first and second integrated circuit layers are formed with one of single crystal semiconductor material and polycrystalline semiconductor material; one of the first and second integrated circuit layers is formed using a different process technology than another of the first and second integrated circuit layers, the different process technology being selected from a group consisting of DRAM, SRAM, FLASH, EPROM, EEPROM, Ferroelectric and Giant Magneto Resistance; at least one of the first and second integrated circuit layers comprises a microprocessor; information processing is performed on data routed between circuitry on the first and second integrated circuit layers; the apparatus further comprises at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing; at least one of the integrated circuit layers has a thickness of at least one of 10 microns or less and 50 microns or less; at least one of the integrated circuit layers is formed with a low stress silicon-based dielectric, wherein the low stress silicon-based dielectric is at least one of a silicon dioxide dielectric and an oxide of silicon dielectric and is caused to have a stress of less than $5\times10^8$ dynes/cm$^2$ tensile; a back surface of the first integrated circuit layer is polished or smoothed; wherein the first and second integrated circuit layers form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations.

205. The apparatus of claim 203, further comprising:
a silicon-based dielectric insulating layer formed on the first integrated circuit layer;
wherein the silicon-based dielectric insulating layer has a low stress of less than $5\times10^8$ dynes/cm$^2$ tensile, and
wherein the first integrated circuit layer is substantially flexible from the combination of the substantially flexible semiconductor substrate being substantially flexible from being thinned and having the polished or smoothed surface, and the silicon-based dielectric insulating layer having the low stress.

206. The apparatus of claim 203, wherein the conductive layer of each second integrated circuit layer comprises polysilicon.

207. The apparatus of claim 203, wherein each second integrated circuit layer further comprises at least one low stress silicon-based dielectric layer with a stress of less than $5\times10^8$ dynes/cm$^2$ tensile.

208. The apparatus of claim 203, wherein:
the substantially flexible semiconductor substrate is monocrystalline and made substantially flexible when it is thinned and polished or smoothed by first grinding away semiconductor wafer material thereof to leave an exposed surface thereof, and then polishing or smoothing the exposed surface;

the apparatus is substantially flexible based at least on the combination of the at least one low-stress silicon-based dielectric layer of each second integrated circuit layer having a low stress of less than $5 \times 10^8$ dynes/cm$^2$ tensile and the substantially flexible monocrystalline semiconductor substrate of the first integrated circuit layer being substantially flexible; and the apparatus has edges that define its size in area, wherein the substantially flexible semiconductor substrate extends in one piece across a substantial portion of the area between the edges.

209. The apparatus of claim 203, wherein the conductive portion of each vertical interconnect comprises polysilicon.

210. The apparatus of claim 208, wherein the substantially flexible semiconductor substrate is polished or smoothed to reduce vulnerability to fracture as a result of flexing.

211. The information processing integrated circuit of claim 208, wherein the substantially flexible monocrystalline semiconductor substrate is polished or smoothed to reduce vulnerability to fracture as a result of flexing.

212. An apparatus comprising:
a first integrated circuit;
a second integrated circuit;
wherein at least one of the first integrated circuit and the second integrated circuit is substantially flexible and comprises a substantially flexible semiconductor substrate of one piece made from a semiconductor wafer, thinned by at least one of abrasion, etching and parting, and subsequently polished or smoothed after being thinned to form a polished or smoothed surface; and
a bond layer joining the first and second integrated circuits in a stacked relationship and providing a primary means of attachment of the first and second integrated circuits.

213. The apparatus of claim 212, wherein at least two of: the first integrated circuit and the second integrated circuit are formed with one of single crystal semiconductor material and polycrystalline semiconductor material; one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; information processing is performed on data routed between circuitry on the first and second integrated circuits; the apparatus further comprises at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing; at least one of the integrated circuits has a thickness of at least one of 10 microns or less and 50 microns or less; at least one of the integrated circuits is formed with a low stress silicon-based dielectric, wherein the low stress silicon-based dielectric is at least one of a silicon dioxide dielectric and an oxide of silicon dielectric and is caused to have a stress of less than $5 \times 10^8$ dynes/cm$^2$ tensile; a back surface of the first integrated circuit is polished or smoothed; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; further comprising a plurality of polysilicon layers with at least one low stress silicon-based dielectric layer deposited on each of the polysilicon layers in a stacked relationship to at least one of the integrated circuits.

214. The apparatus of claim 212, further comprising:
a plurality of vertical interconnects each of which extends through one of a plurality of holes in semiconductor material of the substantially flexible semiconductor substrate from a first surface of the substantially flexible semiconductor substrate to an opposite surface thereof and comprises within the one of the plurality holes a conductive center portion and a silicon-based dielectric insulating portion surrounding the conductive center portion; and
a silicon-based dielectric insulating layer formed on the at least one of the first integrated circuit and the second integrated circuit that is substantially flexible;
wherein both the silicon-based dielectric insulating layer and the silicon-based dielectric insulating portions of the vertical interconnects have a low stress of less than $5 \times 10^8$ dynes/cm$^2$ tensile, and
wherein the at least one of the first integrated circuit and the second integrated circuit that is substantially flexible is so from the combination of the substantially flexible semiconductor substrate being substantially flexible from being thinned and having the polished or smoothed surface, and the silicon-based dielectric insulating layer having the low stress.

215. The apparatus of claim 212, further comprising a plurality of circuit layers, each circuit layer comprising a conductive layer and at least one low stress silicon-based dielectric layer with a stress of less than $5 \times 10^8$ dynes/cm$^2$ tensile, wherein the circuit layers are in a stacked relationship to at least one of the first and second integrated circuits.

216. The apparatus of claim 215, further comprising:
a plurality of vertical interconnects each of which extends through the circuit layers and connects circuit devices of the circuit layers and circuitry of the at least one of the first and second integrated circuits in stacked relationship with the circuit layers, each vertical interconnect comprises within each circuit layer a conductive portion and a silicon-based dielectric insulating portion around the conductive portion and insulating the conductive portion from the conductive layer of the circuit layer;
wherein both the silicon-based dielectric insulating portions surrounding the conductive center portions of the vertical interconnects have a stress of less than $5 \times 108$ dynes/cm2 tensile.

217. An information processing integrated circuit comprising:
a plurality of integrated circuit layers in a stacked relationship and including a first integrated circuit layer and a plurality of second integrated circuit layers
wherein the first integrated circuit layer is substantially flexible and comprises a substantially flexible monocrystalline semiconductor substrate of one piece made from a semiconductor wafer, thinned by at least one of abrasion, etching and parting, and subsequently polished or smoothed after being thinned to form a polished or smoothed surface; and wherein each second integrated circuit layer comprises a conductive layer and at least one low stress silicon-based dielectric layer having a stress of less than $5\times10^8$ dynes/cm$^2$ tensile.

218. The information processing integrated circuit layer of claim 217, wherein at least two of: the first integrated circuit layer and the second integrated circuit layers are formed with one of single crystal semiconductor material and polycrystalline semiconductor material; one of the first and second integrated circuit layers is formed using a different process technology than another of the first and second integrated circuit layers, the different process technology being selected from a group consisting of DRAM, SRAM, FLASH, EPROM, EEPROM, Ferroelectric and Giant Magneto Resistance; at least one of the first and second integrated circuit layers comprises a microprocessor; information processing is performed on data routed between circuitry on the first and second integrated circuit layers; the information processing integrated circuit further comprises at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing; at least one of the integrated circuit layers has a thickness of at least one of 10 microns or less and 50 microns or less; at least one of the integrated circuit layers is formed with a low stress silicon-based dielectric, wherein the low stress silicon-based dielectric is at least one of a silicon dioxide dielectric and an oxide of silicon dielectric and is caused to have a stress of less than $5\times10^8$ dynes/cm$^2$ tensile; a back surface of the first integrated circuit layer is polished or smoothed; wherein the first integrated circuit layer and the second integrated circuit layers form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; further comprising a plurality of polysilicon layers with at least one low stress silicon-based dielectric layer deposited on each of the polysilicon layers in a stacked relationship to at least one of the integrated circuit layers.

219. The information processing integrated circuit of claim 217, further comprising:
- a plurality of vertical interconnects each of which extends through the second integrated circuit layers and connects circuitry of the first integrated circuit layer and circuit devices of the second integrated circuit layers, each vertical interconnect comprises within each second integrated circuit layer a conductive portion and a silicon-based dielectric insulating portion around the conductive portion and insulating the conductive portion from the conductive layer of the second integrated circuit layer; and
- a silicon-based dielectric insulating layer formed on the first integrated circuit layer;
- wherein both the silicon-based dielectric insulating layer and the silicon-based dielectric insulating portions of the vertical interconnects have a stress of less than $5\times10^8$ dynes/cm$^2$ tensile, and
- wherein the first integrated layer is substantially flexible from the combination of the substantially flexible monocrystalline semiconductor substrate being substantially flexible from being thinned and having the polished or smoothed surface, and the silicon-based dielectric insulating layer being low stress with a stress of less than $5\times10^8$ dynes/cm$^2$ tensile.

220. The information processing integrated circuit of claim 217, wherein the conductive layer of each second integrated circuit layer comprises polysilicon.

221. The information processing integrated circuit of claim 217, wherein:
- the substantially flexible monocrystalline semiconductor substrate is made substantially flexible when it is thinned and polished or smoothed by first grinding away semiconductor wafer material thereof to leave an exposed surface thereof, and then polishing or smoothing the exposed surface;
- the information processing integrated circuit is substantially flexible based at least on the combination of the at least one low-stress silicon-based dielectric layer of each second integrated circuit layer having a low stress of less than $5\times10^8$ dynes/cm$^2$ tensile and the substantially flexible monocrystalline semiconductor substrate of the first integrated circuit layer being substantially flexible; and
- the information processing integrated circuit comprises a singulated die having a die area defined by its perimeter, wherein the substantially flexible monocrystalline semiconductor substrate extends in one piece across a substantial portion of the die area.

222. The information processing integrated circuit of claim 219, wherein the conductive portion of each vertical interconnect comprises polysilicon.

223. A stacked integrated circuit, comprising:
- a first circuit layer comprising a semiconductor substrate formed from a semiconductor wafer or portion thereof;
- a second circuit layer comprising a semiconductor substrate formed from a semiconductor wafer or portion thereof and stacked together with the first circuit layer in contact therewith;
- wherein at least one of the first circuit layer and the second circuit layer is substantially flexible and its semiconductor substrate is a substantially flexible monocrystalline semiconductor substrate of one piece made from a semiconductor wafer, thinned by at least one of abrasion, etching and parting, and subsequently polished or smoothed after being thinned to form a polished or smoothed surface; and
- wherein the first circuit layer and the second circuit layer are joined together using metal-to-metal bonding as a primary means of attachment.

224. The stacked integrated circuit of claim 223, wherein at least two of: the first integrated circuit layer and the second integrated circuit layer are formed with one of single crystal semiconductor material and polycrystalline semiconductor material; one of the first and second integrated circuit layers is formed using a different process technology than another of the first and second integrated circuit layers, the different process technology being selected from a group consisting of DRAM, SRAM, FLASH, EPROM, EEPROM, Ferroelectric and Giant Magneto Resistance; at least one of the first and second integrated circuit layers comprises a microprocessor; information processing is performed on data routed between circuitry on the first and second integrated circuit layers; the stacked integrated circuit further comprises at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing; at least one of the integrated circuit layers has a thickness of at least one of 10 microns or less and 50 microns or less; at least one of the integrated circuit layers is formed with a low stress silicon-based dielectric, wherein the low stress silicon-based dielectric is at least one of a silicon dioxide dielectric and an oxide of silicon dielectric and is caused to have a stress of less than $5 \times 10^8$ dynes/cm² tensile; a back surface of the first integrated circuit layer is polished or smoothed; wherein the first integrated circuit layer and the second integrated circuit layer form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; further comprising a plurality of polysilicon layers with at least one low stress silicon-based dielectric layer deposited on each of the polysilicon layers in a stacked relationship to at least one of the circuit layers.

225. The stacked integrated circuit of claim 223, further comprising:
a plurality of vertical interconnects each of which extends through one of a plurality of holes in semiconductor material of the substantially flexible monocrystalline semiconductor substrate from a first surface of the substantially flexible monocrystalline semiconductor substrate to an opposite surface thereof and comprises within the one of the plurality holes a conductive center portion and a silicon-based dielectric insulating portion surrounding the conductive center portion; and
a silicon-based dielectric insulating layer formed on the at least one of the first integrated circuit layer and the second integrated circuit layer that is substantially flexible;
wherein both the silicon-based dielectric insulating layer and the silicon-based dielectric insulating portions of the vertical interconnects have a low stress of less than $5 \times 10^8$ dynes/cm² tensile; and
wherein the at least one of the first integrated circuit layer and the second integrated circuit layer that is substantially flexible is so from the combination of the substantially flexible monocrystalline semiconductor substrate being substantially flexible from being thinned and having the polished or smoothed surface, and the silicon-based dielectric insulating layer having the low stress.

226. An apparatus comprising:
a first integrated circuit;
a second integrated circuit stacked with the first integrated circuit;
a thermal diffusion bond layer physically joining the first and second integrated circuits and providing a primary means of attachment of the first and second integrated circuits;
wherein at least one of the first integrated circuit and the second integrated circuit is substantially flexible and comprises a substantially flexible semiconductor substrate of one piece made from a semiconductor wafer, thinned by at least one of abrasion, etching and parting, and subsequently polished or smoothed after being thinned to form a polished or smoothed surface; and
a plurality of vertical interconnects each of which extends through one of a plurality of holes in semiconductor material of the substantially flexible semiconductor substrate from a first surface of the substantially flexible semiconductor substrate to an opposite surface thereof and comprises within the one of the plurality holes a conductive center portion and a low stress silicon based dielectric insulating portion surrounding the conductive center portion having a stress of less than $5 \times 10^8$ dynes/cm² tensile, wherein the plurality of interconnects are closely arrayed.

227. The apparatus of claim 226, further comprising a silicon-based dielectric insulating layer formed on the at least one of the first integrated circuit and the second integrated circuit that is substantially flexible, wherein the silicon-based dielectric insulating layer has a stress of less than $5 \times 10^8$ dynes/cm² tensile, and wherein the at least one of the first integrated circuit and the second integrated circuit that is substantially flexible is so from the combination of the substantially flexible semiconductor substrate being substantially flexible from being thinned and having the polished or smoothed surface, and the silicon-based dielectric insulating layer being low stress with a stress of less than $5 \times 10^8$ dynes/cm² tensile.

228. The apparatus of 226, wherein the holes are etched in the semiconductor material of the substantially flexible semiconductor substrate.

229. The apparatus of claim 226, wherein the holes are closely arrayed in the substantially flexible semiconductor substrate.

230. The apparatus of claim 226, wherein the at least one of the first integrated circuit and the second integrated circuit that is substantially flexible comprises an integrated circuit die having a die area, and the substantially flexible semiconductor substrate thereof extends throughout at least a substantial portion of the die area of the integrated circuit die.

231. The apparatus of claim 226, wherein at least two of the following: one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects having a portion thereof be a bond of the thermal diffusion bond layer, connecting circuitry of the first integrated circuit and circuitry of the second integrated circuit; wherein at least one of the first and second integrated circuits is substantially flexible, and comprises a silicon-based dielectric layer with a stress of less than $5 \times 10^8$ dynes/cm² tensile; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the integrated circuits comprises a front surface and a back surface opposite the front surface, further comprising a tensile low stress silicon-based dielectric with a stress of less than $5 \times 10^8$ dynes/cm² tensile on the back surface.

232. The apparatus of claim 226, wherein:
the substantially flexible semiconductor substrate of one piece is monocrystalline and made substantially flexible when it is thinned and polished or smoothed by first grinding away semiconductor wafer material thereof to leave an exposed surface thereof, and then polishing or smoothing the exposed surface;
the at least one of the first integrated circuit and the second integrated circuit that is substantially flexible comprises at least one low stress silicon-based dielectric layer having a low stress of less than $5\times10^8$ dynes/cm$^2$ tensile and is substantially flexible based at least on the combination of the low stress of the at least one low-stress silicon-based dielectric layer and the substantially flexible semiconductor substrate being substantially flexible; and
the at least one of the first integrated circuit and the second integrated circuit that is substantially flexible comprises a singulated die having a die area defined by its perimeter, wherein the substantially flexible semiconductor substrate extends in one piece across a substantial portion of the die area.

233. The apparatus of claim 232, wherein the substantially flexible semiconductor substrate is polished or smoothed to reduce vulnerability to fracture as a result of flexing.

234. An apparatus comprising:
a first integrated circuit, a second integrated circuit stacked with the first integrated circuit and a plurality of vertical interconnects connecting circuitry of the first integrated circuit and circuitry of the second integrated circuit, wherein at least some of the plurality of vertical interconnects are closely arrayed;
wherein at least one of the first integrated circuit and the second integrated circuit is substantially flexible and comprises a substantially flexible semiconductor substrate of one piece made from a semiconductor wafer, thinned by at least one of abrasion, etching and parting, and subsequently polished or smoothed after being thinned to form a polished or smoothed surface;
wherein each of said plurality of vertical interconnects extends through one of a plurality of holes in semiconductor material of the substantially flexible semiconductor substrate from a first surface of the substantially flexible semiconductor substrate to an opposite surface thereof and comprises within the one of the plurality holes a conductive center portion and a low stress silicon-based dielectric insulating portion surrounding the conductive center portion having a stress of less than $5\times10^8$ dynes/cm$^2$ tensile.

235. The apparatus of claim 234, further comprising a silicon-based dielectric insulating layer formed on the at least one of the first integrated circuit and the second integrated circuit that is substantially flexible, wherein the silicon-based dielectric insulating layer has a stress of less than $5\times10^8$ dynes/cm$^2$ tensile, and wherein the at least one of the first integrated circuit and the second integrated circuit is substantially flexible from the combination of the substantially flexible semiconductor substrate being substantially flexible from being thinned and having the polished or smoothed surface, and the silicon-based dielectric insulating layer being low stress with a stress of less than $5\times10^8$ dynes/cm$^2$ tensile.

236. The apparatus of claim 234, wherein at least two of the following: one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects includes a thermal diffusion bond, connecting circuitry of the first integrated circuit and circuitry of the second integrated circuit; wherein at least one of the first and second substrates is substantially flexible, and comprises a silicon-based dielectric layer with a stress of less than $5\times10^8$ dynes/cm$^2$ tensile; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the integrated circuits comprises a front surface and a back surface opposite the front surface, further comprising a tensile low stress silicon-based dielectric with a stress of less than $5\times10^8$ dynes/cm$^2$ tensile on the back surface.

237. The apparatus of claim 234, wherein:
the substantially flexible semiconductor substrate of one piece is monocrystalline and made substantially flexible when it is thinned and polished or smoothed by first grinding away semiconductor wafer material thereof to leave an exposed surface thereof, and then polishing or smoothing the exposed surface;
the at least one of the first integrated circuit and the second integrated circuit that is substantially flexible comprises at least one low stress silicon-based dielectric layer having a low stress of less than $5\times10^8$ dynes/cm$^2$ tensile and is substantially flexible based at least on the combination of the low stress of the at least one low-stress silicon-based dielectric layer and the substantially flexible semiconductor substrate being substantially flexible; and
the at least one of the first integrated circuit and the second integrated circuit that is substantially flexible has edges that define its size in area, wherein the substantially flexible semiconductor substrate extends in one piece across a substantial portion of the area between the edges.

238. The apparatus of claim 237, wherein the substantially flexible semiconductor substrate is polished or smoothed to reduce vulnerability to fracture as a result of flexing.

239. The information processing integrated circuit of claim 237, wherein the substantially flexible monocrystalline semiconductor substrate is polished or smoothed to reduce vulnerability to fracture as a result of flexing.

240. The apparatus of one of claims 1, 43, 226, and 234, wherein:
the first integrated circuit comprises a control circuit and the second integrated circuit comprises a memory circuit;
the control circuit comprises reconfiguration logic for performing reconfiguration of the memory circuit after manufacture of the apparatus has been completed and during a useful life of the apparatus;

the control circuit comprises memory test logic for performing functional testing of the memory circuit via at least some of the vertical interconnects;

the control circuit comprises memory error correction logic for performing error correction of data read from the memory circuit via at least some of the vertical interconnects;

the memory circuit comprises an array of memory cells including spare or redundant cells for replacement of defective cells of the memory cells; and, the vertical interconnects include spare or redundant interconnects for replacement of defective interconnects of the vertical interconnects.

241. The apparatus of claim 240, wherein the control circuit comprises refresh logic for performing refresh of at least some of the memory cells of the memory circuit via at least some of the vertical interconnects.

242. The apparatus of claim 240, wherein a process technology used to make the control circuit is different from a process technology used to make the memory circuit.

243. The apparatus of one of claims 1, 43, 90, 226, and 234, further comprising:

a plurality of memory circuits stacked with the first integrated circuit and including the second integrated circuit;

wherein the first integrated circuit comprises a control circuit;

wherein the control circuit and the memory circuits form a stacked integrated circuit memory, the stacked integrated circuit memory is partitioned into a plurality of block stacks each block stack comprises circuit blocks that are in different ones of the control circuit and the memory circuits and an array of the vertical interconnects that vertically interconnect the circuit blocks of the block stack, and the block stacks are configured to perform memory operations independently of each other.

244. The apparatus of claim 243, wherein:

the array of the vertical interconnects of each block stack pass through at least one of the control circuit and the memory circuits;

the arrays of the vertical interconnects of the block stacks transfer data independently of each other during the memory operations performed independently by the block stacks.

245. The apparatus of 243, wherein each block stack comprises a controller circuit block on the control circuit and memory circuit blocks on the memory circuit, the controller circuit block of each block stack performs error correction on read data from the memory circuit blocks of the block stack, the read data in each block stack is transferred through the array of the vertical interconnects of the block stack, and the read data in each block stack includes ECC data used by the controller circuit block of the block stack to perform error correction on the read data.

246. The apparatus of claim 243, wherein each block stack comprises a controller circuit block on the control circuit and memory circuit blocks on the memory circuits, the controller circuit block of each block stack performs reconfiguration of the array of the vertical interconnects of the block stack to avoid using defective memory portions of the memory circuit blocks of the block stack, and the controller circuit block of each block stack performs substitution of the defective memory portions of the memory circuit blocks of the block stack with redundant memory portions of the memory circuit blocks of the block stack.

247. The apparatus of claim 243, wherein each block stack comprises a controller circuit block on the control circuit and memory circuit blocks on the memory circuits, and the controller circuit block of each block stack performs refresh of memory portions of the memory circuit blocks of the block stack using the array of vertical interconnects of the block stack.

248. The apparatus of claim 243, wherein each block stack comprises a controller circuit block on the control circuit and memory circuit blocks on the memory circuits, and the controller circuit block of each block stack performs functional testing of memory portions of the memory circuit blocks of the block stack using the array of the vertical interconnects of the block stack.

249. An apparatus comprising:

a first integrated circuit;

a second integrated circuit stacked with the first integrated circuit;

wherein at least one of the first integrated circuit and the second integrated circuit is substantially flexible and comprises a substantially flexible semiconductor substrate of one piece made from a semiconductor wafer, thinned by at least one of abrasion, etching and parting, and subsequently polished or smoothed after being thinned to form a polished or smoothed surface;

a bond layer joining the first and second integrated circuits and providing a primary means of means of attachment of the first and second integrated circuits; and a plurality of vertical interconnects each of which extends through one of a plurality of holes in semiconductor material of the substantially flexible semiconductor substrate from a first surface of the substantially flexible semiconductor substrate to an opposite surface thereof and comprises within the one of the plurality holes a conductive center portion and a low stress silicon-based dielectric insulating portion surrounding the conductive center portion having a stress of less than $5\times10^8$ dynes/cm$^2$ or less, wherein at least some of the plurality of interconnects are closely arrayed.

250. The apparatus of claim 249, further comprising a silicon-based dielectric insulating layer formed on the at least one of the first integrated circuit and the second integrated circuit that is substantially flexible, wherein the silicon-based dielectric insulating layer has a stress of less than $5\times10^8$ dynes/cm$^2$ tensile, and wherein the at least one of the first integrated circuit and the second integrated circuit that is substantially flexible is so from the combination of the substantially flexible semiconductor substrate being substantially flexible from being thinned and having the polished or smoothed surface, and the silicon-based dielectric insulating layer being low stress with a stress of less than $5\times10^8$ dynes/cm$^2$ tensile.

251. The apparatus of claim 249, wherein at least two of the following: one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects including a bond of the bond layer, connecting circuitry of the first integrated circuit and circuitry of the second integrated circuit; wherein at least one of the first and second substrates is substantially flexible, and comprises a silicon-based dielectric layer with a stress of less than $5 \times 10^8$ dynes/cm$^2$ tensile; wherein the first integrated circuit and the second integrated circuit form at least part of a stacked integrated circuit memory, wherein at least a portion of the stacked integrated circuit memory is partitioned into a plurality of circuit block stacks each comprising vertically interconnected circuit blocks, wherein plurality of said circuit block stacks are configured to independently perform memory operations; wherein at least one of the integrated circuit layers comprises a front surface and a back surface opposite the front surface, further comprising a tensile low stress silicon-based dielectric with a stress of less than $5 \times 10^8$ dynes/cm$^2$ tensile on the back surface.

252. An information processing integrated circuit comprising:
  a plurality of integrated circuit layers in a stacked relationship, wherein at least one of the integrated circuit layers is substantially flexible and comprises a monocrystalline semiconductor substrate of one piece that is substantially flexible and is made from a semiconductor wafer, thinned by at least one of abrasion, etching and parting, and subsequently polished or smoothed after being thinned to form a polished or smoothed surface; and
  a plurality of vertical interconnects interior to overlying portions of the integrated circuit layers for the transfer of data between at least two of the integrated circuit layers of said integrated circuit, each vertical interconnect extends through one of a plurality of holes in semiconductor material of the monocrystalline semiconductor substrate from a first surface of the monocrystalline semiconductor substrate to an opposite surface thereof and comprises within the one of the plurality holes a conductive center portion and a low stress silicon based dielectric insulating portion surrounding the conductive center portion having a stress of less than $5 \times 10^8$ dynes/cm$^2$.

253. The information processing integrated circuit of claim 252, further comprising a silicon-based dielectric insulating layer formed on the at least one of the integrated circuit layers that is substantially flexible, wherein the silicon-based dielectric insulating layer has a stress of less than $5 \times 10^8$ dynes/cm$^2$ tensile, and wherein the at least one of the integrated circuit layers that is substantially flexible is so from the combination of the monocrystalline semiconductor substrate being substantially flexible from being thinned and having the polished or smoothed surface, and the silicon-based dielectric insulating layer being low stress with a stress of less than $5 \times 10^8$ dynes/cm$^2$ tensile.

254. The information processing integrated circuit of claim 252, wherein at least two of the following: one of the first and second integrated circuits is formed using a different process technology than another of the first and second integrated circuits, the different process technology being selected from a group consisting of DRAM, SRAM, FLASH, EPROM, EEPROM, Ferroelectric and Giant Magneto Resistance; at least one of the first and second integrated circuits comprises a microprocessor; the first and second integrated circuits comprise at least one memory integrated circuit and at least one logic integrated circuit, wherein the at least one logic integrated circuit performs testing of the at least one memory integrated circuit; a plurality of interior vertical interconnects traverse at least one of the integrated circuits; continuous vertical interconnects connect circuitry of the first and second integrated circuits; information processing is performed on data routed between circuitry on the first and second integrated circuits; at least one integrated circuit has reconfiguration circuitry; at least one of the plurality of vertical interconnects includes a thermal diffusion bond, connecting circuitry of the first integrated circuit and circuitry of the second integrated circuit; wherein at least one of the first and second substrates is substantially flexible, and comprises a silicon-based dielectric layer with a stress of less than $5 \times 10^8$ dynes/cm$^2$ tensile; wherein the first integrated circuit layer and the second integrated circuit layer form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the integrated circuit layers comprises a front surface and a back surface opposite the front surface, further comprising a tensile low stress silicon-based dielectric with a stress of less than $5 \times 10^8$ dynes/cm$^2$ tensile on the back surface.

255. The information processing integrated circuit of claim 252, wherein:
  the substantially flexible monocrystalline semiconductor substrate of one piece is made substantially flexible when it is thinned and polished or smoothed by first grinding away semiconductor wafer material thereof to leave an exposed surface thereof, and then polishing or smoothing the exposed surface;
  the at least one of the integrated circuit layers that is substantially flexible comprises at least one low stress silicon-based dielectric layer having a low stress of less than $5 \times 10^8$ dynes/cm$^2$ tensile and is substantially flexible based at least on the combination of the low stress of at least one low-stress silicon-based dielectric layer and the substantially flexible monocrystalline semiconductor substrate being substantially flexible; and
  the at least one of the integrated circuit layers that is substantially flexible comprises a singulated die having a die area defined by its perimeter, wherein the substantially flexible monocrystalline semiconductor substrate extends in one piece across a substantial portion of the die area.

256. The information processing integrated circuit of one of claims 134 and 252, wherein:
  one of the integrated circuit layers comprises a control circuit layer and another of the integrated circuit layers comprises a memory circuit layer;
  the control circuit layer comprises reconfiguration logic for performing reconfiguration of the memory circuit layer after manufacture of the apparatus has been completed and during a useful life of the apparatus;
  the control circuit layer comprises memory test logic for performing functional testing of the memory circuit layer via at least some of the vertical interconnects;
  the control circuit layer comprises memory error correction logic for performing error correction of data read from the memory circuit layer via at least some of the vertical interconnects; and,
  the memory circuit layer comprises an array of memory cells including spare or redundant cells for replacement of defective cells of the memory cells; and,
  the vertical interconnects include spare or redundant interconnects for replacement of defective interconnects of the vertical interconnects.

257. The information processing integrated circuit of claim 256, wherein the control circuit layer further comprises refresh logic for performing refresh of at least some of the memory cells via at least some of the vertical interconnects.

258. The information processing integrated circuit of claim 256, wherein a process technology used to make the control circuit layer is different from a process technology used to make the memory circuit layer.

259. The information processing integrated circuit of one of claims 134 and 252, wherein:
one the integrated circuit layers comprises a control circuit layer and others of the integrated circuit layers comprise memory circuit layers;
the control circuit layer and the memory circuit layers form a stacked integrated circuit memory, the stacked integrated circuit memory is partitioned into a plurality of block stacks, each block stack comprises circuit blocks that are on different ones of the control circuit layer and the memory circuit layers and an array of the vertical interconnects that vertically interconnect the circuit blocks of the block stacks, and the block stacks are configured to perform memory operations independently of each other.

260. The information processing integrated circuit of claim 259, wherein:
the array of the vertical interconnects of each block stack pass through at least one of the control circuit layer and memory circuit layers;
the arrays of the vertical interconnects of the block stacks transfer data independently of each other during the memory operations performed independently by the block stacks.

261. The information processing integrated circuit of claim 259, wherein each block stack comprises a controller circuit block on the control circuit layer and memory circuit blocks on the memory circuit layers, the controller circuit block of each block stack performs error correction on read data from the memory circuit blocks of the block stack, the read data in each block stack is transferred through the array of the vertical interconnects of the block stack, and the read data in each block stack includes ECC data used by the controller circuit block of the block stack to perform error correction on the read data.

262. The information processing integrated circuit of claim 259, wherein each block stack comprises a controller circuit block on the control circuit layer and memory circuit blocks on the memory circuit layers, the controller circuit block of each block stack performs reconfiguration of the array of the vertical interconnects of the block stack to avoid using defective memory portions of the memory circuit blocks of the block stack, the controller circuit block of each block stack performs substitution of the defective memory portions of the memory circuit blocks of the block stack with redundant memory portions of the memory circuit blocks of the block stack.

263. The information processing integrated circuit of claim 259, wherein each block stack comprises a controller circuit block on the control circuit layer and memory circuit blocks on the memory circuit layers, and the controller circuit block of each block stack performs refresh of memory portions of the memory circuit blocks of the block stack using the array of the vertical interconnects of the block stack.

264. The information processing integrated circuit of claim 259, wherein each block stack comprises a controller circuit block on the control circuit layer and memory circuit blocks on the memory circuit layers, and the controller circuit block of each block stack performs functional testing of memory portions of the memory circuit blocks of the block stack using the array of the vertical interconnects of the block stack.

265. An integrated circuit structure comprising:
a plurality of substrates in a stacked relationship;
wherein at least one of the plurality of substrates is substantially flexible and comprises (a) a low stress silicon based dielectric layer with a stress of less than $5 \times 10^8$ dynes/cm$^2$, (b) a substantially flexible monocrystalline semiconductor substrate of one piece having the silicon-based dielectric layer thereon, and (c) a plurality of vertical interconnects each of which extends through one of a plurality of holes in the substantially flexible monocrystalline semiconductor substrate and within the one of the plurality of holes comprises a vertical through-substrate conductor and a vertical low stress silicon-based dielectric insulator with a stress of less than $5 \times 10^8$ dynes/cm$^2$ and surrounding the vertical through-substrate conductor.

266. The integrated circuit structure of claim 265, wherein the at least one of the plurality of substrates that is substantially flexible is so from the combination of the substantially flexible monocrystalline semiconductor substrate being substantially flexible and the silicon-based dielectric layer being low stress with a stress of less than $5 \times 10^8$ dynes/cm$^2$ tensile.

267. The integrated circuit structure of claim 265, wherein the plurality of substrates comprise at least first and second integrated circuit layers, and wherein at least two of: the first integrated circuit layer and the second integrated circuit layer are formed with one of single crystal semiconductor material and polycrystalline semiconductor material; one of the first and second integrated circuit layers is formed using a different process technology than another of the first and second integrated circuit layers, the different process technology being selected from a group consisting of DRAM, SRAM, FLASH, EPROM, EEPROM, Ferroelectric and Giant Magneto Resistance; at least one of the first and second integrated circuit layers comprises a microprocessor; information processing is performed on data routed between circuitry on the first and second integrated circuit layers; the stacked integrated circuit further comprises at least one logic layer having logic for performing at least one of the following functions: virtual memory management, ECC, indirect addressing, content addressing, data compression, data decompression, graphics acceleration, audio encoding, audio decoding, video encoding, video decoding, voice recognition, handwriting recognition, power management and database processing; at least one of the integrated circuit layers has a thickness of at least one of 10 microns or less and 50 microns or less; at least one of the integrated circuit layers is formed with a low stress silicon-based dielectric, wherein the low stress silicon-based dielectric is at least one of a silicon dioxide dielectric and an oxide of silicon dielectric and is caused to have a stress of less than $5 \times 10^8$ dynes/cm$^2$ tensile; a back surface of the first integrated circuit layer is polished or smoothed; wherein the first integrated circuit layer and the second integrated circuit layer form at least part of a stacked integrated circuit memory, wherein at least a portion of the stacked integrated circuit memory is partitioned into a plurality of circuit block stacks each comprising vertically interconnected circuit blocks, wherein a plurality of said circuit block stacks are configured to independently perform memory operations; wherein at least one of the substrates comprises a front surface and a back surface opposite the front surface, further comprising a tensile low stress silicon-based dielectric with a stress of less than $5 \times 10^8$ dynes/cm$^2$ tensile on the back surface.

268. The integrated circuit structure of claim 265, wherein:
the substantially flexible monocrystalline semiconductor substrate of one piece is made substantially flexible when it is thinned and polished or smoothed by first grinding away semiconductor wafer material thereof to leave an exposed surface thereof, and then polishing or smoothing the exposed surface;
the at least one of the plurality of substrates that is substantially flexible is substantially flexible based at least on the combination of the low stress of the low-stress silicon-based dielectric layer and the substantially flexible semiconductor substrate being substantially flexible;
the at least one of the plurality of substrates that is substantially flexible comprises a singulated die having a die area defined by its perimeter, wherein the substantially flexible monocrystalline semiconductor substrate extends in one piece across a substantial portion of the die area.

269. The integrated circuit structure of claim 268, wherein the substantially flexible monocrystalline semiconductor substrate is polished or smoothed to reduce vulnerability to fracture as a result of flexing.

270. The apparatus of one of claims 178 and 268, wherein:
one of the plurality of substrates comprises a control circuit and another of the plurality of substrates comprises a memory circuit;
the control circuit comprises reconfiguration logic for performing reconfiguration of the memory circuit after manufacture of the apparatus has been completed and during a useful life of the apparatus;
the control circuit comprises memory test logic for performing functional testing of the memory circuit via at least some of the vertical interconnects;
the control circuit comprises memory error correction logic for performing error correction of data read from the memory circuit via at least some of the vertical interconnects; and,
the memory circuit comprises an array of memory cells including spare or redundant cells for replacement of defective cells of the memory cells; and,
the vertical interconnects include spare or redundant interconnects for replacement of defective interconnects of the vertical interconnects.

271. The apparatus of claim 270, wherein the control circuit comprises refresh logic for performing refresh of at least some of the memory cells of the memory circuit via at least some of the vertical interconnects.

272. The apparatus of claim 270, wherein a process technology used to make the control circuit is different from a process technology used to make the memory circuit.

273. The apparatus of one of claims 178 and 268, wherein:
one the plurality of substrates comprises a control circuit and others of the plurality of substrates comprise memory circuits;
the control circuit and the memory circuits form a stacked integrated circuit memory, the stacked integrated circuit memory is partitioned into a plurality of block stacks, each block stack comprises circuit blocks that are in different ones of the control circuit and the memory circuits and an array of the vertical interconnects that vertically interconnect the circuit blocks of the block stack, and the block stacks are configured to perform memory operations independently of each other.

274. The apparatus of claim 273, wherein:
the array of the vertical interconnects of each block stack pass through at least one of the control circuit and memory circuits;
the arrays of the vertical interconnects of the block stacks transfer data independently of each other during the memory operations performed independently by the block stacks.

275. The apparatus of claim 273, wherein each block stack comprises a controller circuit block in the control circuit and memory circuit blocks in the memory circuits, the controller circuit block of each block stack performs error correction on read data from the memory circuit blocks of the block stack, the read data in each block stack is transferred through the array of the vertical interconnects of the block stack, and the read data in each block stack includes ECC data used by the controller circuit block of the block stack to perform error correction on the read data.

276. The apparatus of claim 273, wherein each block stack comprises a controller circuit block in the control circuit and memory circuit blocks in the memory circuits, the controller circuit block of each block stack performs reconfiguration of the array of the vertical interconnects of the block stack to avoid using defective memory portions of the memory circuit blocks of the block stack, and the controller circuit block of each block stack performs substitution of the defective memory portions of the memory circuit blocks of the block stack with redundant memory portions of the memory circuit blocks of the block stack.

277. The apparatus of claim 273, wherein each block stack comprises a controller circuit block in the control circuit and memory circuit blocks in the memory circuits of the block stack, and the controller circuit block of each block stack performs refresh of memory portions of the memory circuit blocks of the block stack using the array of vertical interconnects of the block stack.

278. The apparatus of claim 273, wherein each block stack comprises a controller circuit block in the control circuit and memory circuit blocks in the memory circuit, and the controller circuit block of each block stack performs functional testing of memory portions of the memory circuit blocks of the block stack using the array of the vertical interconnects of the block stack.

* * * * *